(12) United States Patent
Chen et al.

(10) Patent No.: US 9,269,660 B2
(45) Date of Patent: Feb. 23, 2016

(54) MULTILAYER CONNECTION STRUCTURE

(71) Applicant: Macronix International Co., Ltd., Hsinchu (TW)

(72) Inventors: Shih-Hung Chen, Jhudong Township, Hsinchu County (TW); Hang-Ting Lue, Hsinchu (TW); Hong-Ji Lee, Gueishan Township, Taoyuan County (TW); Chin-Cheng Yang, Gangshan Township, Kaohsiung County (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 13/772,121

(22) Filed: Feb. 20, 2013

(65) Prior Publication Data

US 2013/0161835 A1    Jun. 27, 2013

Related U.S. Application Data

(62) Division of application No. 13/114,931, filed on May 24, 2011, now Pat. No. 8,383,512.

(60) Provisional application No. 61/434,423, filed on Jan. 19, 2011.

(51) Int. Cl.
*H01L 23/50* (2006.01)
*H01L 23/522* (2006.01)
(Continued)

(52) U.S. Cl.
CPC .......... *H01L 23/50* (2013.01); *H01L 21/76805* (2013.01); *H01L 21/76816* (2013.01);
(Continued)

(58) Field of Classification Search
CPC ..................... H01L 27/0688; H01L 27/11578; H01L 23/5226; H01L 21/76805; H01L 21/76831; H01L 21/8221; H01L 2224/9202; H01L 2224/82; H01L 2224/83191; H01L 23/481; H01L 23/522; H01L 24/24; H01L 24/32; H01L 23/50; H01L 24/19; H01L 27/11206; H01L 27/0207; H01L 21/76838; H01L 27/11286; H01L 27/11565; H01L 27/11582; H01L 21/76816; H01L 2924/1306
USPC ........... 257/774, 758, 208, 211, 750, E21.159
See application file for complete search history.

(56) References Cited

U.S. PATENT DOCUMENTS

| 5,218,471 A | 6/1993 | Swanson et al. |
| 6,034,882 A | 3/2000 | Johnson et al. |

(Continued)

FOREIGN PATENT DOCUMENTS

| EP | 1936681 A1 | 6/2008 |
| EP | 2048709 A2 | 4/2009 |

(Continued)

OTHER PUBLICATIONS

Choi et al., "Performance Breakthrough in NOR Flash Memory with Dopant-Segregated Schottky-Barrier (DSSB) SONOS Devices", 2009 Symposium on VLSI Technology Digest of Technical Papers, p. 222-223.

(Continued)

*Primary Examiner* — Shouxiang Hu
(74) *Attorney, Agent, or Firm* — Kenta Suzue; Haynes Beffel & Wolfeld LLP

(57) ABSTRACT

A three-dimensional stacked IC device includes a stack of at least first, second, third and fourth contact levels at an interconnect region. Each contact level has a conductive layer and an insulation layer. First, second, third and fourth electrical conductors pass through portions of the stack of contact levels. The first, second, third and fourth electrical conductors are in electrical contact with the first, second, third and fourth conductive layers, respectively. A dielectric sidewall spacer circumferentially surrounds the second, third and fourth electrical conductors so that the second, third and fourth electrical conductors only electrically contact the respective second, third and fourth conductive layers.

10 Claims, 48 Drawing Sheets

(51) Int. Cl.
| | |
|---|---|
| *H01L 23/48* | (2006.01) |
| *H01L 27/112* | (2006.01) |
| *H01L 21/768* | (2006.01) |
| *H01L 27/02* | (2006.01) |
| *H01L 27/115* | (2006.01) |
| *H01L 23/00* | (2006.01) |
| *H01L 27/06* | (2006.01) |

(52) U.S. Cl.
CPC .... *H01L21/76831* (2013.01); *H01L 21/76838* (2013.01); *H01L 23/481* (2013.01); *H01L 23/522* (2013.01); *H01L 23/5226* (2013.01); *H01L 24/19* (2013.01); *H01L 27/0207* (2013.01); *H01L 27/11206* (2013.01); *H01L 27/11286* (2013.01); *H01L 27/11565* (2013.01); *H01L 27/11578* (2013.01); *H01L 27/11582* (2013.01); *H01L 27/0688* (2013.01); *H01L 2924/1306* (2013.01)

(56) References Cited

U.S. PATENT DOCUMENTS

| | | | |
|---|---|---|---|
| 6,906,940 | B1 | 6/2005 | Lue |
| 6,933,224 | B2 | 8/2005 | Nejad et al. |
| 7,081,377 | B2 | 7/2006 | Cleeves |
| 7,129,538 | B2 | 10/2006 | Lee et al. |
| 7,177,169 | B2 | 2/2007 | Scheuerlein |
| 7,301,818 | B2 | 11/2007 | Lu et al. |
| 7,382,647 | B1 | 6/2008 | Gopalakrishnan |
| 7,851,849 | B2 | 12/2010 | Kiyotoshi |
| 7,855,457 | B2 * | 12/2010 | Mizukami et al. ............ 257/758 |
| 7,902,035 | B2 | 3/2011 | Yu et al. |
| 7,915,667 | B2 | 3/2011 | Knoefler et al. |
| 8,154,128 | B2 | 4/2012 | Lung |
| 8,383,512 | B2 | 2/2013 | Chen et al. |
| 8,541,882 | B2 * | 9/2013 | Chen et al. .................... 257/774 |
| 8,664,112 | B2 * | 3/2014 | Sandhu et al. ................ 438/637 |
| 2002/0106823 | A1 | 8/2002 | Hwang et al. |
| 2003/0064295 | A1 | 4/2003 | Yasuyuki et al. |
| 2005/0280061 | A1 | 12/2005 | Lee |
| 2008/0073635 | A1 | 3/2008 | Kiyotoshi et al. |
| 2008/0101109 | A1 | 5/2008 | Haring-Bolivar et al. |
| 2009/0097321 | A1 | 4/2009 | Kim et al. |
| 2009/0184360 | A1 | 7/2009 | Jin et al. |
| 2009/0310415 | A1 | 12/2009 | Jin et al. |
| 2010/0270593 | A1 | 10/2010 | Lung et al. |
| 2011/0084397 | A1 | 4/2011 | Lung |

FOREIGN PATENT DOCUMENTS

| | | |
|---|---|---|
| JP | 03-2700225 | 12/1991 |
| JP | 04092467 B2 | 3/1992 |
| JP | 06-236930 | 8/1994 |
| JP | 2009-016400 | 1/2009 |

OTHER PUBLICATIONS

Hsu et al., "Study of Sub-30nm Thin Film Transistor (TFT) Charge-Trapping (CT) Devices for 3D NAND Flash Application", IEDM 2009 IEEE International, Dec. 7-9, 2009, p. 1-4.

Hubert et al., "A Stacked SONOS technology, up to 4 levels and 6nm crystalline nanowires, with gate-all-around or independent gates (F Flash), suitable for full 3D integration", IEEE IEDM, Dec. 7-9, 2009, 2 pages.

Jang et al., "Vertical Cell Array using TCAT(Terabit Cell Array Transistor) Technology for Ultra High Density NAND Flash Memory", 2009 Symposium on VLSI Technology Digest of Technical Papers, p. 192-193.

Johnson et al., "512-Mb PROM With a Three-Dimensional Array of Diode/Anti-fuse Memory Cells" IEEE J. of Solid-State Circuits, vol. 38, No. 11, Nov. 2003.

Jung et al., "Three Dimensionally Stacked NAND Flash Memory Technology Using Stacking Single Crystal Si Layers on ILD and TANOS Structure for Beyond 30nm Node", IEEE Int'l Electron Devices Meeting, Dec. 11-13, 2006.

Katsumata et al., "Pipe-shaped BiCS Flash Memory with 16 Stacked Layers and Multi-Level-Cell Operation for Ultra High Density Storage Devices", 2009 Sypmposium on VLSI technology Digest of Technical Papers, p. 136-137.

Kim et al., "Multi-Layered Vertical Gate NAND Flash Overcoming Stacking Limit for Terabit Density Storage", 2009 Symposium on VLSI Technology Digest of Technical Papers, p. 188-189.

Kim, Jiyoung et al., "Novel 3-D Structure for Ultra High Density Flash Memory with VRAT (Vertical-Recess-Array-Transistor) and PIPE (Planarized Integration on the same PlanE)," Jun. 17-19, 2008, 2 pages.

Lai, et al., "A Multi-Layer Stackable Thin-Film Transistor (TFT) NAND-Type Flash Memory", IEEE Int'l Electron Devices Meeting, Dec. 11-13, 2006.

Lai et al., "Highly Reliable MA BE-SONOS (Metal Al2O3 Bandgap Engineered SONOS) Using a SiO2 Buffer Layer", VLSI Technology, Systems and Applications, International Symposium on Apr. 21-23, 2008, p. 58-59.

Lue et al., "A Novel Buried-Channel FinFET BE-SONOS NAND Flash with Improved Memory Window and Cycling Endurance", 2009 Symposium on VLSI Technology Digest of Technical Papers, p. 224-225.

Paul et al., "Impact of a Process Variation on Nanowire and Nanotube Device Performance", IEEE Transactions on Electron Devices, vol. 54, No. 9, Sep. 2007, p. 2369-2376.

Tanaka, H., et al., "Bit Cost Scalable Technology with Punch and Plug Process for Ultra High Density Flash Memory," 2007 IEEE Symposium on VLSI Technology, Jun. 12-14, 2007, pp. 14-15.

\* cited by examiner

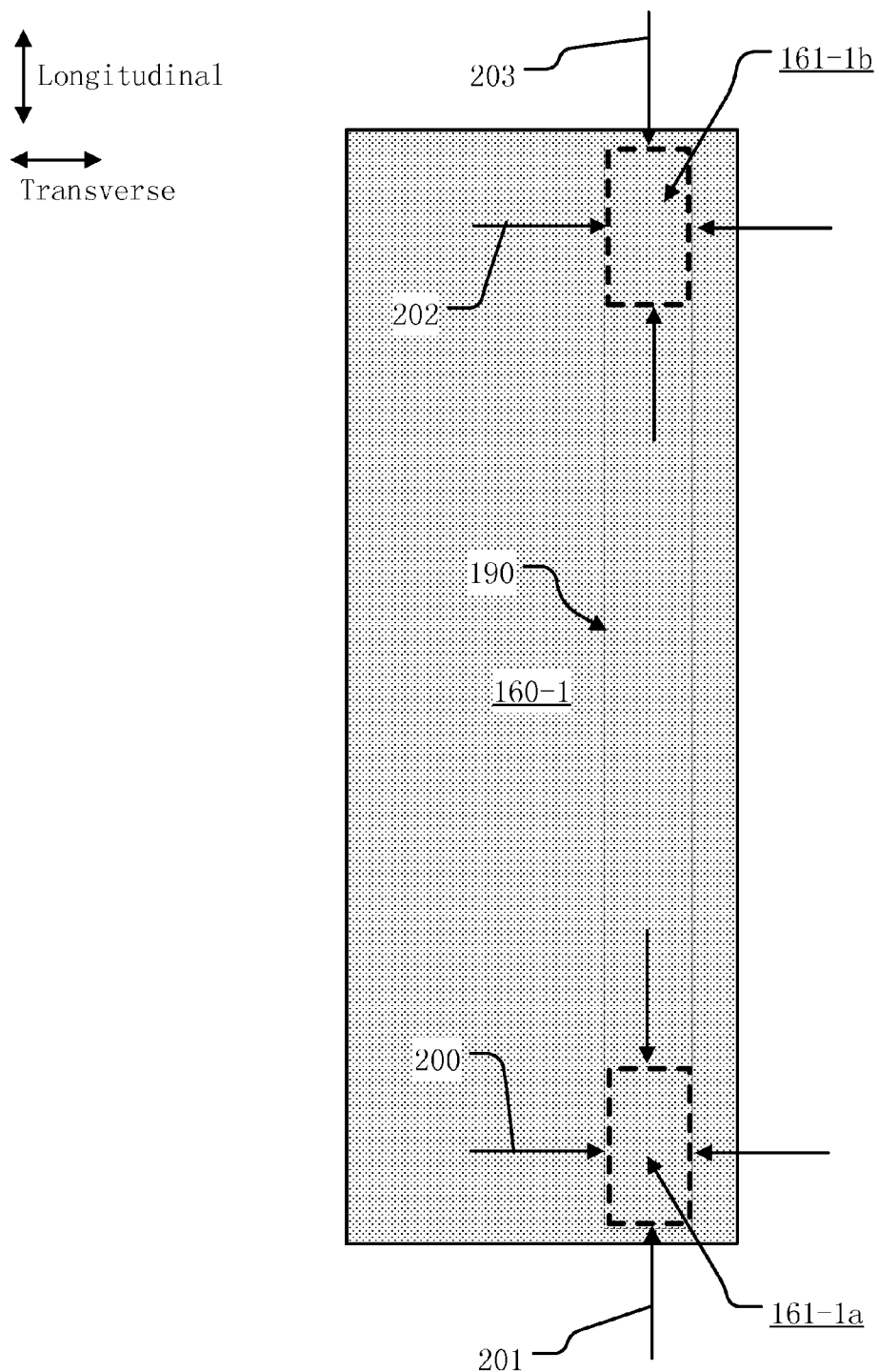
Fig. 2A  *Related Art*

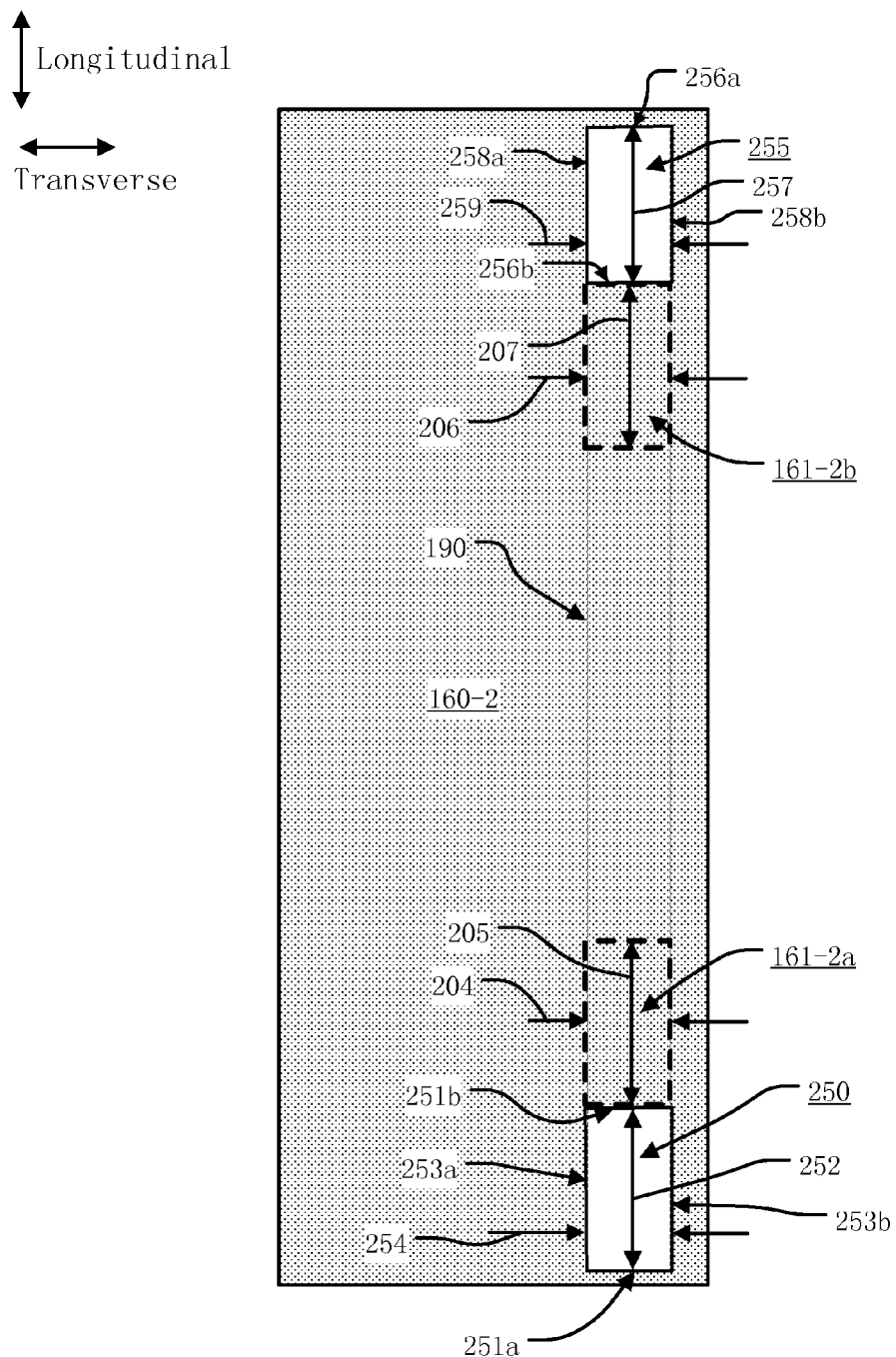
Fig. 2B  *Related Art*

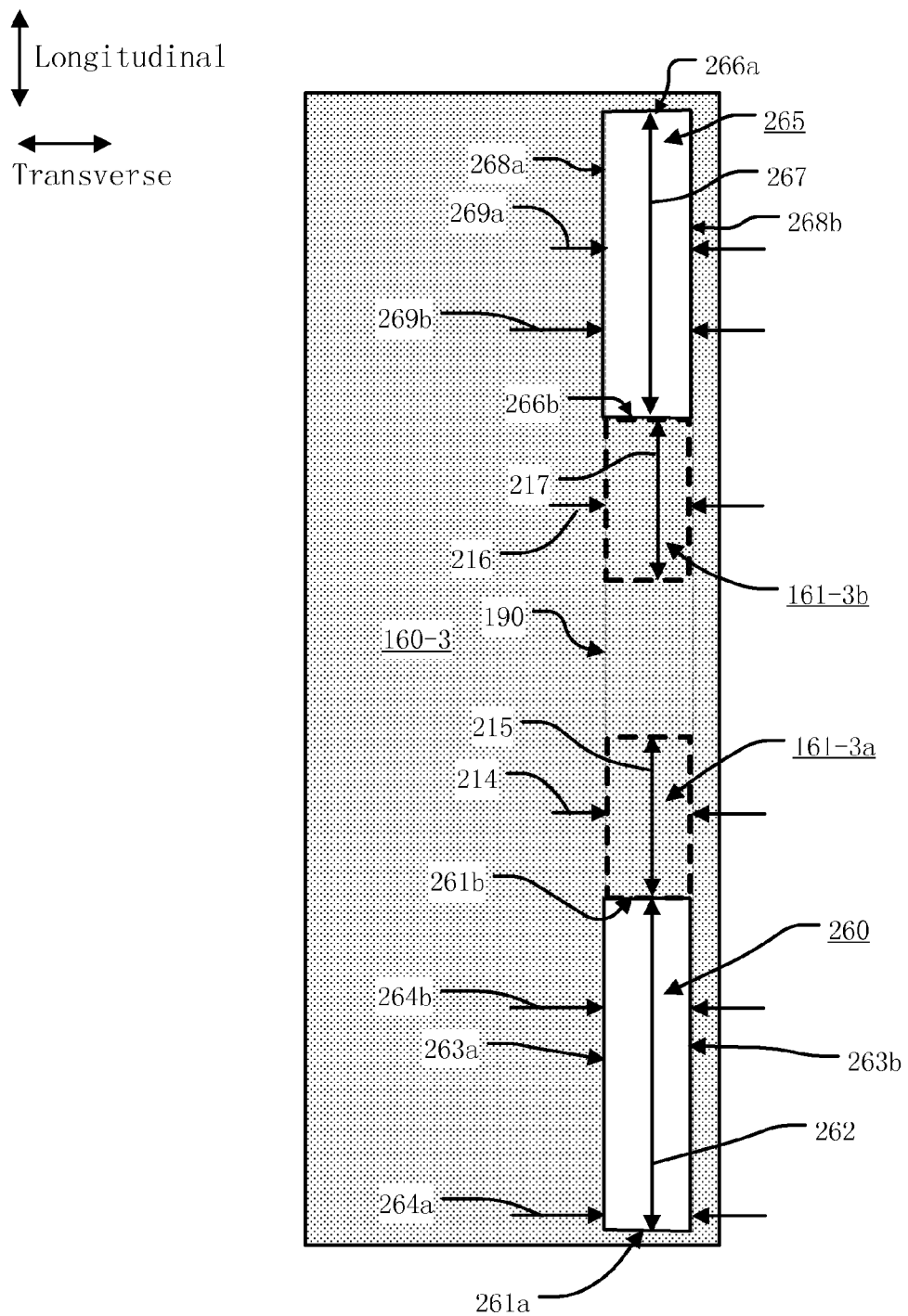
Fig. 2C  *Related Art*

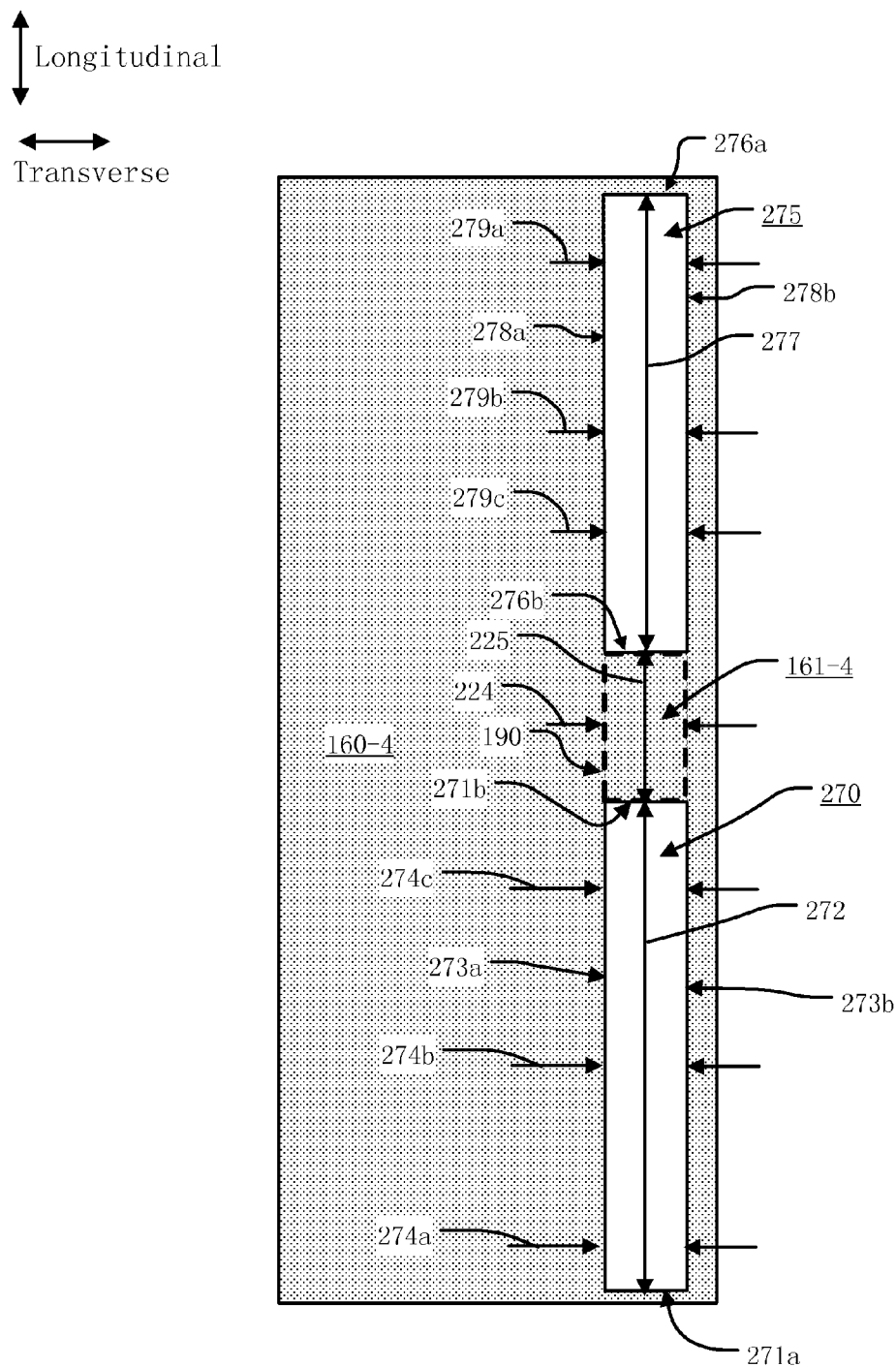
Fig. 2D  *Related Art*

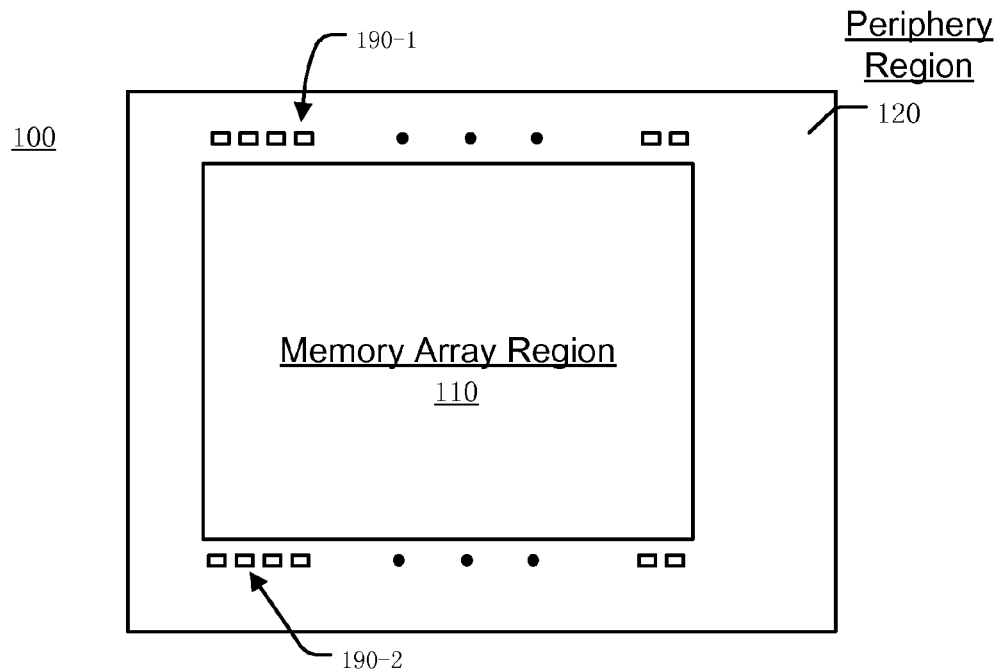
Fig. 4
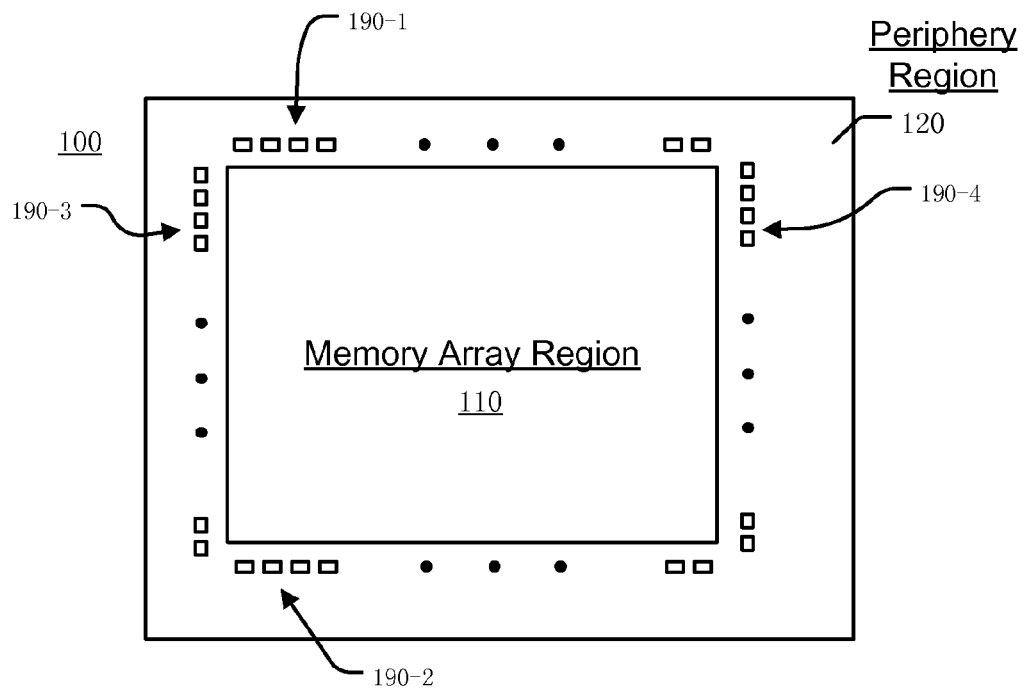
Fig. 5   *Related Art*

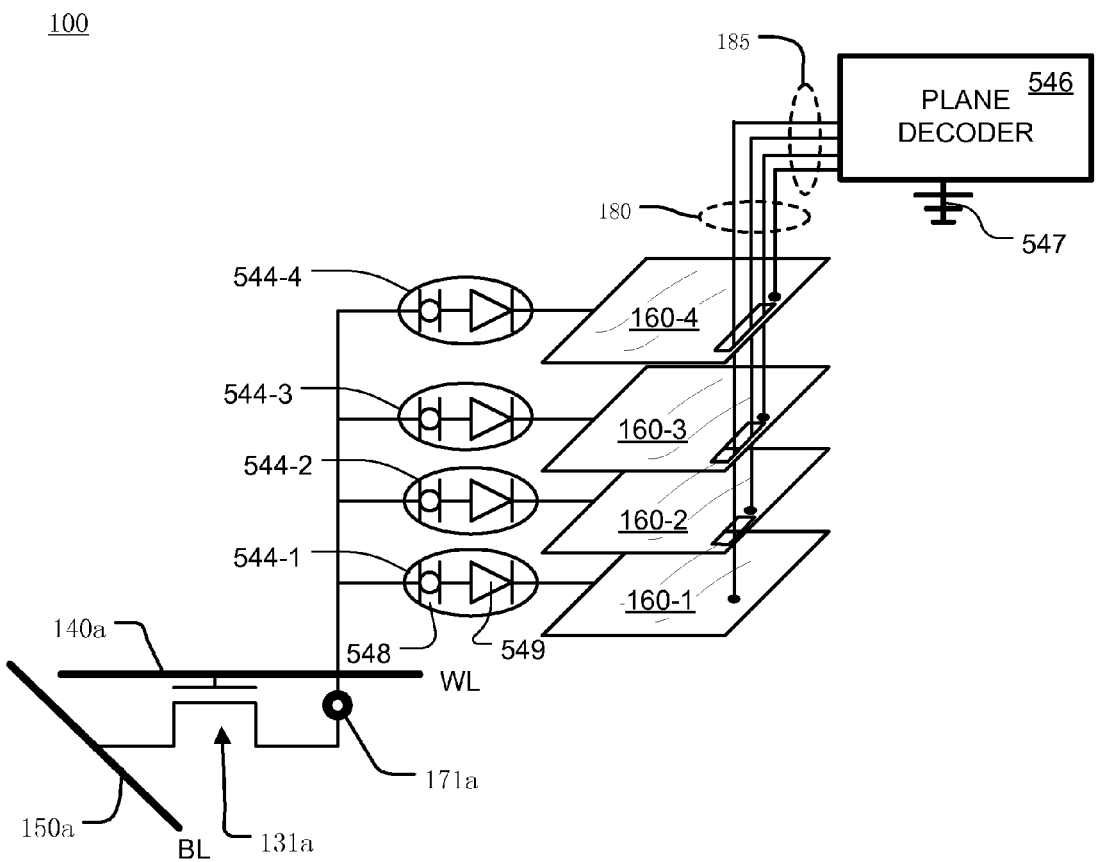
Fig. 6   *Related Art*

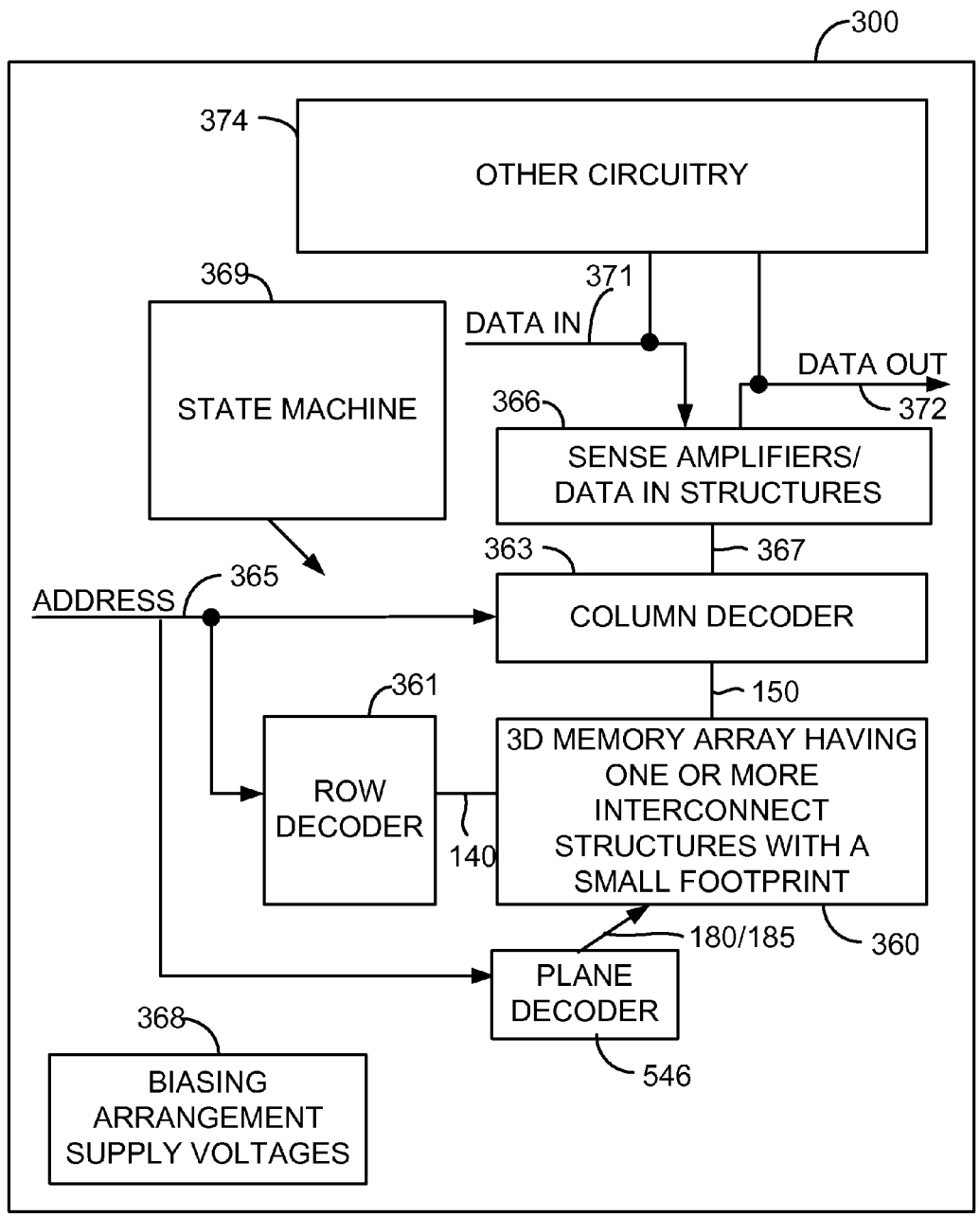
Fig. 7     *Related Art*

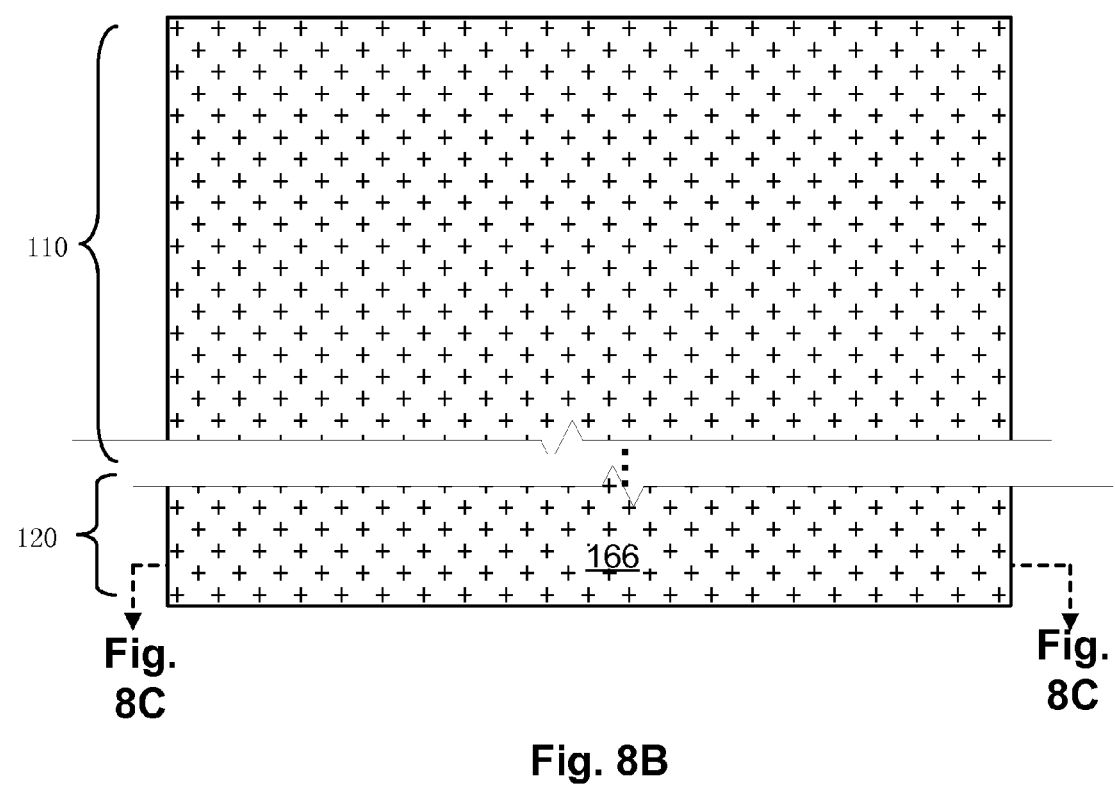
Fig. 8B
_Related Art_

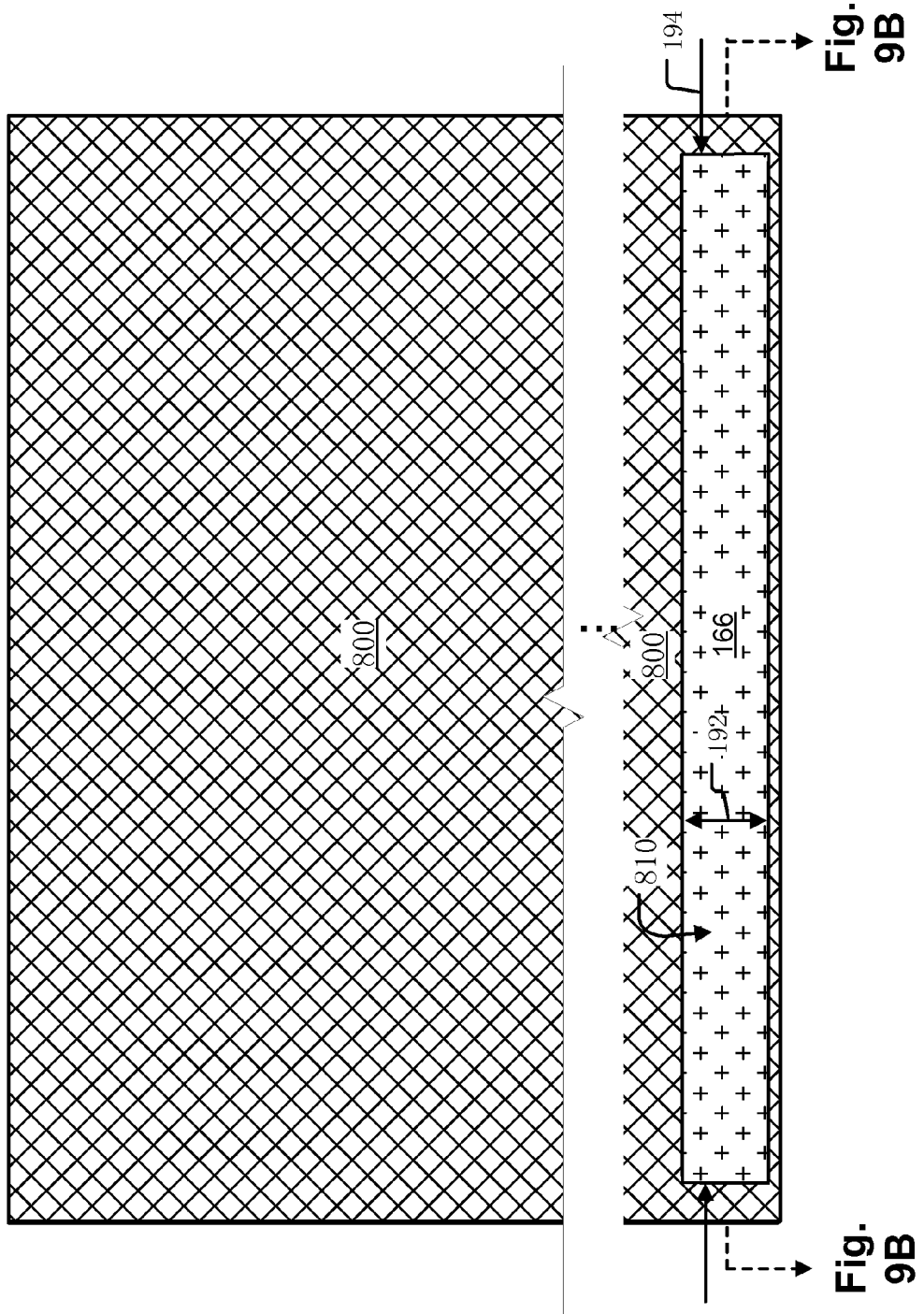

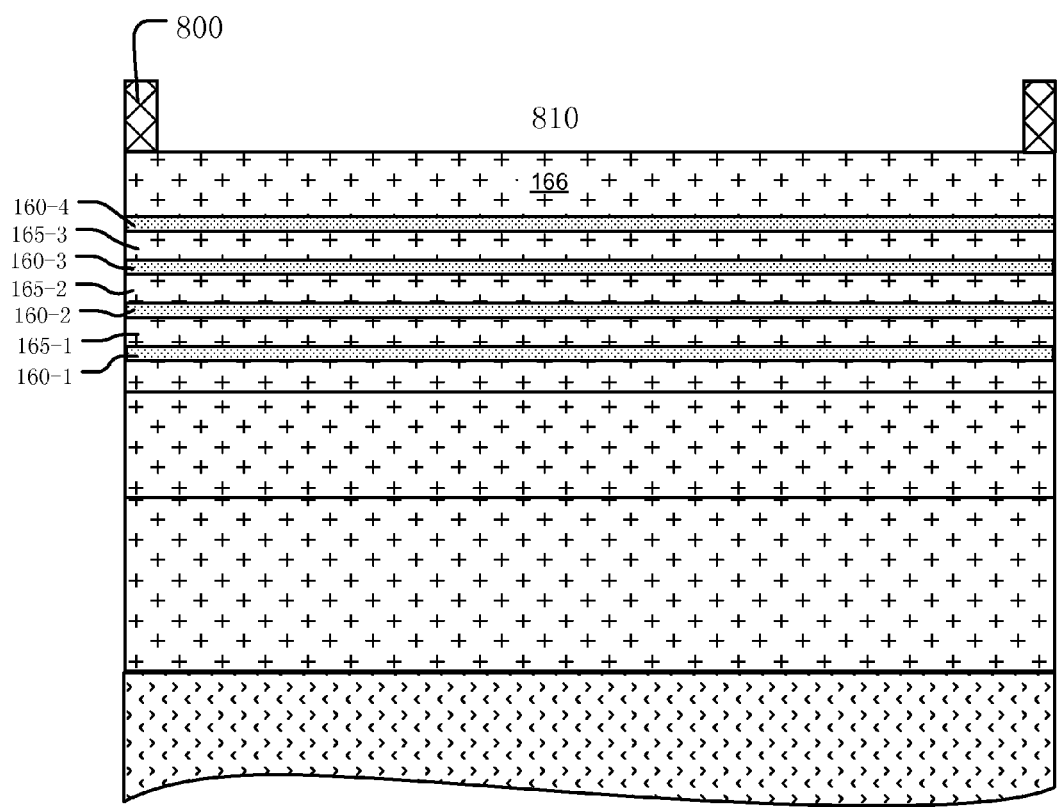
Related Art  Fig. 9B

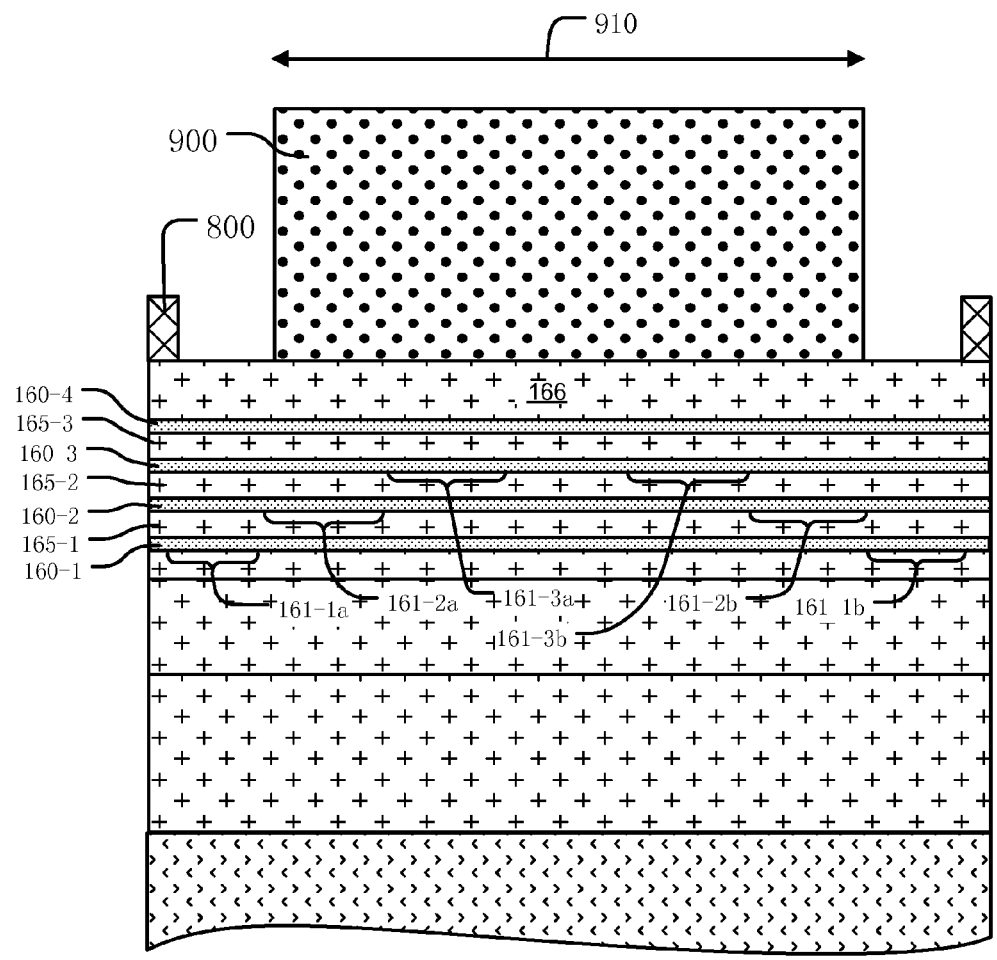
Related Art  Fig. 10B

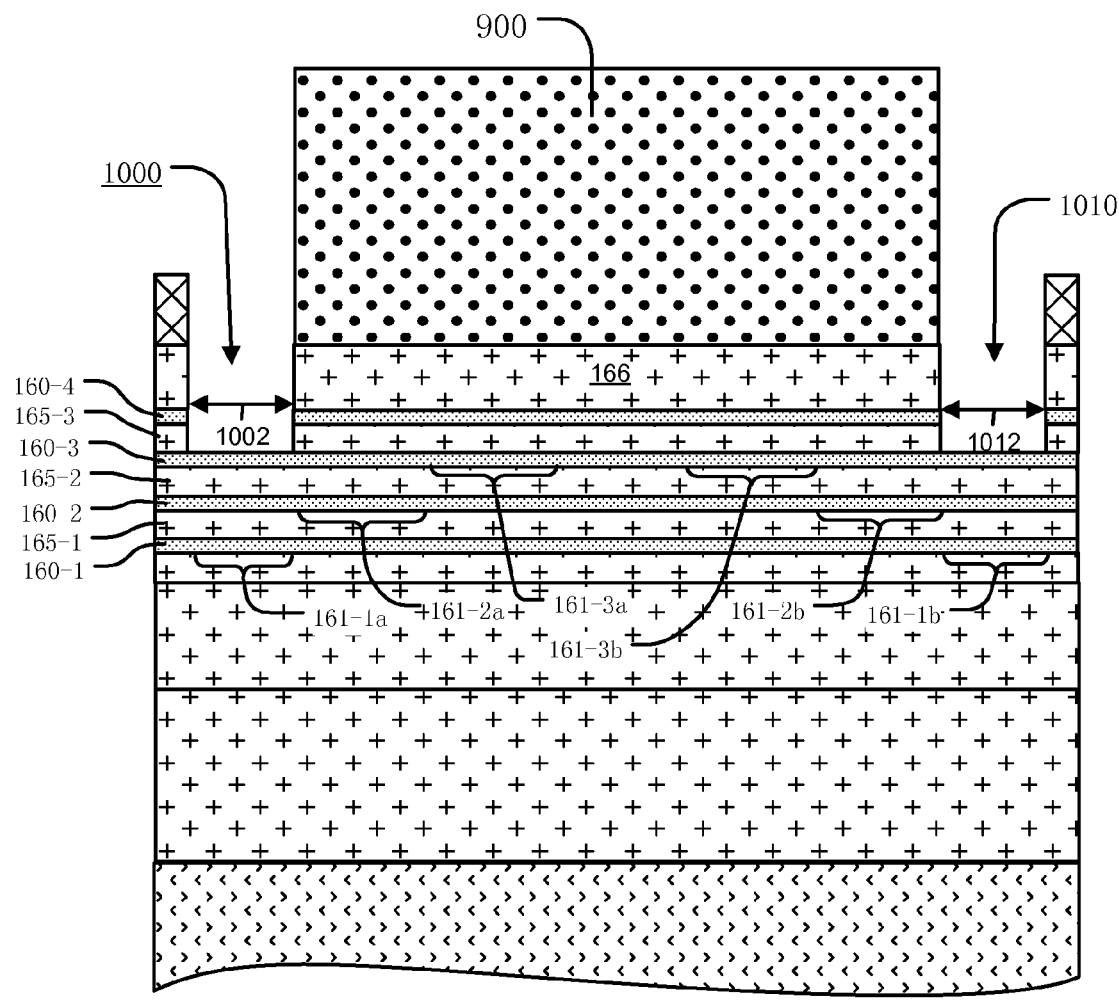
*Related Art*  Fig. 11B

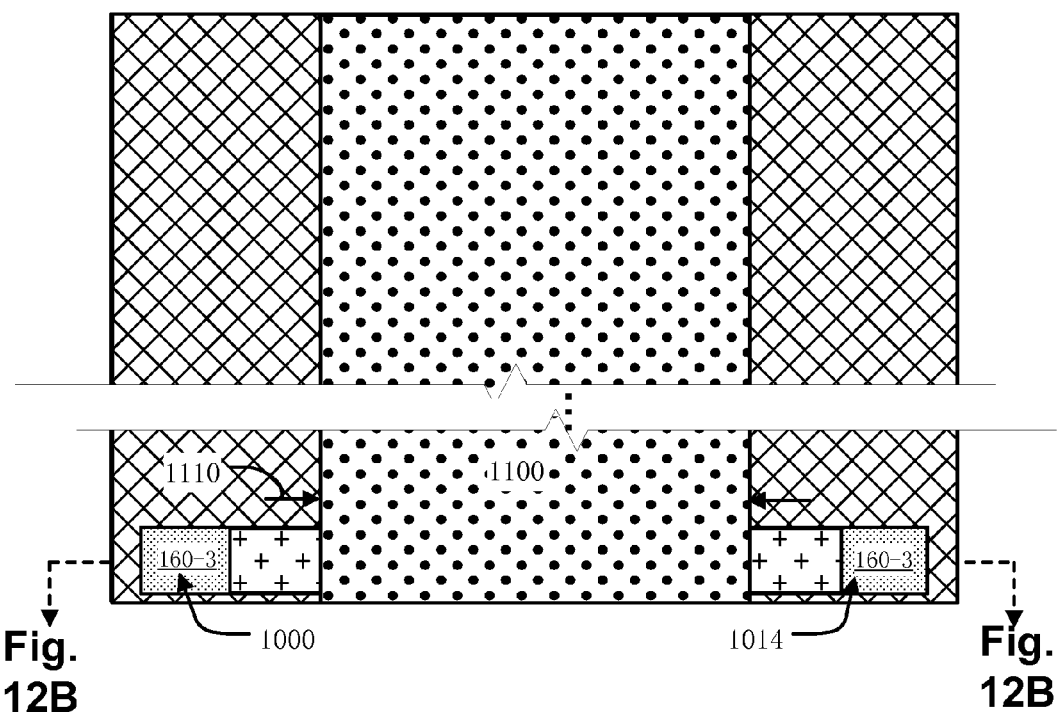
Related Art    Fig. 12A

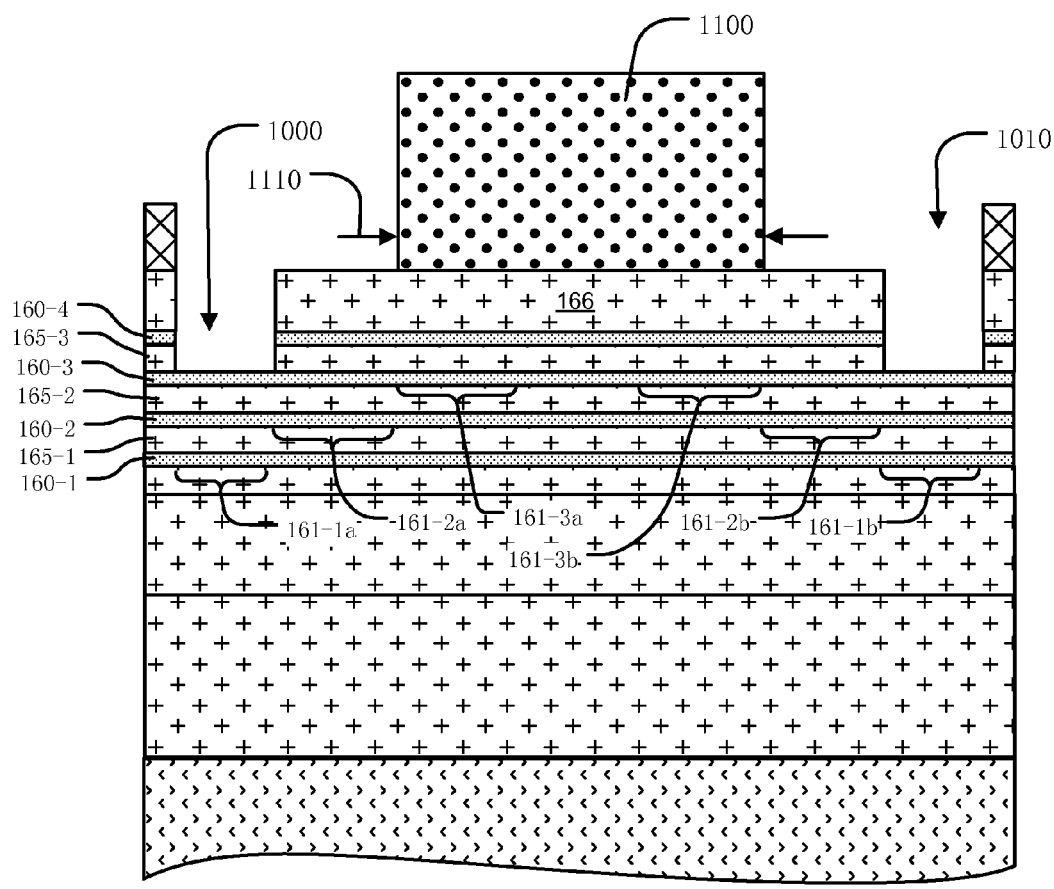
Related Art     Fig. 12B

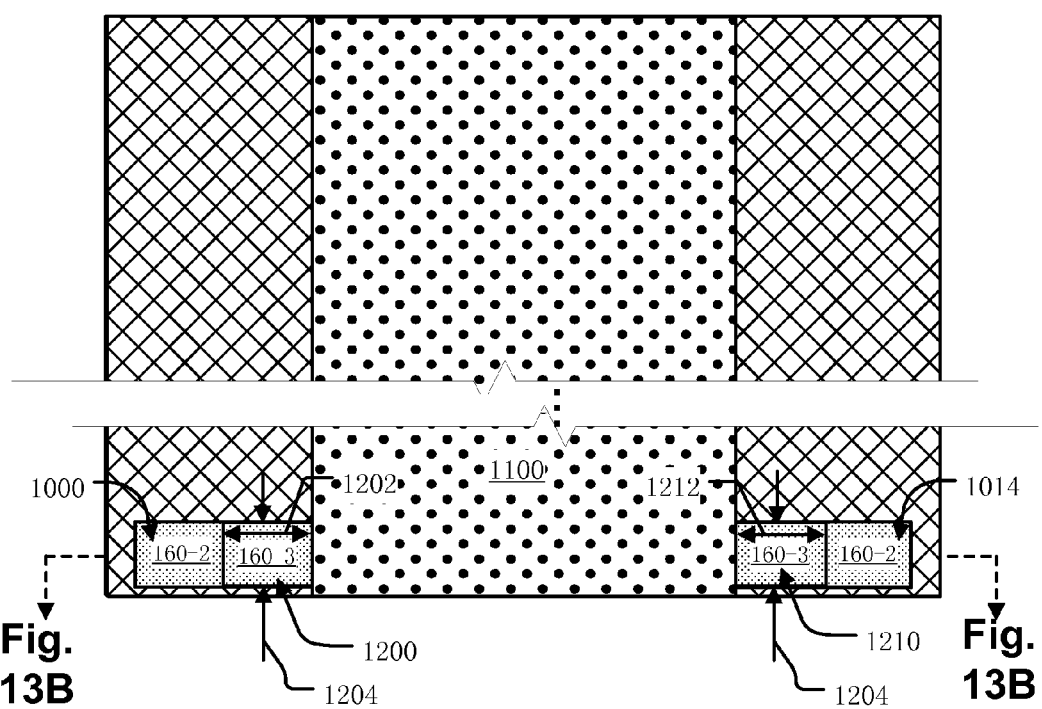
Related Art Fig. 13A

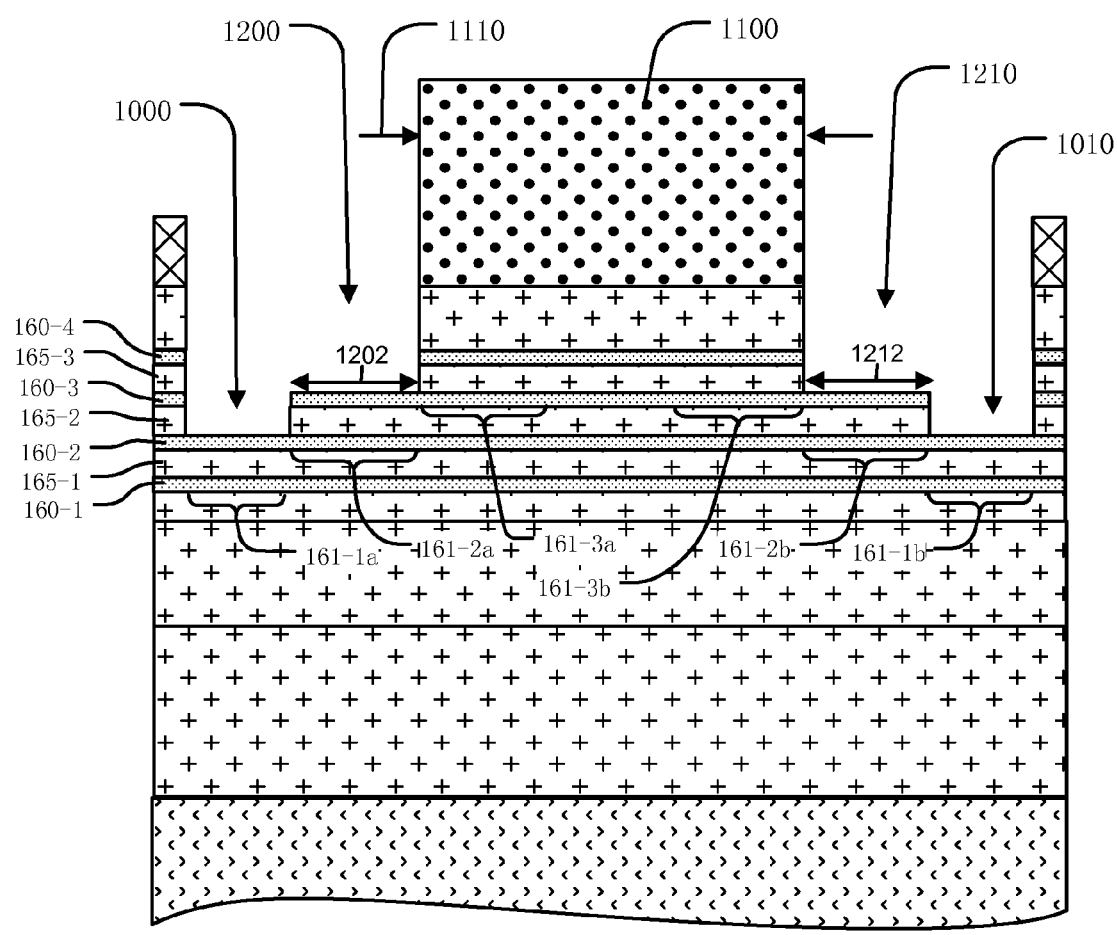
Related Art  Fig. 13B

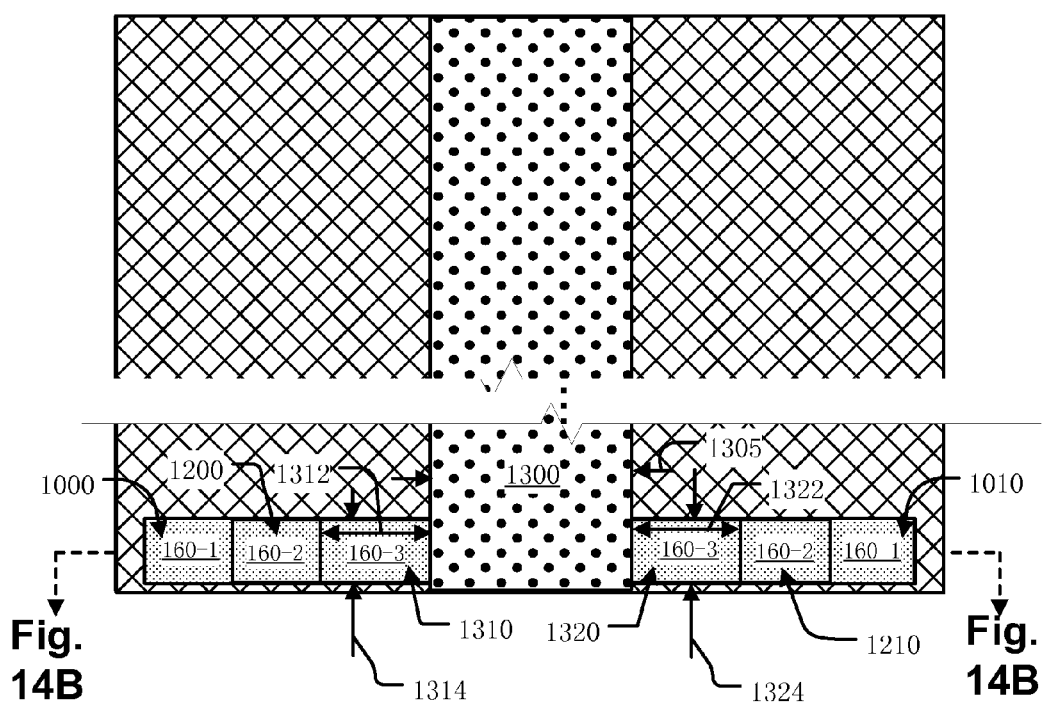
Related Art      Fig. 14A

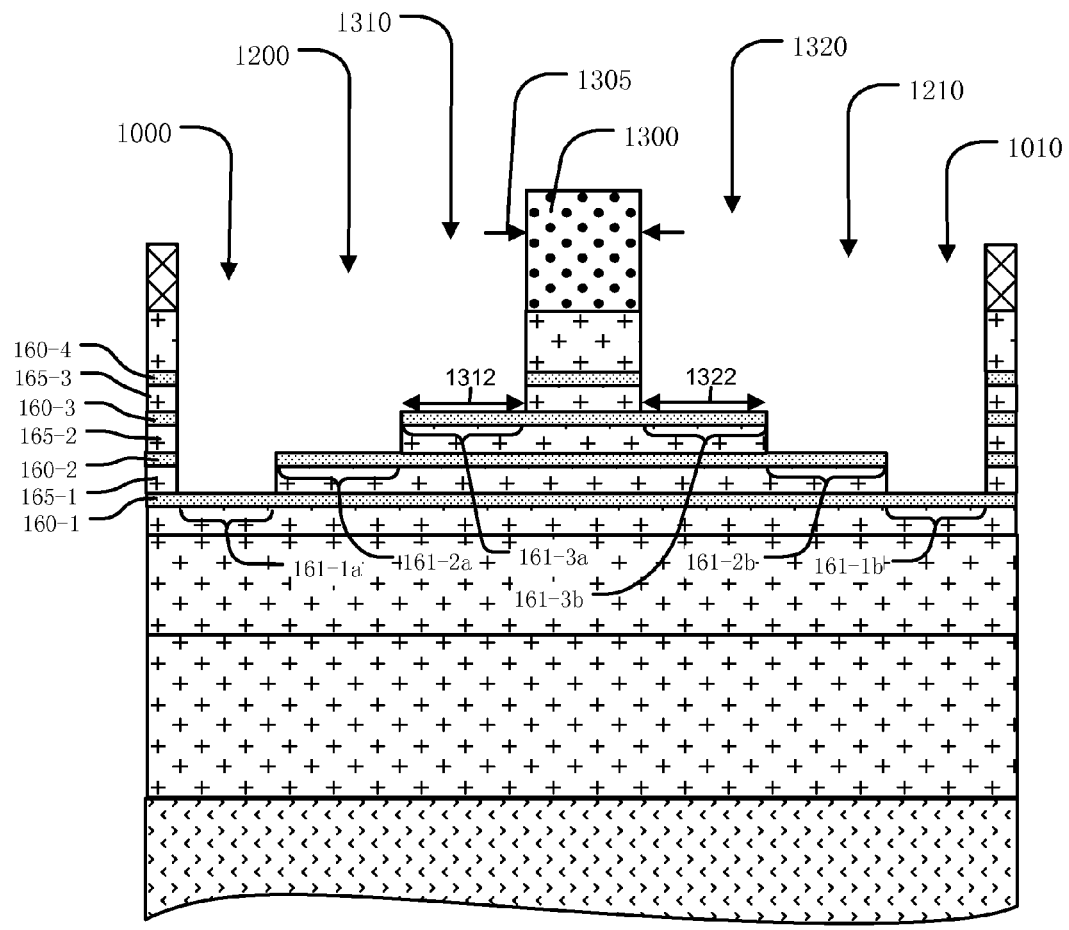
Related Art  Fig. 14B

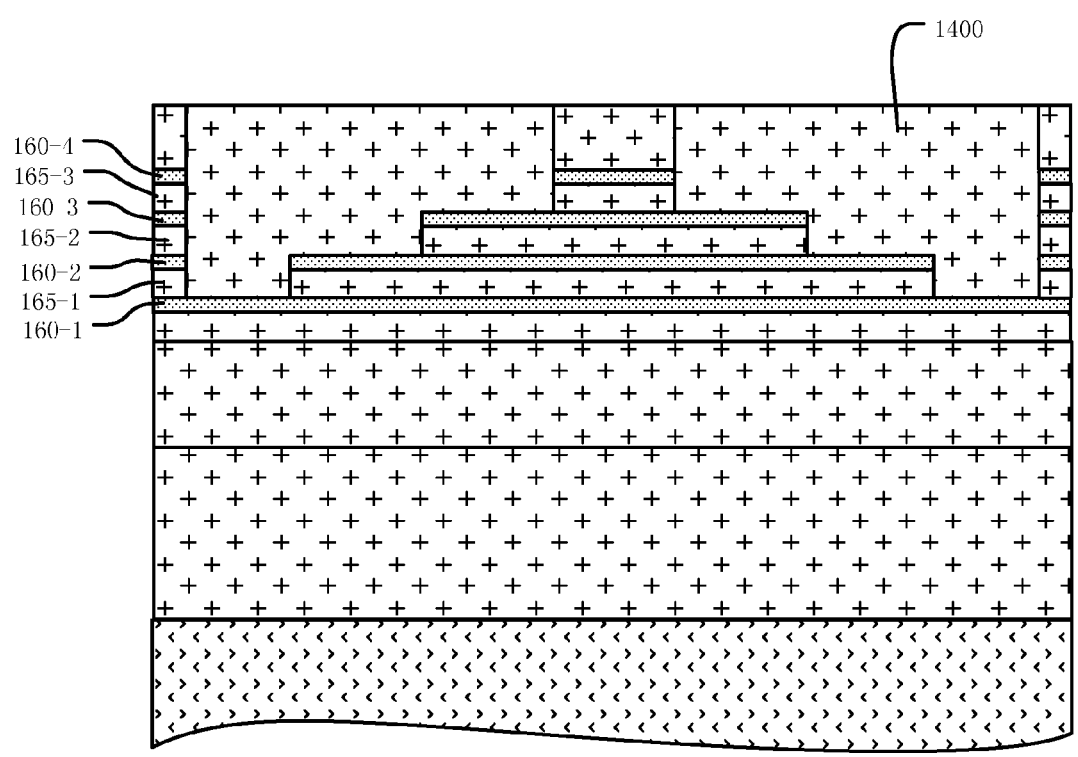
Related Art    Fig. 15

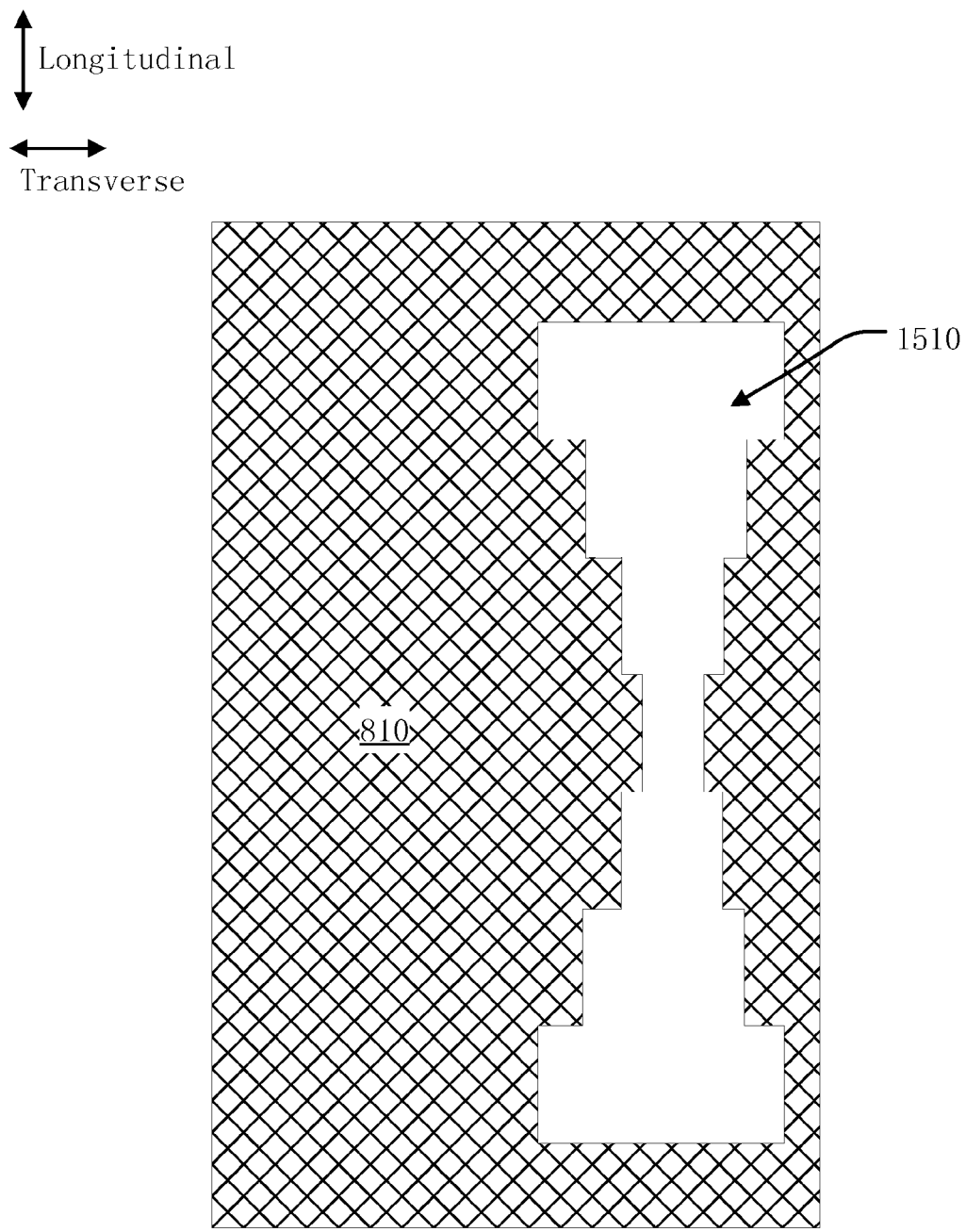
*Related Art* Fig. 16

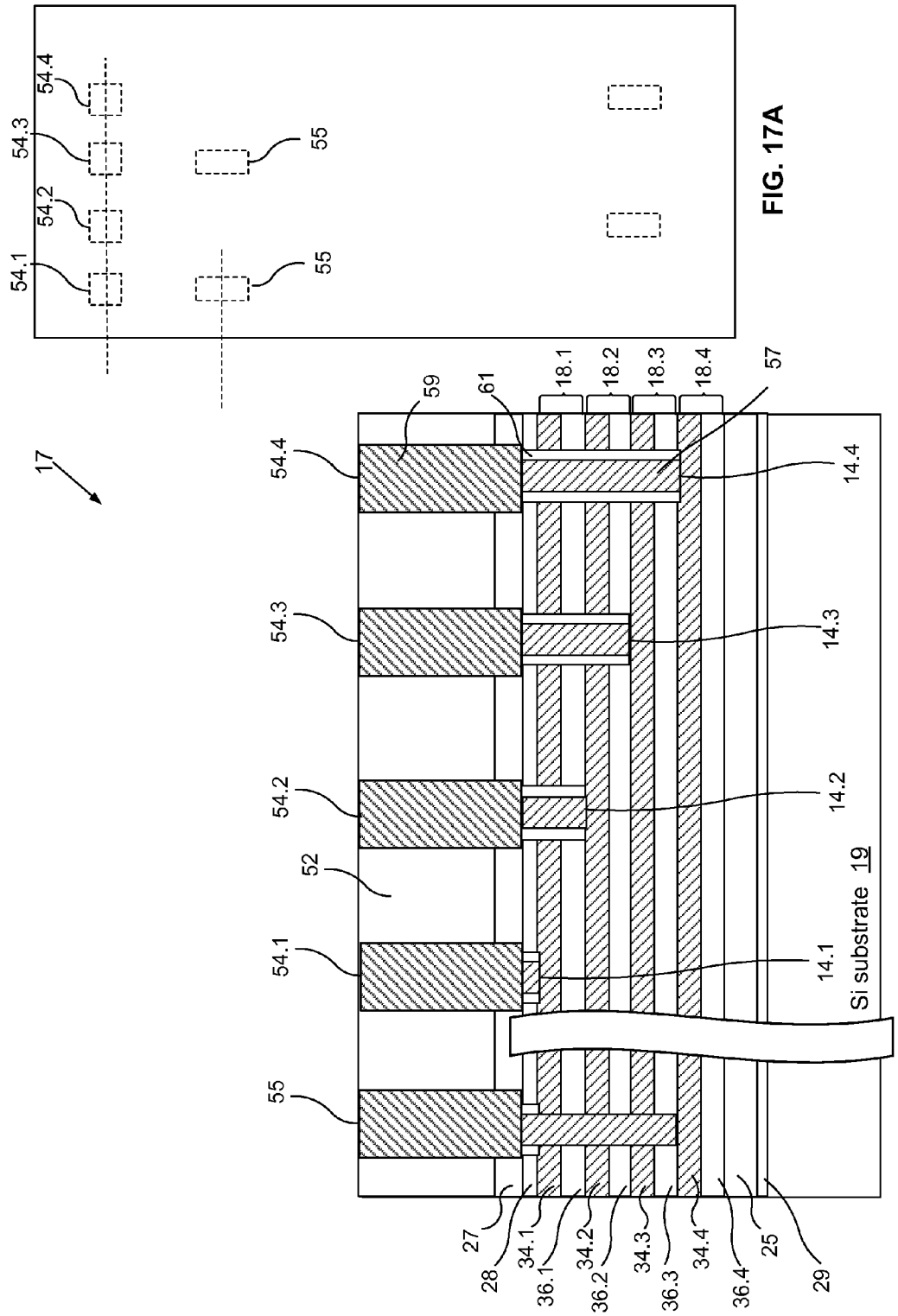

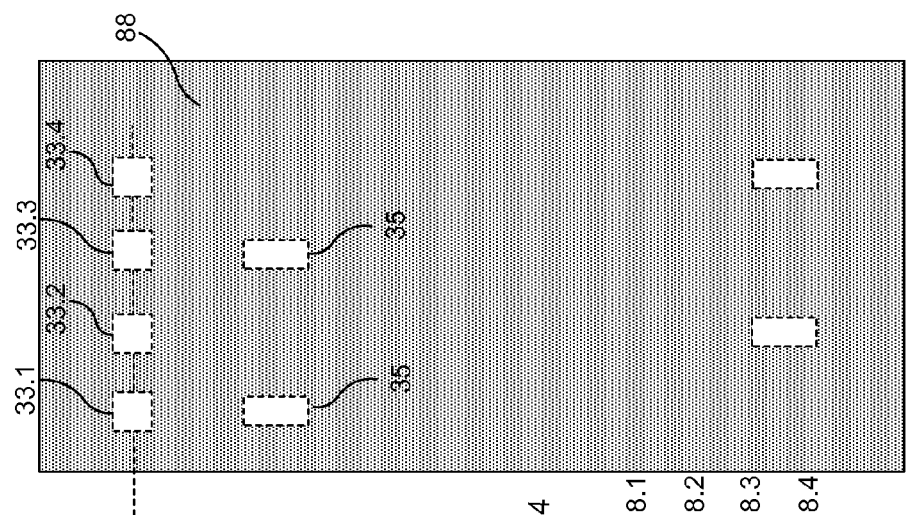
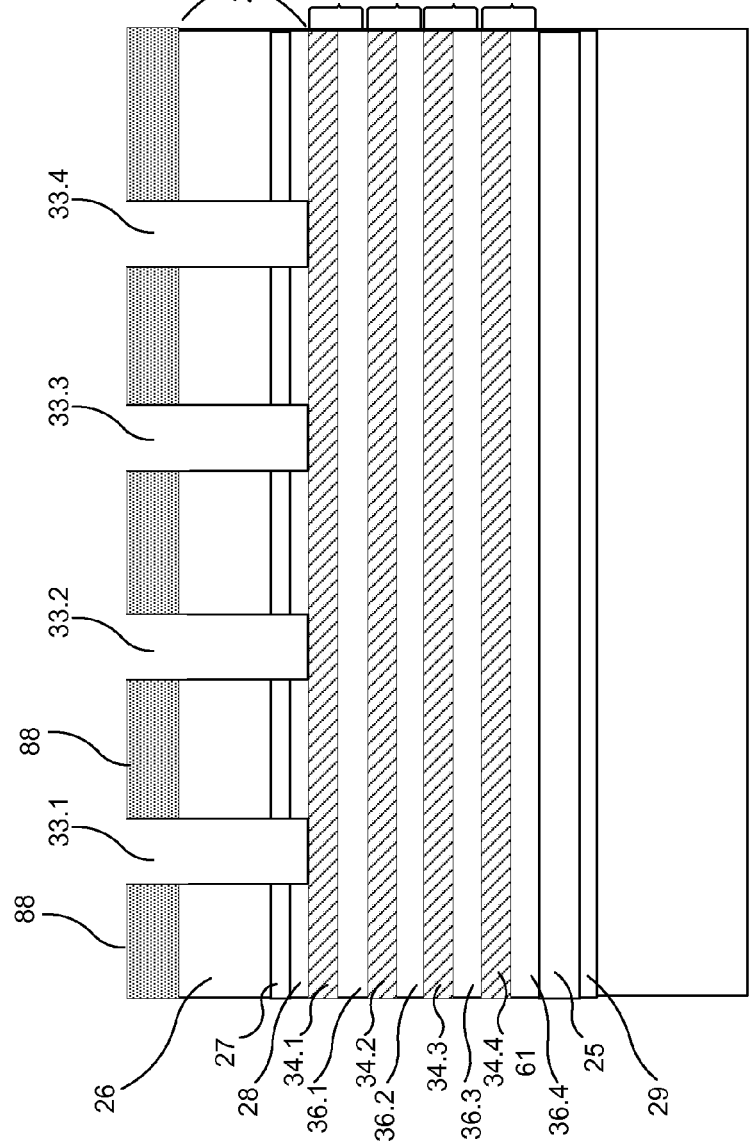

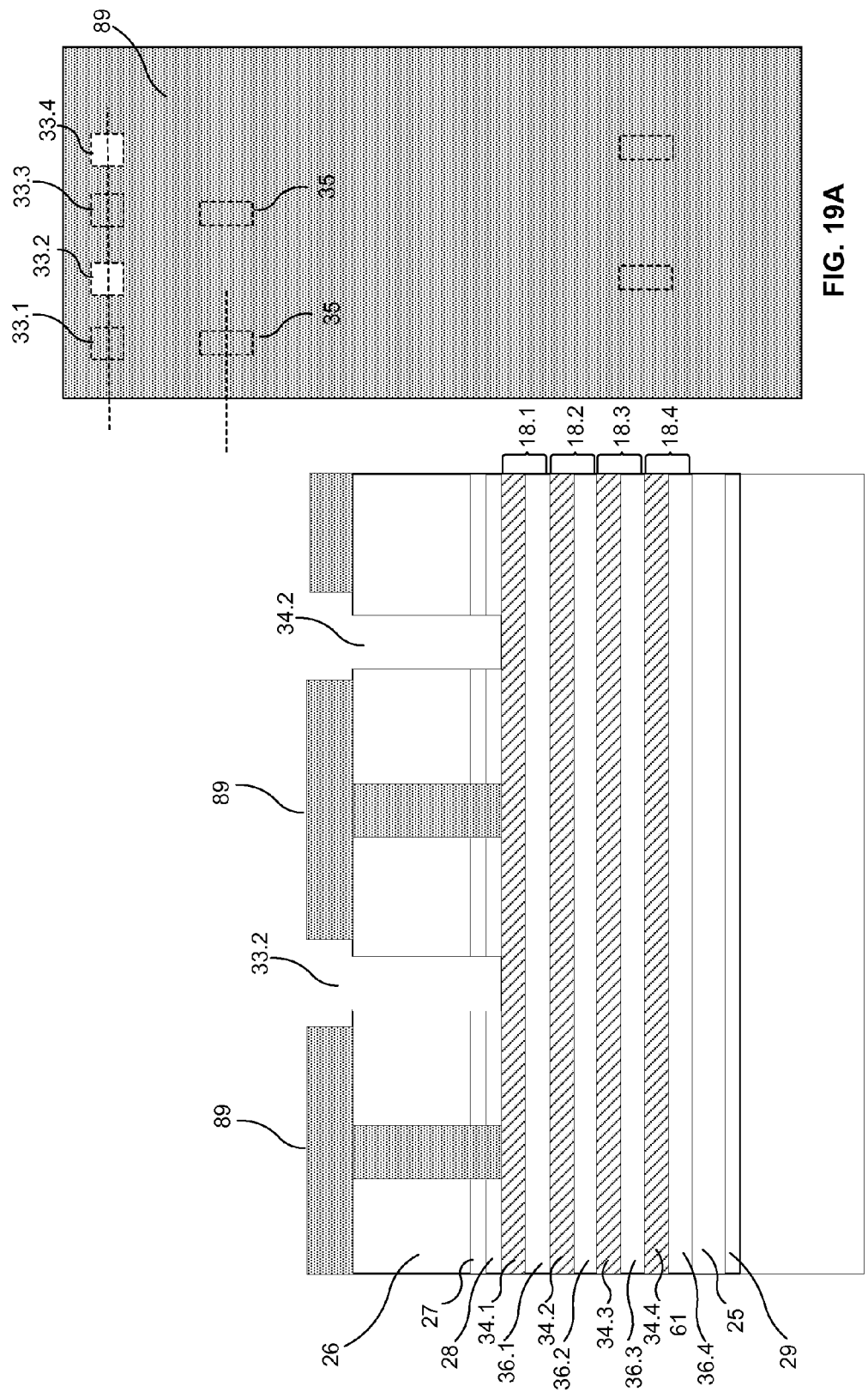

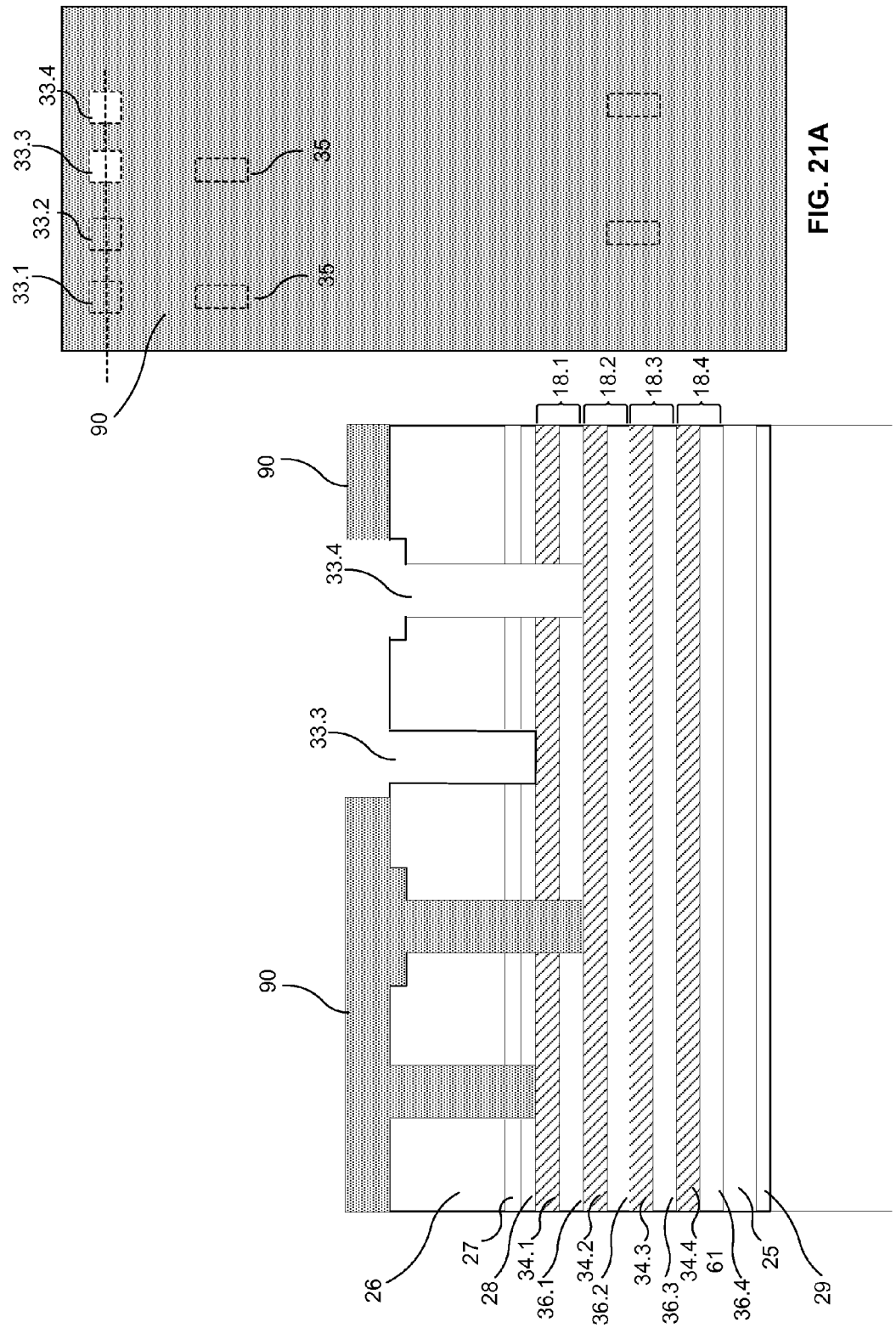

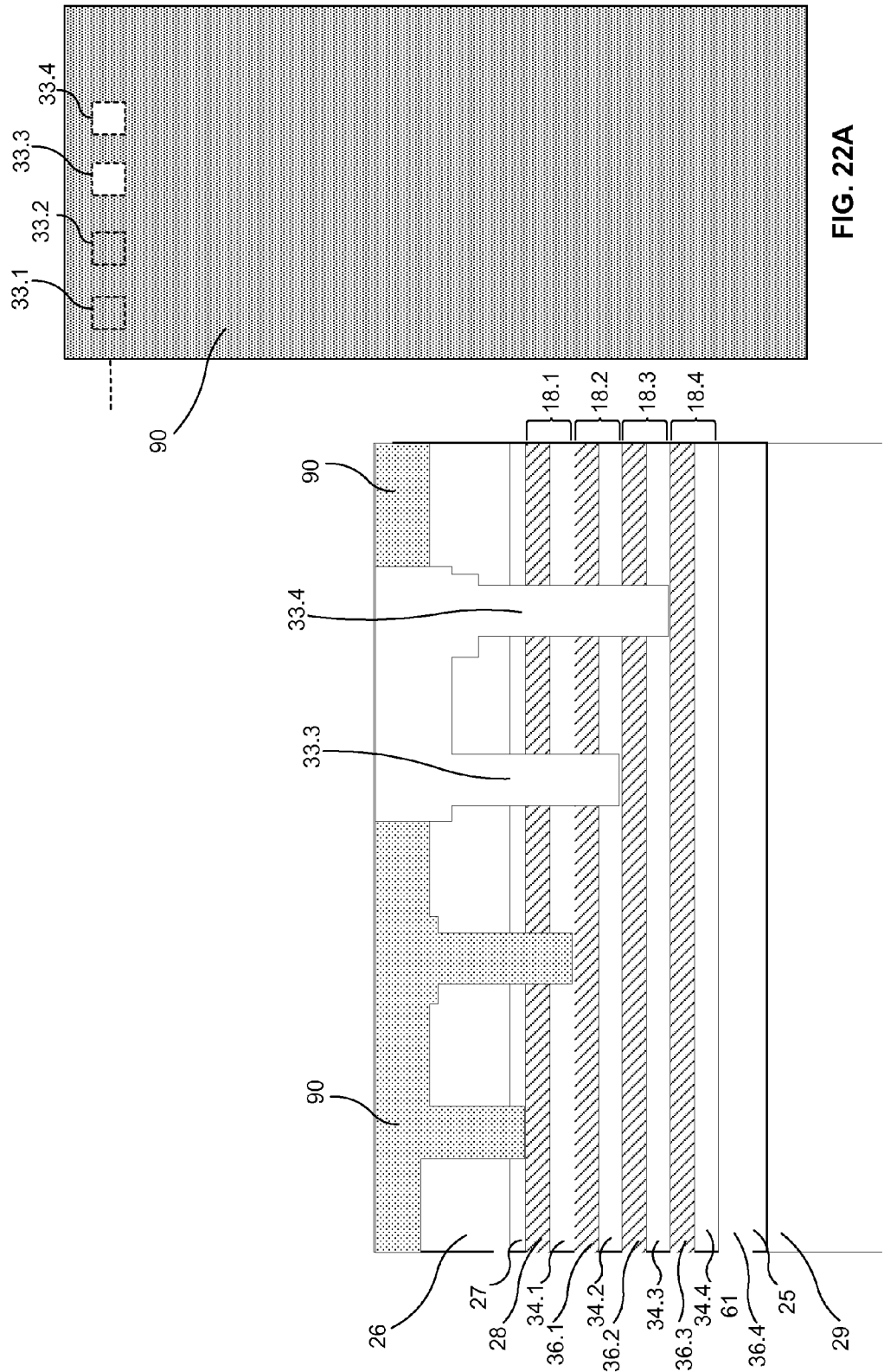

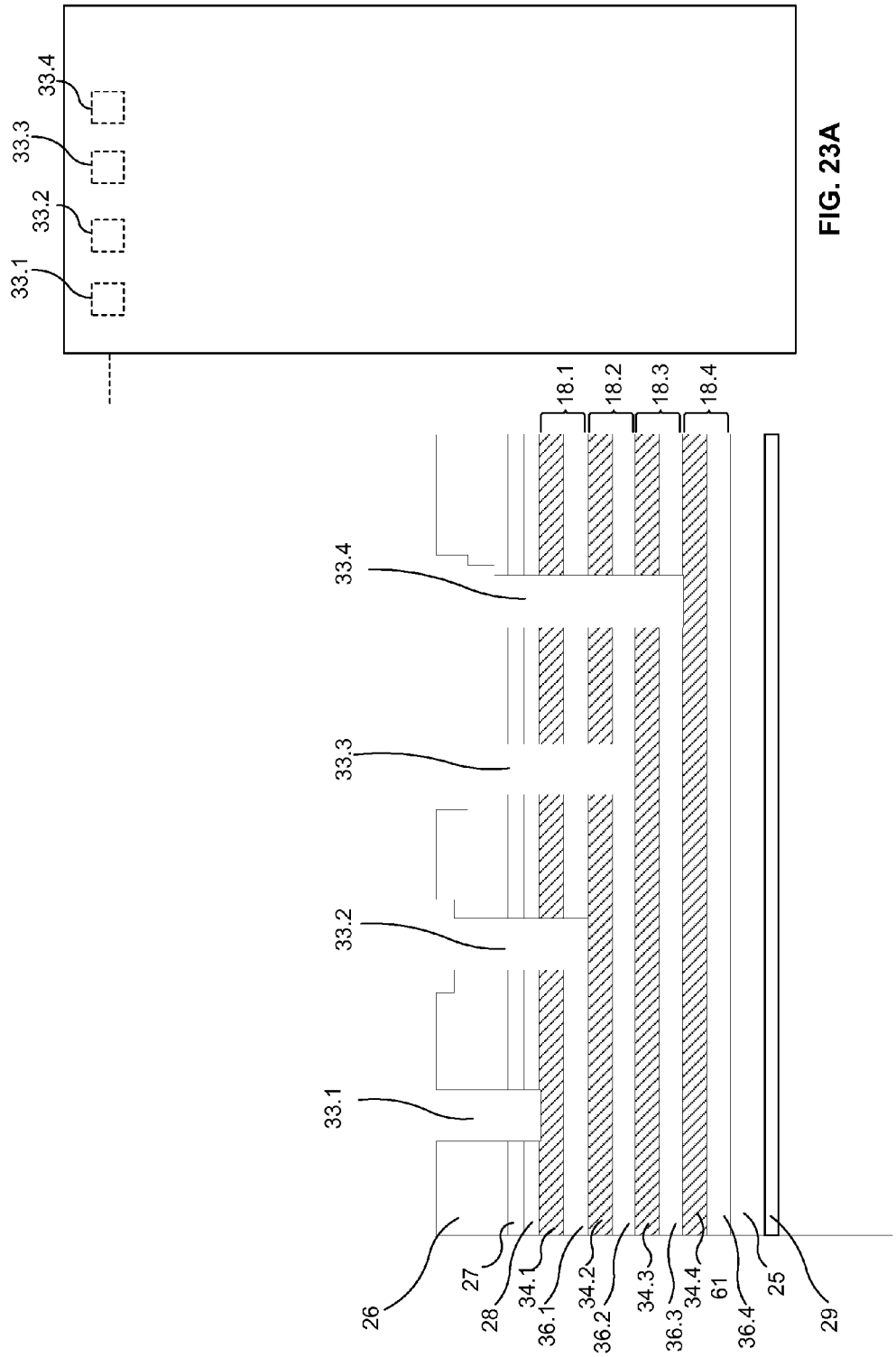

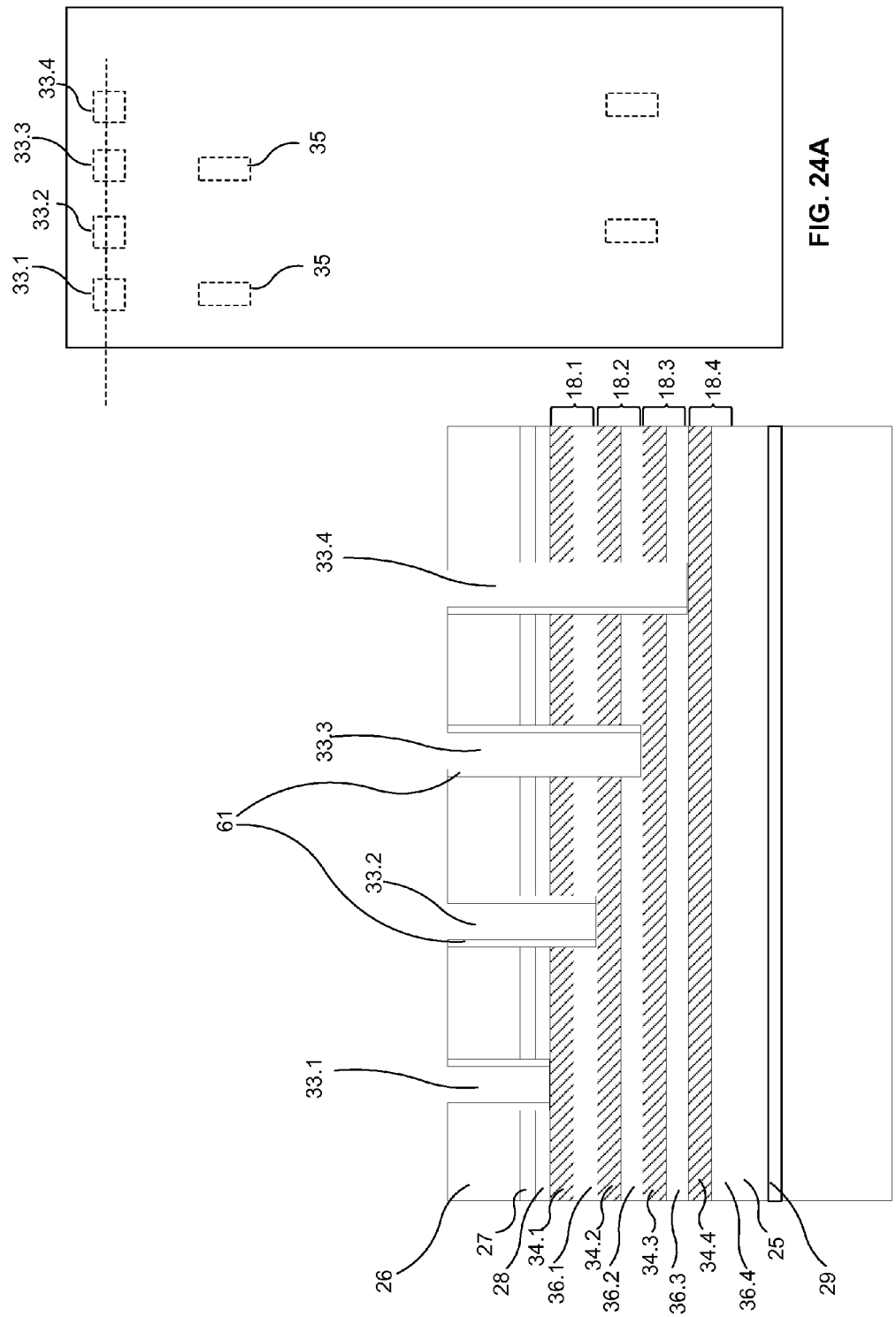

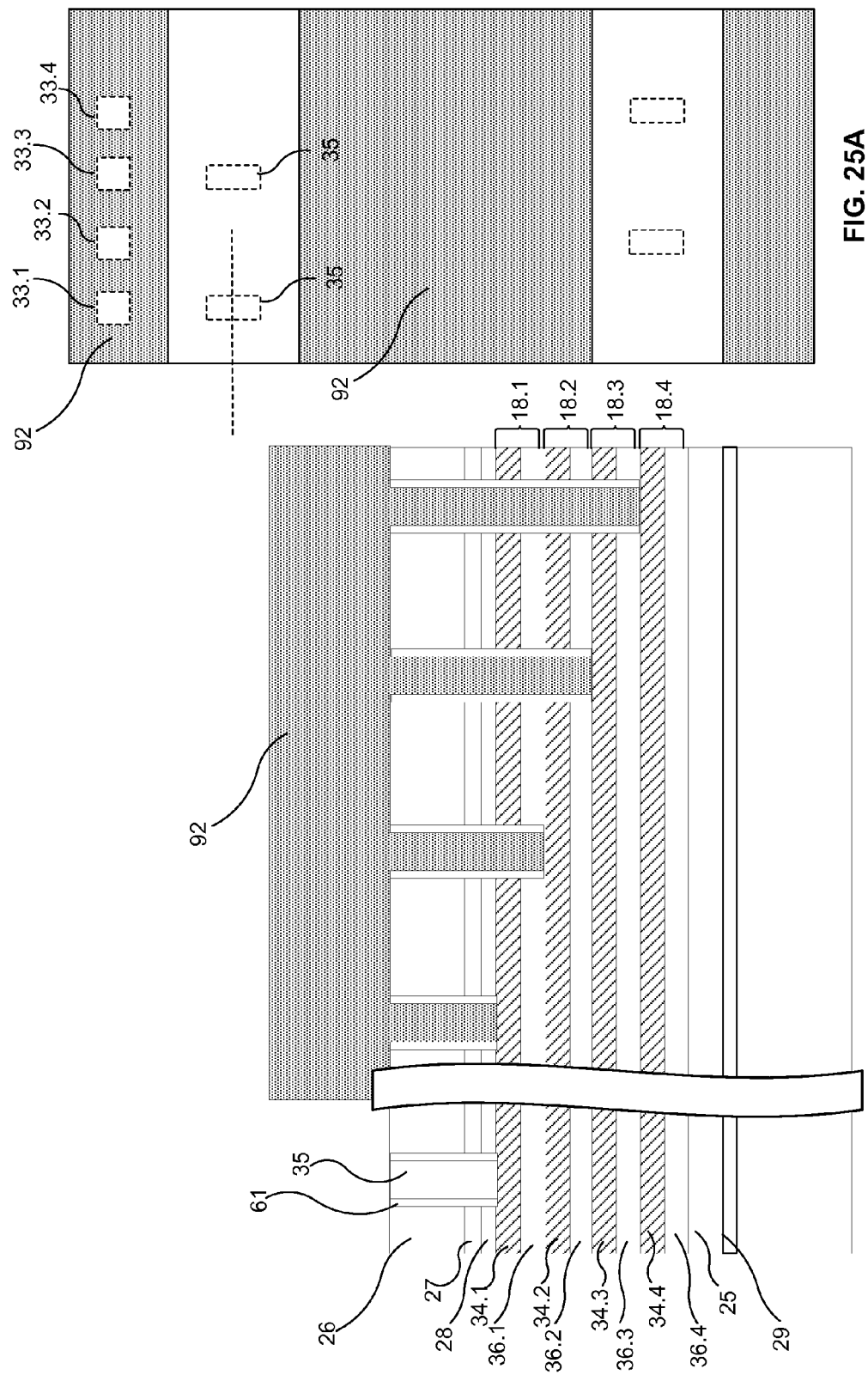

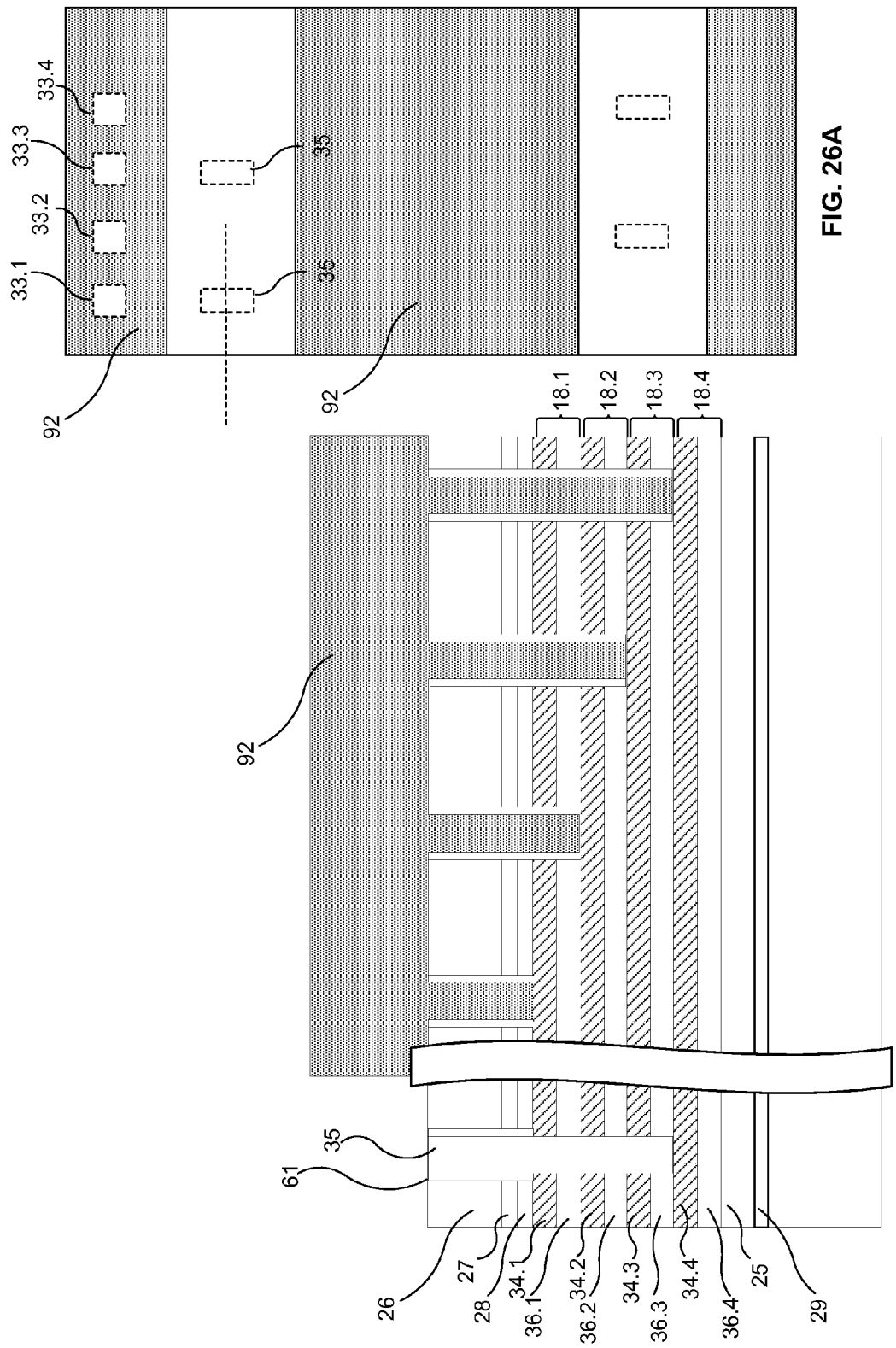

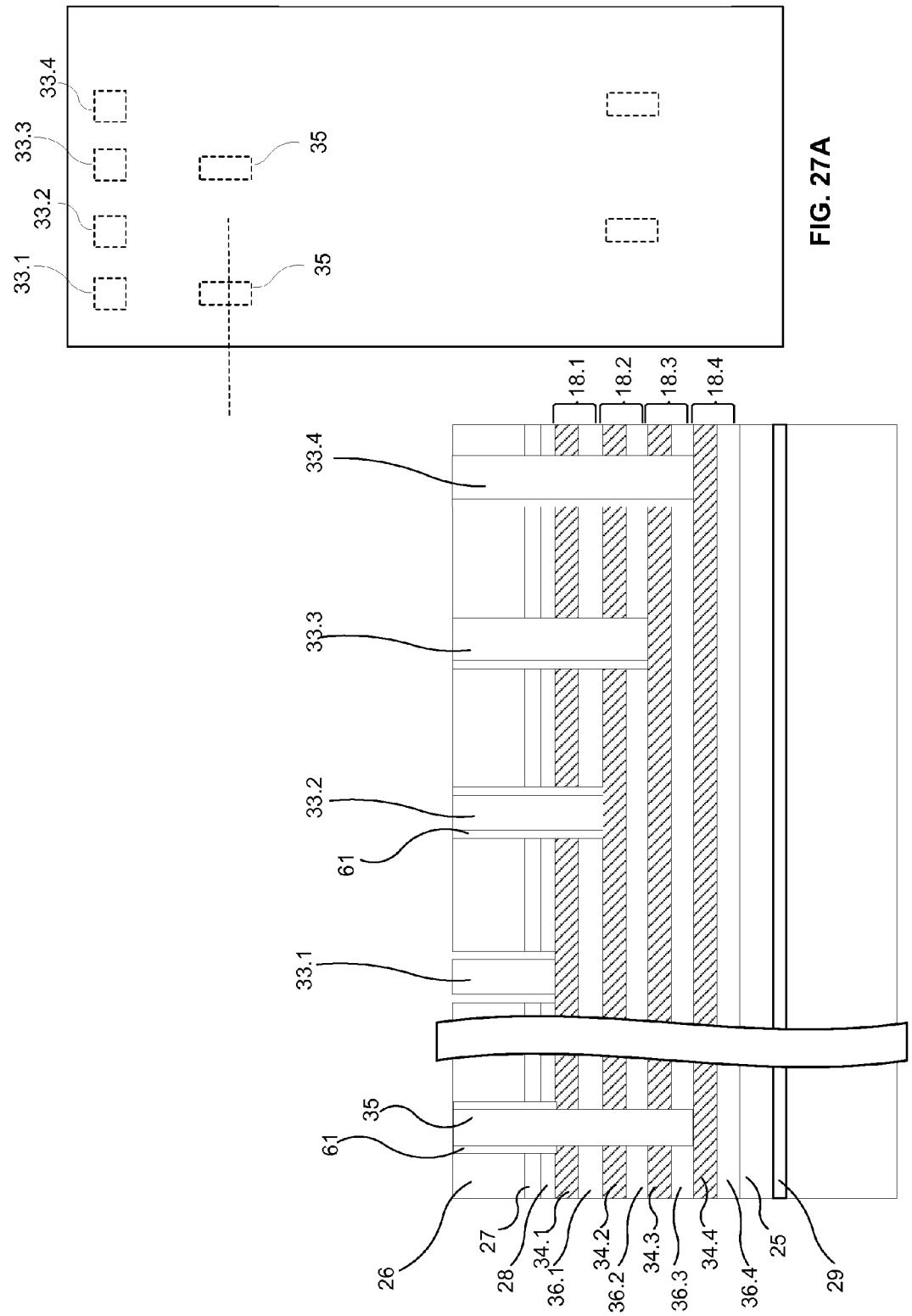

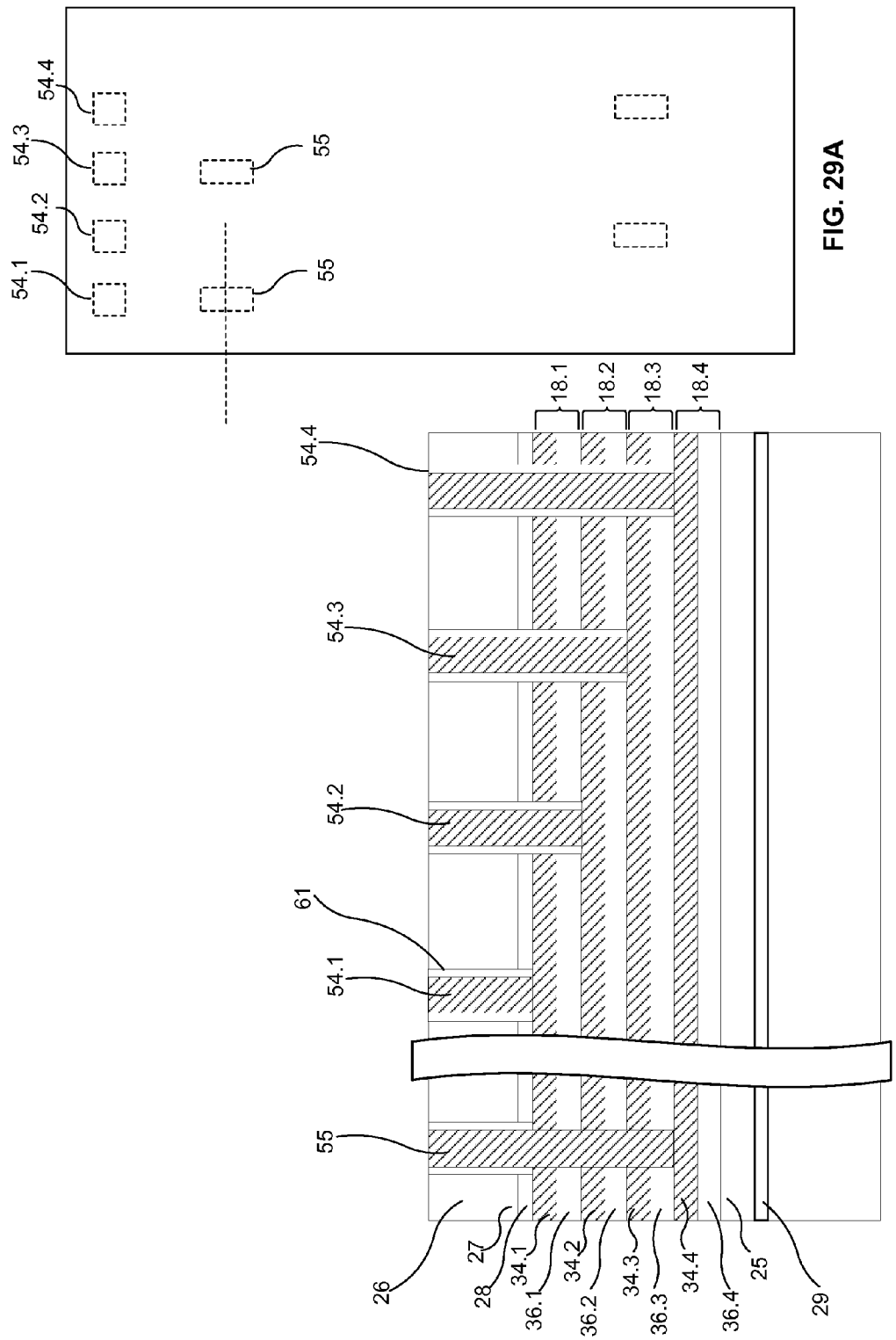

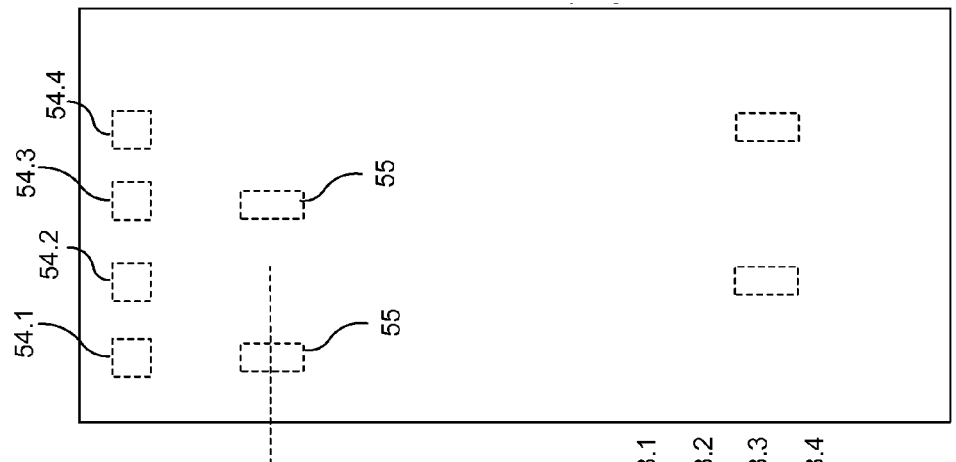
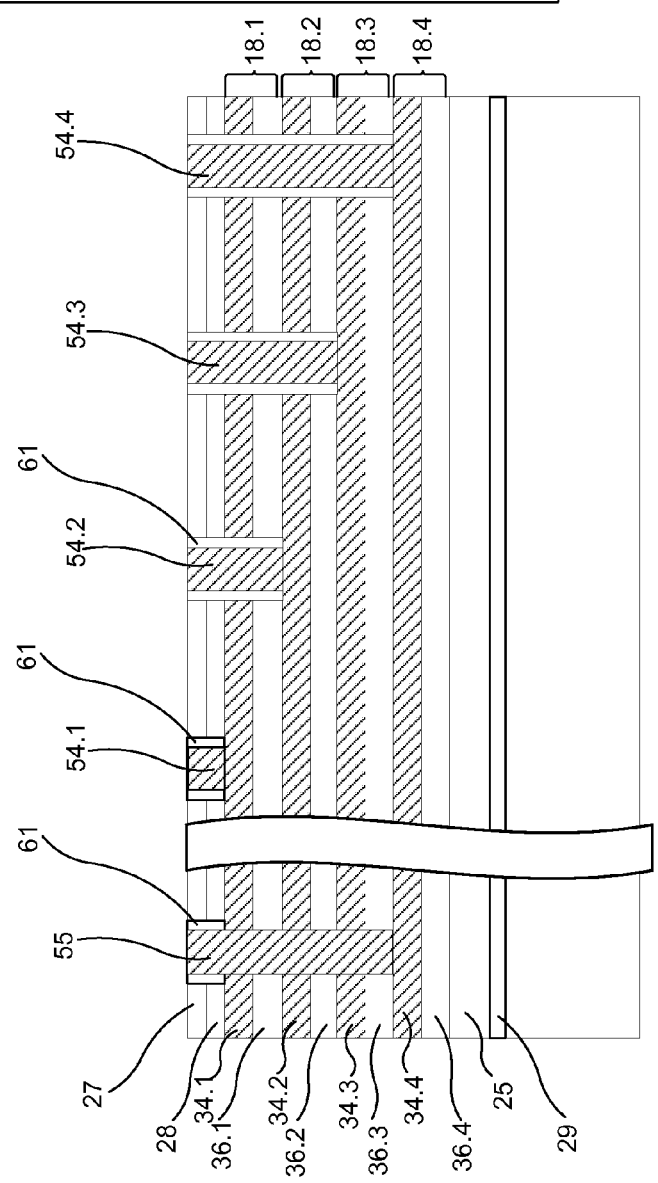
FIG. 30A
FIG. 30

First Example

| | # Layers Etched |
|---|---|
| Mask_1 | 1 |
| Mask_2 | 2 |
| Mask_3 | 4 |
| Mask_4 | 8 |

Contact Opening Position

| | A | B | C | D | E | F | G | H | I | J | K | L | M | N | O | P |
|---|---|---|---|---|---|---|---|---|---|---|---|---|---|---|---|---|
| | 0 | 1 | 0 | 1 | 0 | 1 | 0 | 1 | 0 | 1 | 0 | 1 | 0 | 1 | 0 | 1 |
| | 0 | 0 | 1 | 1 | 0 | 0 | 1 | 1 | 0 | 0 | 1 | 1 | 0 | 0 | 1 | 1 |
| | 0 | 0 | 0 | 0 | 1 | 1 | 1 | 1 | 0 | 0 | 0 | 0 | 1 | 1 | 1 | 1 |
| | 0 | 0 | 0 | 0 | 0 | 0 | 0 | 0 | 1 | 1 | 1 | 1 | 1 | 1 | 1 | 1 |
| Located Layer | 0 | 1 | 2 | 3 | 4 | 5 | 6 | 7 | 8 | 9 | 10 | 11 | 12 | 13 | 14 | 15 |

FIG. 35

Etching Sequence Change

| | # Layers Etched |
|---|---|
| Mask_1 | 8 |
| Mask_2 | 2 |
| Mask_3 | 4 |
| Mask_4 | 1 |

Contact Opening Position

| | A | B | C | D | E | F | G | H | I | J | K | L | M | N | O | P |
|---|---|---|---|---|---|---|---|---|---|---|---|---|---|---|---|---|
| | 0 | 1 | 0 | 1 | 0 | 1 | 0 | 1 | 0 | 1 | 0 | 1 | 0 | 1 | 0 | 1 |
| | 0 | 0 | 1 | 1 | 0 | 0 | 1 | 1 | 0 | 0 | 1 | 1 | 0 | 0 | 1 | 1 |
| | 0 | 0 | 0 | 0 | 1 | 1 | 1 | 1 | 0 | 0 | 0 | 0 | 1 | 1 | 1 | 1 |
| | 0 | 0 | 0 | 0 | 0 | 0 | 0 | 0 | 1 | 1 | 1 | 1 | 1 | 1 | 1 | 1 |
| Located Layer | 0 | 8 | 2 | 10 | 4 | 12 | 6 | 14 | 1 | 9 | 3 | 11 | 5 | 13 | 7 | 15 |

FIG. 36

Mask Sequence Change

Contact Opening Position

| | A | B | C | D | E | F | G | H | I | J | K | L | M | N | O | P | # Layers Etched |
|---|---|---|---|---|---|---|---|---|---|---|---|---|---|---|---|---|---|
| Mask_1 | 0 | 1 | 0 | 1 | 0 | 1 | 0 | 1 | 0 | 1 | 0 | 1 | 0 | 1 | 0 | 1 | 1 |
| Mask_2 | 0 | 0 | 1 | 1 | 0 | 0 | 1 | 1 | 0 | 0 | 1 | 1 | 0 | 0 | 1 | 1 | 2 |
| Mask_3 | 0 | 0 | 0 | 0 | 1 | 1 | 1 | 1 | 0 | 0 | 0 | 0 | 1 | 1 | 1 | 1 | 4 |
| Mask_4 | 0 | 0 | 0 | 0 | 0 | 0 | 0 | 0 | 1 | 1 | 1 | 1 | 1 | 1 | 1 | 1 | 8 |
| Located Layer | 0 | 1 | 4 | 5 | 2 | 3 | 6 | 7 | 8 | 9 | 12 | 13 | 10 | 11 | 14 | 15 | |

FIG. 37

Position Change

Contact Opening Position

| | J | B | C | D | E | F | G | H | I | A | K | L | M | N | O | P | # Layers Etched |
|---|---|---|---|---|---|---|---|---|---|---|---|---|---|---|---|---|---|
| Mask_1 | 1 | 1 | 0 | 1 | 0 | 1 | 0 | 1 | 0 | 0 | 0 | 1 | 0 | 1 | 0 | 1 | 1 |
| Mask_2 | 0 | 0 | 1 | 1 | 0 | 0 | 1 | 1 | 0 | 0 | 1 | 1 | 0 | 0 | 1 | 1 | 2 |
| Mask_3 | 0 | 0 | 0 | 0 | 1 | 1 | 1 | 1 | 0 | 0 | 0 | 0 | 1 | 1 | 1 | 1 | 4 |
| Mask_4 | 1 | 0 | 0 | 0 | 0 | 0 | 0 | 0 | 1 | 0 | 1 | 1 | 1 | 1 | 1 | 1 | 8 |
| Located Layer | 9 | 1 | 2 | 3 | 4 | 5 | 6 | 7 | 8 | 0 | 10 | 11 | 12 | 13 | 14 | 15 | |

FIG. 38

Combined Change

| | J | B | C | D | E | F | G | H | I | A | K | L | M | N | O | P |
|---|---|---|---|---|---|---|---|---|---|---|---|---|---|---|---|---|
| # Layers Etched | | | | | | | | | | | | | | | | |
| Mask_1   8 | 1 | 1 | 0 | 1 | 0 | 1 | 0 | 1 | 0 | 0 | 0 | 1 | 0 | 1 | 0 | 1 |
| Mask_2   2 | 0 | 0 | 0 | 0 | 1 | 1 | 1 | 1 | 0 | 0 | 0 | 0 | 1 | 1 | 1 | 1 |
| Mask_3   4 | 0 | 0 | 1 | 1 | 0 | 0 | 1 | 1 | 0 | 0 | 1 | 1 | 0 | 0 | 1 | 1 |
| Mask_4   1 | 1 | 0 | 0 | 0 | 0 | 0 | 0 | 0 | 1 | 1 | 1 | 1 | 1 | 1 | 1 | 1 |
| Located Layer | 9 | 8 | 4 | 12 | 2 | 10 | 6 | 14 | 1 | 0 | 5 | 13 | 3 | 11 | 7 | 15 |

Contact Opening Position

FIG. 39

MULTILAYER CONNECTION STRUCTURE

CROSS-REFERENCE TO RELATED APPLICATIONS

This application is a divisional of U.S. patent application Ser. No. 13/114,931 filed 24 May 2011 (now U.S. Pat. No. 8,383,512), which application claims the benefit of U.S. Provisional Patent Application No. 61/434,423 filed 19 Jan. 2011.

This application is related to U.S. Provisional Patent Application No. 61/434,086 filed 19 Jan. 2011; and U.S. patent application Ser. No. 12/579,192 filed 14 Oct. 2009 (now U.S. Pat. No. 8,154,128).

BACKGROUND OF THE INVENTION

1. Field of the Invention

The present invention relates generally to high density integrated circuit devices, and more particularly to interconnect structures for multi-level three-dimensional stacked devices.

2. Description of Related Art

In the manufacturing of high density memory devices, the amount of data per unit area on an integrated circuit can be a critical factor. Thus, as the critical dimensions of the memory devices approach lithographic technology limits, techniques for stacking multiple levels of memory cells have been proposed in order to achieve greater storage density and lower costs per bit.

For example, thin film transistor techniques are applied to charge trapping memory in Lai, et al., "A Multi-Layer Stackable Thin-Film Transistor (TFT) NAND-Type Flash Memory," IEEE Int'l Electron Devices Meeting, 11-13 Dec. 2006; and in Jung et al., "Three Dimensionally Stacked NAND Flash Memory Technology Using Stacking Single Crystal Si Layers on ILD and TANOS Structure for Beyond 30 nm Node", IEEE Int'l Electron Devices Meeting, 11-13 Dec. 2006.

Also, cross-point array techniques have been applied for anti-fuse memory in Johnson et al., "512-Mb PROM With a Three-Dimensional Array of Diode/Anti-fuse Memory Cells" IEEE J. of Solid-State Circuits, vol. 38, no. 11, Nov. 2003. See, also U.S. Pat. No. 7,081,377 to Cleeves entitled "Three-Dimensional Memory."

Another structure that provides vertical NAND cells in a charge trapping memory technology is described in "Novel 3-D Structure for Ultra-High Density Flash Memory with VRAT and PIPE" by Kim et al., 2008 Symposium on VLSI Technology Digest of Technical Papers"; 17-19 June 2008; pages 122-123.

In three-dimensional stacked memory devices, conductive interconnects used to couple the lower levels of memory cells to decoding circuitry and the like pass through the upper levels. The cost to implement the interconnections increases with the number of lithographic steps needed. One approach to reduce the number of lithographic steps is described in Tanaka et al., "Bit Cost Scalable Technology with Punch and Plug Process for Ultra High Density Flash Memory", 2007 Symposium on VLSI Technology Digest of Technical Papers; 12-14 June 2007; pages 14-15.

However, one of the drawbacks with conventional 3-D stacked memory devices is that a separate mask is typically used for each contact level. Therefore, if there are, for example, 20 contact levels, 20 different masks are commonly required, each contact level requiring the creation of a mask for that level and an etching step for that level.

SUMMARY OF THE INVENTION

An example of a method, for use with a three-dimensional stacked IC device having a stack of at least 4 contact levels at an interconnect region, is used to create interconnect contact regions aligned with and exposing landing areas at the contact levels. Each contact level comprises a conductive layer and an insulation layer. At least a portion of any upper layer overlying the interconnect region is removed to expose a first contact level and create contact openings for each contact level. A set of N etch masks is selected to create a plurality of levels of interconnect contact regions at the stack of the contact levels, N being an integer equal to at least 2. The N masks are used to etch the contact openings up to and including 2N contact levels. The N masks using step comprises using a first mask to etch one contact level for effectively half of the contact openings and using a second mask to etch two contact levels for effectively half of the contact openings. The removing, selecting and using steps are carried out so that the contact openings extend to the 2N contact levels. Electrical conductors can be formed through the contact openings to contact the landing areas at the contact levels. In some examples, the removing step is carried out using an additional mask. In some examples, the first mask using step comprises using the first mask to etch one contact level at every other contact opening and the second mask using step comprises using the second mask to etch two contact levels at third and fourth contact openings in at least one set of first through fourth contact openings. In some examples, the N masks using step further comprises using a third mask to etch four contact levels for effectively half of the contact openings, and using a fourth mask to etch eight contact levels for effectively half of the contact openings. In some examples, the third mask using step comprises using the third mask to etch four contact levels at fifth through eighth contact openings in at least one set of first through eighth contact openings; and the fourth mask using step comprises using the fourth mask to etch eight contact levels at ninth through 16th contact openings in at least one set of first through 16th contact openings. In some examples, a ground contact opening is created through the contact levels and an electrical ground conductor is formed through the ground contact opening to make electrical contact with a plurality of the conductive layers of the contact levels. In some examples, the ground contact opening has a ground opening sidewall, and portions of the insulation layers at the ground contact opening sidewall are removed prior to the electrical ground conductor forming step so the electrical ground conductor makes enhanced electrical contact between the electrical ground conductor and the plurality of the conductive layers of the contact levels.

Another example of a method provides electrical connections to landing areas at a stack of contact levels of an interconnect region for a three-dimensional stacked IC device. The IC device is of a type comprising an interconnect region. The interconnect region includes an upper layer with a stack of contact levels beneath the upper layer. Each contact level comprises a conductive layer and an insulation layer. At least a portion of any upper layer overlying the interconnect region is removed to expose a first contact level and create contact openings for each contact level. A set of N etch masks is selected to create a plurality of levels of interconnect contact regions at the stack of the contact levels, N being an integer equal to at least 2. The N masks are used to etch the contact openings up to and including 2N contact levels. The N masks using step comprises using a first mask to etch one contact level for effectively half of the contact openings and using a second mask to etch two contact levels for effectively half of the contact openings. The removing, selecting and using steps are carried out so that the contact openings extend to the 2N contact levels. A dielectric layer is formed on the sidewalls. Electrical conductors are formed through the contact openings to the landing areas at the contact levels, the dielectric layers electrically insulating the electrical conductors from the sidewalls. In some examples, a ground contact opening is created through the contact levels, and an electrical ground conductor is formed through the ground contact opening to make electrical contact with a plurality of the conductive layers of the contact levels. In some examples, the ground contact opening has a ground contact opening sidewall, and portions of the insulation layers at the ground contact opening sidewall are removed prior to the electrical ground conductor forming step so that portions of a plurality of the conductive layers adjacent to the ground contact opening are exposed so that the electrical ground conductor makes enhanced electrical contact with the conductive layers.

A first example of a three-dimensional stacked IC device comprises a stack of at least first, second, third and fourth contact levels at an interconnect region. Each contact level comprises a conductive layer and an insulation layer. First, second, third and fourth electrical conductors pass through portions of the stack of contact levels. The first, second, third and fourth electrical conductors are in electrical contact with the first, second, third and fourth conductive layers, respectively. A sidewall spacer circumferentially surrounds the second, third and fourth electrical conductors so that the second, third and fourth electrical conductors only electrically contact the respective second, third and fourth conductive layers. In some examples, the first, second, third and fourth electrical conductors have a constant pitch. In some examples, the locations of the first, second, third and fourth electrical conductors are determinable by a common mask. In some examples, the stacked IC device further comprises a ground conductor passing through portions of the stack of contact levels; the ground conductor electrically contacts each of the first, second, third and fourth conductive layers.

A second example of a three-dimensional stacked IC device comprises a stack of at least first, second, third and fourth contact levels at an interconnect region. Each contact level comprises a conductive layer and an insulation layer. First, second, third and fourth electrical conductors pass through portions of the stack of contact levels. The first, second, third and fourth electrical conductors are in electrical contact with the first, second, third and fourth conductor layers, respectively. The first, second, third and fourth electrical conductors have a constant pitch. In some examples, the locations of the first, second, third and fourth electrical conductors are determinable by a common mask.

A third example of a three-dimensional stacked IC device comprises a stack of at least first, second, third and fourth contact levels at an interconnect region. Each contact level comprises a conductive layer and an insulation layer. First, second, third and fourth electrical conductors pass through portions of the stack of contact levels. The first, second, third and fourth electrical conductors are in electrical contact with the first, second, third and fourth conductor layers, respectively. A dielectric sidewall spacer circumferentially surrounds the second, third and fourth electrical conductors so that the second, third and fourth electrical conductors only electrically contact the respective second, third and fourth conductive layers. A ground conductor passes through portions of the stack of contact levels and electrically contacts each of the first, second, third and fourth conductive layers. The first, second, third and fourth electrical conductors have a constant pitch. The locations of the first, second, third and fourth electrical conductors and the ground conductor are determinable by a common mask.

Other aspects and advantages of the present invention can be seen on review of the drawings, the detailed description, and the claims which follow.

BRIEF DESCRIPTION OF THE DRAWINGS

FIGS. 1-16 and the associated description are taken from U.S. patent application Ser. No. 12/579,192 filed 14 Oct. 2009 and entitled 3D Integrated Circuit Layer Interconnect having the same assignee as this application, the disclosure of which is incorporated by reference.

FIG. 1 illustrates a cross-sectional view of a device including a three-dimensional structure having an interconnect structure 190 with a small footprint where conductors 180 extend to various levels 160-1 to 160-4 in the device.

FIG. 2A illustrates a plan view of level 160-1 showing the landing areas.

FIG. 2B illustrates a plan view of level 160-2 showing openings adjacent the landing areas.

FIG. 2C illustrates a plan view of level 160-3 showing openings adjacent the landing areas.

FIG. 2D illustrates a plan view of level 160-4 showing openings adjacent the landing area.

FIG. 4 illustrates a top view layout of an embodiment of the device which includes interconnect structures in the periphery on two sides of a memory array.

FIG. 5 illustrates a top view layout of an embodiment of the device which includes interconnect structures in the periphery on four sides of a memory array.

FIG. 6 is a schematic diagram of a portion of the memory device including an interconnect structure as described herein.

FIG. 7 is a simplified block diagram of an integrated circuit device including a 3D memory array having an interconnect structure as described herein.

FIGS. 8A-8C to 15 illustrate steps in a fabrication sequence for manufacturing an interconnect structure as described herein.

FIG. 16 illustrates a plan view of an opening in a mask having a width varying in the longitudinal direction in a step-like manner, to accommodate varying widths of landing areas on the levels.

FIGS. 17-34A illustrate the structure and method of making another example of a three-dimensional stacked IC device.

FIGS. 17 and 17A are simplified side cross-sectional and plan views of an interconnect region of another example of a three-dimensional stacked IC device.

FIGS. 18 and 18A show the interconnect region after forming contact openings through an upper layer to expose the upper conductive layer of the first contact level.

FIGS. 19 and 19A show a first mask on the structure of FIG. 18, the first mask exposing every other contact opening.

FIGS. 20 and 20A show the result of etching through a single contact level of the exposed contact openings.

FIGS. 21 and 21A show the result of the removal of the first mask and the formation of the second mask on the structure of FIG. 20 so that the first and second contact openings, counting from the left, are covered by the second mask while the third and fourth contact openings are open.

FIGS. 22 and 22A show the result of etching down through two contact levels of the third and fourth contact openings.

FIGS. 23 and 23A show the structure of FIG. 22 after removal of the second mask of FIG. 22.

FIGS. 24 and 24A show the structure of FIG. 23 after the formation of sidewall spacers on the sidewalls of the sidewall openings thereby electrically insulating the contact levels from the interiors of the contact openings.

FIGS. 25 and 25A show the structure of FIG. 24 with the addition of a cross-sectional view through a ground contact opening in FIG. 25, the contact openings being covered by photoresist while the ground contact openings is left exposed.

FIGS. 26 and 26A illustrate the structure of FIG. 25 after etching through three contact levels to expose the conductive layer of the fourth contact level.

FIGS. 27 and 27A illustrate the structure of FIG. 26 after removing the photoresist.

FIGS. 28 and 28A show the structure of FIG. 27 after the deposition of polysilicon filling the contact openings and the ground contact openings and covering the upper layer, the polysilicon within the contact openings and ground contact openings forming electrical conductors and electrical ground conductors, respectively.

FIGS. 29 and 29A show structure of FIG. 28 after etching away the polysilicon covering the upper layer.

FIGS. 30 and 30A show the result of chemical mechanical polishing of the upper surface down to the charge trapping layer of the upper surface.

FIGS. 31 and 31A illustrate the structure of FIG. 30 after the deposition of a stop layer followed by the deposition of interlayer dielectric oxide on the top layer.

FIGS. 32 and 32A show the structure of FIG. 31 after the formation of contact opening extensions through the interlayer dielectric oxide and the stop layer to the electrical conductors and electrical ground conductor, followed by filling the vias with an electrical conductor, so to create electrical conductors and ground electrical conductors having first parts extending through the contact levels and second parts extending through the upper layer.

FIG. 33 is a graphical illustration of a set of 16 contact openings illustrating for different sets of contact openings etched to four different depths to create the structure of FIG. 17.

FIGS. 34 and 34A are cross-sectional and plan views of a three dimensional stacked IC device.

FIG. 35 illustrates the masking and etching procedures of FIG. 33 but in a different manner.

FIGS. 36-38 are similar to FIG. 35 but with an etching sequence change, a mask sequence change, and a position sequence change, respectively.

FIG. 39 is similar to FIG. 35 but combining the changes of FIGS. 36-38.

DETAILED DESCRIPTION

Figure 1:
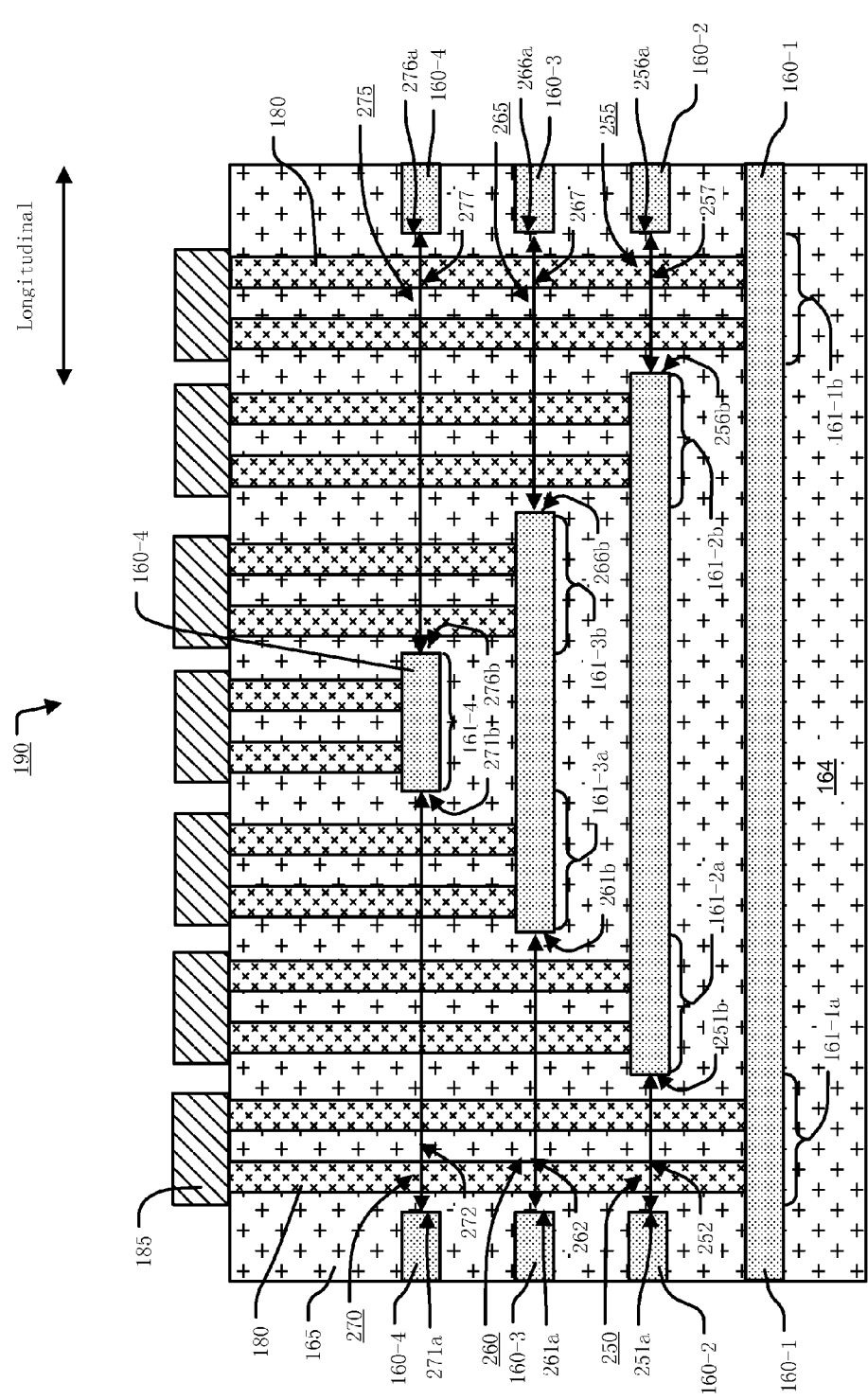

FIG. 1 illustrates a cross-sectional view of a device including three-dimensional structure having an interconnect structure 190 with a small footprint where conductors 180 extend to various levels 160-1 to 160-4 in the device. In the illustrated example, four levels 160-1 to 160-4 are shown. More generally, the small interconnect structure 190 described herein can be implemented in a structure having levels 0 to N, where N is at least 2.

The conductors 180 are arranged within the interconnect structure 190 to contact landing areas on the various levels 160-1 to 160-4. As described in more detail below, the conductors 180 for each particular level extend through openings in the overlying levels to contact the landing areas 161-1a, 161-1b, 161-2a, 161-2b, 161-3a, 161-3b, 161-4. The conductors 180 are used, in this example, for coupling the contact levels 160-1 to 160-4 to interconnect lines 185 in a wiring layer overlying the levels 160-1 to 160-4.

The landing areas are the portions of contact levels 160-1 to 160-4 used for contact with conductors 180. The sizes of the landing areas are large enough to provide room for the conductors 180 to adequately couple the electrically conductive landing areas within the landing areas of the various contact levels 160-1 to 160-4 to the overlying interconnect lines 185, as well as to address issues such as misalignment between the conductors 180 and the overlying openings in one level for landing areas in different levels.

The size of a landing area thus depends on a number of factors, including the size and number of conductors used, and will vary from embodiment to embodiment. In addition, the number of the conductors 180 can be different for each of the landing areas.

In the illustrated example, the levels 160-1 to 160-4 consist of respective planar conductive layers of material such as doped polysilicon, with layers of insulating material 165 separating the levels 160-1 to 160-4. Alternatively, the levels 160-1 to 160-4 need not be planar stacked material layers, and instead the layers of material can vary in the vertical dimension.

The conductors 180 contacting the different levels 160-1 to 160-4 are arranged in a direction extending along the cross-section illustrated in FIG. 1A. This direction defined by the arrangement of the conductors 180 contacting different levels 160-1 to 160-4 is referred to herein as the "longitudinal" direction. The "transverse" direction is perpendicular to the longitudinal direction, and is into and out of the cross-section illustrated in FIG. 1A. Both the longitudinal and transverse directions are considered to be "lateral dimensions", meaning a direction that is in a two-dimensional area of a plan view of the levels 160-1 to 160-4. The "length" of structures or features is its length in the longitudinal direction, and its "width" is its width in the transverse direction.

Level 160-1 is the lowest level in the plurality of levels 160-1 to 160-4. The level 160-1 is on insulating layer 164.

The level 160-1 includes first and second landing areas 161-1a, 161-1b for contact with conductors 180.

In FIG. 1 the level 160-1 includes two landing areas 161-1a, 161-1b on opposite ends of the interconnect structure 190. In some alternative embodiments, one of the landing areas 161-1a, 161-1b is omitted.

FIG. 2A is a plan view of a portion of level 160-1, including the landing areas 161-1a, 161-1b within the footprint of the interconnect structure 190. The footprint of the interconnect structure 190 can be close to the width of the via size for the conductors, and have a length that can be much longer than the width. As shown in FIG. 2A, landing area 161-1a has a width 200 in the transverse direction and a length 201 in the longitudinal direction. Landing area 161-1b has a width 202 in the transverse direction and a length 203 in the longitudinal direction. In the embodiment of FIG. 2A, the landing areas 161-1a, 161-1b each have a rectangular cross-section. In embodiments, the landing areas 161-1a, 161-1b may each have a cross-section that is circular, elliptical, square, rectangular, or somewhat irregularly shaped.

Because level 160-1 is the lowest level, the conductors 180 need not pass through the level 160-1 to underlying levels. Thus, in this example, level 160-1 does not have openings within the interconnect structure 190.

Referring back to FIG. 1, level 160-2 overlies level 160-1. Level 160-2 includes an opening 250 overlying the landing area 161-1a on level 160-1. The opening 250 has a distal longitudinal sidewall 251a and a proximal longitudinal sidewall 251b defining the length 252 of the opening 250. The length 252 of the opening 250 is at least as large as the length 201 of the underlying landing area 161-1a, so that the conductors 180 for the landing area 161-1a can pass through the level 160-2.

The level 160-2 also includes opening 255 overlying the landing area 161-1b. The opening 255 has distal and proximal longitudinal sidewalls 256a, 256b defining the length 257 of the opening 255. The length 257 of the opening 255 is at least as large as the length 203 of the underlying landing area 161-1b, so that the conductors 180 for the landing area 161-1b can pass through the level 160-2.

The level 160-2 also includes first and second landing areas 161-2a, 161-2b adjacent the openings 250, 255 respectively. The first and second landing areas 161-2a, 161-2b are the portions of level 160-2 used for contact with the conductors 180.

FIG. 2B is a plan view of a portion of level 160-2, including the first and second landing areas 161-2a, 161-2b and the openings 250, 255 within the interconnect structure 190.

As shown in FIG. 2B, opening 250 has longitudinal sidewalls 251a, 251b defining the length 252, and has transverse sidewalls 253a, 253b defining the width 254 of the opening 250. The width 254 is at least as large as the width 200 of the underlying landing area 161-1a, so that the conductors 180 can pass through the opening 250.

Opening 255 has longitudinal sidewalls 256a, 256b defining the length 257, and has transverse sidewalls 258a, 258b defining the width 259. The width 259 is at least as large as the width 202 of the underlying landing area 161-1b, so that the conductors 180 can pass through the opening 255.

In the plan view of FIG. 2B the openings 250, 255 each have a rectangular cross-section. In embodiments, the openings 250, 255 may each have a cross-section that is circular, elliptical, square, rectangular, or somewhat irregularly shaped, depending on the shape of the mask used to form them.

As shown in FIG. 2B, landing area 161-2a is adjacent the opening 250 and has a width 204 in the transverse direction and a length 205 in the longitudinal direction. Landing area 161-2b is adjacent the opening 255 and has a width 206 in the transverse direction and a length 207 in the longitudinal direction.

Referring back to FIG. 1, level 160-3 overlies level 160-2. Level 160-3 includes an opening 260 overlying landing area 161-1a on level 160-1 and landing area 161-2a on level 160-2. The opening 260 has distal and proximal longitudinal sidewalls 261a, 261b defining the length 262 of the opening 260. The length 262 of the opening 260 is at least as large as the sum of the lengths 201 and 205 of the underlying landing areas 161-1a and 161-2a, so that the conductors 180 for the landing areas 161-1a and 161-2a can pass through the level 160-3.

As can be seen in FIG. 1, the distal longitudinal sidewall 261a of opening 260 is vertically aligned with the distal longitudinal sidewall 251a of the underlying opening 250. In the manufacturing embodiment described in more detail below, the openings can be formed using the opening in a single etch mask and one additional mask formed over the opening in the single etch mask, as well as processes for etching the addition mask without a critical alignment step, resulting in the formation of openings having distal longitudinal sidewalls (261a, 251a, . . . ) along the perimeter of the single etch mask that are vertically aligned.

The level 160-3 also includes opening 265 overlying the landing area 161-1b on level 160-1 and landing area 161-2b on level 160-2. The opening 265 has outside and inside longitudinal sidewalls 266a, 266b defining the length 267 of the opening 265. The outside longitudinal sidewall 266a of opening 265 is vertically aligned with the outside longitudinal sidewall 256a of the underlying opening 255.

The length 267 of the opening 265 is at least as large as sum of the lengths 203 and 207 of the underlying landing areas 161-1b and 161-2b, so that the conductors 180 for the landing areas 161-1b and 161-2b can pass through the level 160-3.

The level 160-3 also includes first and second landing areas 161-3a, 161-3b adjacent the openings 260, 265 respectively. The first and second landing areas 161-3a, 161-3b are the portions of level 160-3 used for contact with the conductors 180.

FIG. 2C is a plan view of a portion of level 160-3, including the first and second landing areas 161-3a, 161-3b and the openings 260, 265 within the interconnect structure 190.

As shown in FIG. 2C, opening 260 has outside and inside longitudinal sidewalls 261a, 261b defining the length 262, and has transverse sidewalls 263a, 263b defining the width 264a, 264b of the opening 260. The width 264a is at least as large as the width 200 of the underlying landing area 161-1a, and width 264b is at least as large as the width 204 of the underlying landing area 161-2a, so that the conductors 180 can pass through the opening 260.

In the illustrated embodiments, widths 264a and 264b are substantially the same. Alternatively, the widths 264a and 264b can be different, in order to accommodate landing areas having different widths.

Opening 265 has longitudinal sidewalls 266a, 266b defining the length 267, and has transverse sidewalls 268a, 268b defining the width 269a, 269b. The width 269a is at least as large as the width 202 of the underlying landing area 161-1b, and the width 269b is at least as large as the width 206 of the underling landing area 161-2b, so that the conductors 180 can pass through the opening 265.

As shown in FIG. 2C, landing area 161-3a is adjacent the opening 260 and has a width 214 in the transverse direction and a length 215 in the longitudinal direction. Landing area 161-3b is adjacent the opening 265 has a width 216 in the transverse direction and a length 217 in the longitudinal direction.

Referring back to FIG. 1, level 160-4 overlies level 160-3. Level 160-4 includes an opening 270 overlying the landing area 161-1a on level 160-1, the landing area 161-2a on level 160-2, and the landing area 161-3a on level 160-3. The opening 270 has longitudinal sidewalls 271a, 271b defining the length 272 of the opening 270. The length 272 of the opening 270 is at least as large as the sum of the lengths 201, 205, and 215 of the underlying landing areas 161-1a, 161-2a, 161-3a so that the conductors 180 for the landing areas 161-1a, 161-2a, 161-3a can pass through the level 160-4. As shown in FIG. 1, the longitudinal sidewall 271a of opening 270 is vertically aligned with the longitudinal sidewall 261a of the underlying opening 260.

The level 160-4 also includes opening 275 overlying the landing area 161-1b on level 160-1, the landing area 161-2b on level 160-2, and the landing area 161-3b on level 160-3. The opening 275 has longitudinal sidewalls 276a, 276b defining the length 277 of the opening 275. The longitudinal sidewall 276a of opening 275 is vertically aligned with the longitudinal sidewall 266a of the underlying opening 265.

The length 277 of the opening 275 is at least as large as sum of the lengths 203, 207, and 217 of the underlying landing areas 161-1b, 161-2b and 161-3b, so that the conductors 180 for the landing areas 161-1b, 161-2b, and 161-3b can pass through the level 160-4.

The level 160-4 also includes a landing area 161-4 between the openings 270, 275. The landing area 161-4 is the portion of level 160-4 used for contact with the conductors 180. In FIG. 1, the level 160-4 has one landing area 161-4. Alternatively, the level 160-4 may include more than one landing area.

FIG. 2D is a plan view of a portion of level 160-4, including landing area 161-4 and the openings 270, 275 within the interconnect structure 190.

As shown in FIG. 2D, opening 270 has longitudinal sidewalls 271a, 271b defining the length 272, and has transverse sidewalls 273a, 273b defining the width 274a, 274b, 274c of the opening 270. The widths 274a, 274b, 274c are at least as large as the widths 200, 204, and 214 of the underlying landing areas 161-1a, 161-2a and 161-3a, so that the conductors 180 can pass through the opening 270.

Opening 275 has longitudinal sidewalls 276a, 276b defining the length 277, and has transverse sidewalls 278a, 278b defining the width 279a, 279b, 279c. The widths 279a, 279b, 279c are at least as large as the widths 202, 206, and 216 of the underlying landing areas 161-1b, 161-2b and 161-3b, so that the conductors 180 can pass through the opening 275.

As shown in FIG. 2D, landing area 161-4 is between the openings 270, 275 and has a width 224 in the transverse direction and a length 225 in the longitudinal direction.

Referring back to FIG. 1, the distal longitudinal sidewalls 271a, 261a, and 251a of openings 270, 260, and 250 are vertically aligned, so that the difference in the length of the openings 270, 260, and 250 is due to the horizontal offset of the sidewalls 271b, 261b, and 251b. As used herein, elements or features "vertically aligned" are substantially flush with an imaginary plane perpendicular to both the transverse and longitudinal directions. As used herein, the term "substantially flush" is intended to accommodate manufacturing tolerances in the formation of the openings using the opening in a single etch mask and multiple etch processes which may cause variations in the planarity of the sidewalls.

As shown in FIG. 1, the longitudinal sidewalls 276a, 266a, and 256a of openings 275, 265, and 255 also are vertically aligned.

Similarly, the transverse sidewalls of the openings in the levels are also vertically aligned. Referring to FIGS. 2A-2D, the transverse sidewalls 273a, 263a, and 253a of openings 270, 260, and 250 are vertically aligned. In addition, the transverse sidewalls 273b, 263b, and 253b are vertically aligned. For openings 275, 265, and 255 the longitudinal sidewalls 276a, 266a, and 256a are vertically aligned, and the transverse sidewalls 278b, 268b, and 258b are vertically aligned.

In the illustrated embodiment, the openings in the various levels 160-1 to 160-4 have substantially the same width in the transverse direction. Alternatively, the width of the openings can vary along the longitudinal direction, for example, in a step-like manner, in order to accommodate landing areas having different widths.

This technique for implementing the interconnect structure 190 as described herein significantly reduces the area or footprint needed for making contact to the plurality of levels 160-1 to 160-4, compared to prior art techniques. As a result, more space is available for implementing memory circuits in the various levels 160-1 to 160-4. This allows for higher memory density and a smaller cost per bit in the upper levels compared to prior art techniques.

In the cross-section of FIG. 1, the openings within the interconnect structure 190 result in the levels having a staircase-like pattern on both sides of the landing area 161-4 on level 160-4. That is, the two openings in each level are symmetrical about an axis perpendicular to both the longitudinal and transverse directions, and the two landing areas of each level are also symmetrical about that axis. As used herein, the term "symmetrical" is intended to accommodate manufacturing tolerances in the formation of the openings using the opening in a single etch mask and multiple etch processes which may cause variations in the dimensions of the openings.

In alternative embodiments, in which each level includes a single opening and a single landing area, the levels have a staircase-like pattern on only one side.

In the illustrated example, four levels 160-1 through 160-4 are shown. More generally, the small interconnect structure described herein can be implemented in levels 0 to N, where N is at least 2. Generally, level (i), for (i) equal to 1 through N, overlies level (i−1), and has an opening (i) adjacent the landing area (i) on level (i). The opening (i) extends over the landing area (i−1) on level (i−1), and for (i) greater than 1, over the adjacent opening (i−1) in level (i−1). The opening (i) has a distal longitudinal sidewall aligned with the distal longitudinal sidewall of opening (i−1) in level(i), and a proximal longitudinal sidewall defining a length of the opening(i). The length of the opening (i) is at least as large as the length of the landing area (i−1) plus the length of the opening (i−1), if any. For (i) greater than 1, the opening(i) has transverse sidewalls aligned with the transverse sidewalls of opening (i−1) in level (i−1) and defines a width of the opening (i) at least as large as the width of the landing area (i−1).

Other types of memory cells and configurations can be used in alternative embodiments. Examples of the other types of memory cells which may be used include dielectric charge trapping and floating gate memory cells. For example, in an alternative the levels of the device may be implemented as planar memory cell arrays separated by insulating material, with the access devices and access lines formed within the levels using thin film transistors or related technologies. In addition, the interconnect structure described herein can be implemented in other types of three-dimensional stacked integrated circuit devices, where having conductors extending to various levels in the device within a small footprint is useful.

Figure 3A:
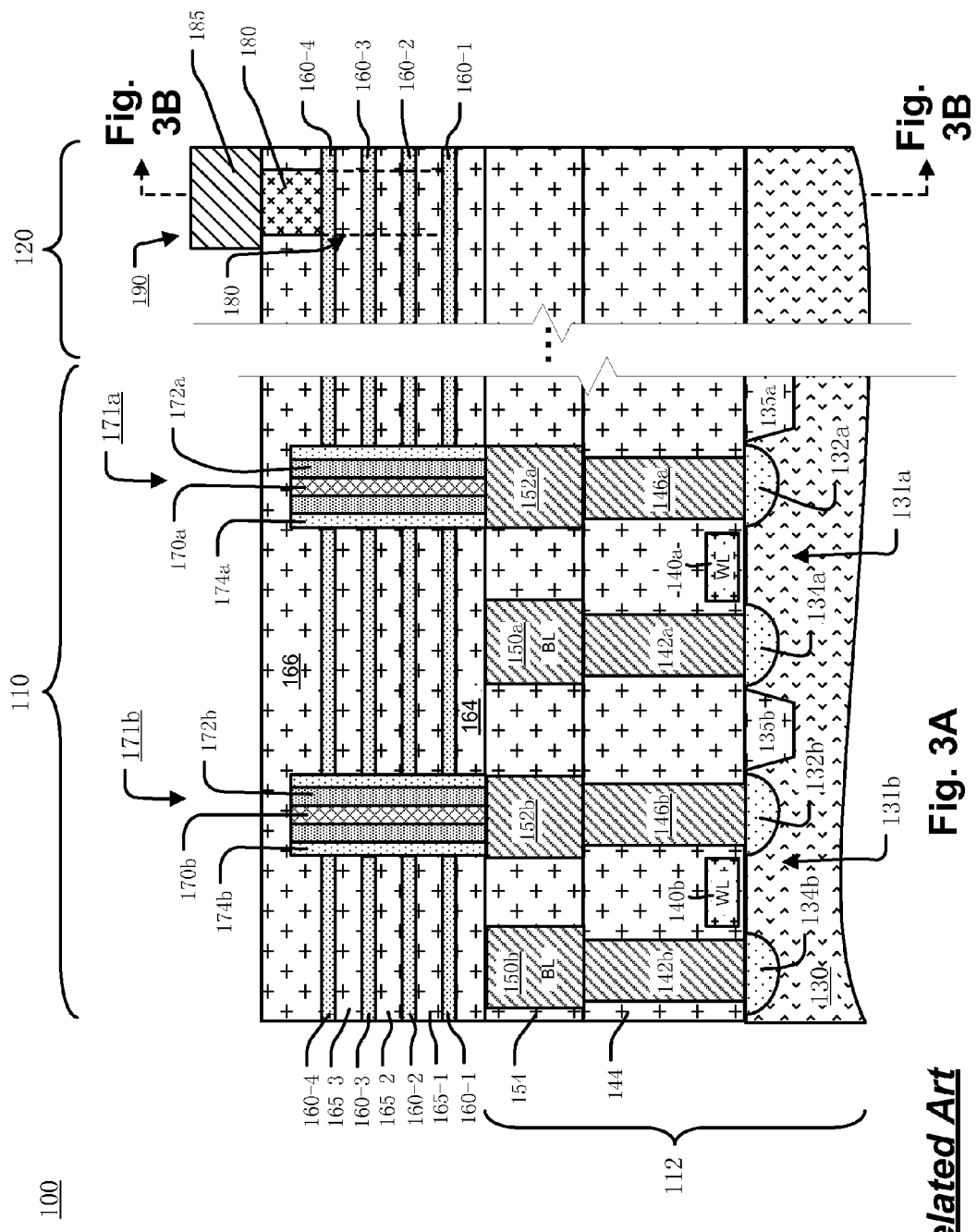
FIGS. 3A and 3B illustrate respective orthogonal views of a portion of a three-dimensional stacked integrated circuit device including a 3D interconnect structure with a small footprint.

FIG. 3A is a cross-section of a portion of a three-dimensional stacked integrated circuit device 100 including a memory array region 110 and a periphery region 120 with an interconnect structure 190 as described herein.

In FIG. 3A, the memory array region 110 is implemented as one-time programmable multi-level memory cells as described in U.S. patent application Ser. No. 12/430,290 by Lung, which is commonly owned by the assignee of the present application and incorporated by reference herein. It is described here as a representative integrated circuit structure in which the 3D interconnect structure described herein can be implemented.

The memory array region 110 includes a memory access layer 112 including horizontal field effect transistor access devices 131a, 131b having source regions 132a, 132b and drain regions 134a, 134b in a semiconductor substrate 130. The substrate 130 can comprise bulk silicon or a layer of silicon on an insulating layer or other structures known in the art for supporting integrated circuits. Trench isolation structures 135a, 135b isolate regions in the substrate 130. Word lines 140a, 140b act as gates for the access devices 131a, 131b. Contact plugs 142a, 142b extend through inter-layer dielectric 144 to couple the drain regions 134a, 134b to bit lines 150a, 150b.

Contact pads 152a, 152b are coupled to underlying contacts 146a, 146b, providing connection to the source regions 132a, 132b of the access transistors. The contact pads 152a, 152b and bit lines 150a, 150b are within an inter-layer dielectric 154.

In the illustrated example, the levels consist of respective planar conductive layers of material such as doped polysilicon. Alternatively, the levels need not be planar stacked material layers, and instead the layers of material can vary in the vertical dimension.

Insulating layers 165-1 to 165-3 separate the levels 160-1 to 160-4 from one another. An insulating layer 166 overlies the levels 160-1 to 160-4 and insulating layers 165-1 to 165-3.

A plurality of electrode pillars 171a, 171b are arranged on top of the memory cell access layer 112 and extend through the levels. In this drawing, a first electrode pillar 171a includes a central conductive core 170a made, for example, of tungsten or other suitable electrode material, surrounded by a polysilicon sheath 172a. A layer 174a of anti-fuse material, or other programmable memory material, is formed between the polysilicon sheath 172a and the plurality of levels 160-1 through 160-4. The levels 160-1 through 160-4 comprise a relatively highly doped, n-type polysilicon in this example, while the polysilicon sheath 172a comprises a relatively lightly doped, p-type polysilicon. Preferably, the thickness of the polysilicon sheath 172a is greater than the depth of the depletion region formed by the p-n junction. The depth of the depletion region is determined in part by the relative doping concentrations of the n-type and p-type polysilicon used to form it. The levels 160-1 through 160-4 and the sheath 172a can be implemented using amorphous silicon as well. Also, other semiconductor materials could be utilized.

The first electrode pillar 171a is coupled to the pad 152a. A second electrode pillar 171b including conductive core 170b, polysilicon sheath 172b, and anti-fuse material layer 174b is coupled to the pad 152b.

Interface regions between the plurality of levels 160-1 through 160-4 and the pillars 171a, 171b include memory elements comprising a programmable element in series with a rectifier, as explained in more detail below.

In the native state, the layer 174a of anti-fuse material of pillar 171a, which can be a silicon dioxide, silicon oxynitride, or other silicon oxide, has a high resistance.

Other anti-fuse materials may be used, such as silicon nitride. After programming by applying appropriate voltages to the word lines 140, bit lines 150, and the plurality of levels 160-1 to 160-4, the layer 174a of anti-fuse material breaks down and an active area within the anti-fuse material adjacent a corresponding level assumes a low resistance state.

As shown in FIG. 3A, the plurality of conductive layers of levels 160-1 to 160-4 extend into the periphery region 120 where supporting circuitry and conductors 180 are made to the plurality levels 160-1 to 160-4. A wide variety of devices are implemented in the periphery 120 to support decoding logic and other circuits on the integrated circuit 100.

The conductors 180 are arranged within the interconnect structure 190 to contact landing areas on the various levels 160-1 to 160-4. As discussed in more detail below, the conductors 180 for each particular level 160-1 to 160-4 extend through openings in the overlying levels to a wiring layer including conductive interconnect lines 185. The conductive interconnect lines 185 provide for interconnection between the levels 160-1 to 160-4 and decoding circuitry in the periphery 120.

As represented by the dashed line in FIG. 3A, the conductors 180 contacting the different levels 160-1 to 160-4 are arranged in the longitudinal direction extending into and out of the cross-section illustrated in FIG. 3A.

Figure 3B:
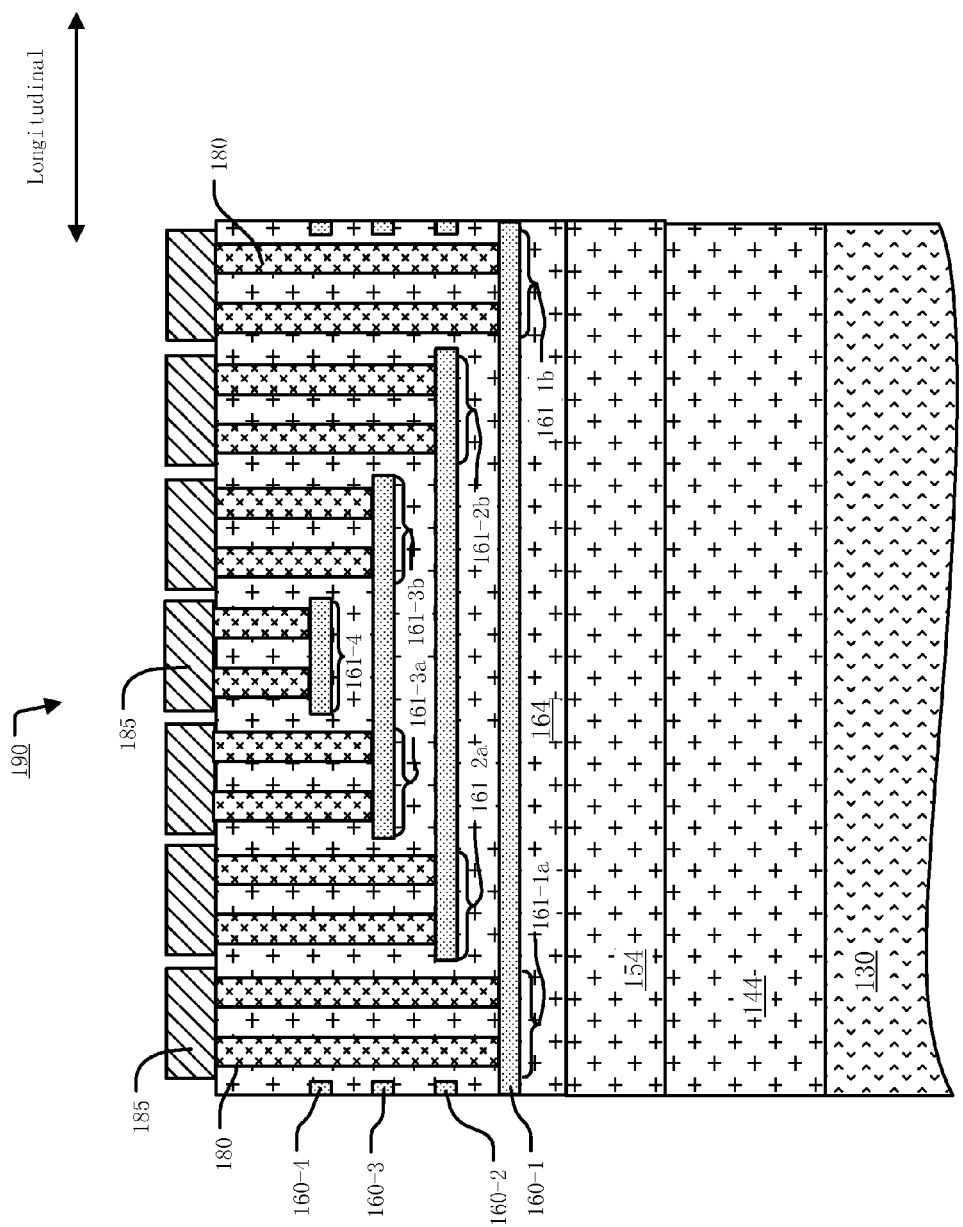

FIG. 3B is a cross-sectional view in the longitudinal direction taken along line FIG. 3B- FIG. 3B through the interconnect structure 190 of FIG. 3A, showing a view of the interconnect structure 190 like that shown in FIG. 1. As can be seen in FIG. 3B, the conductors 180 for each particular level extend through openings in the overlying levels to contact the landing areas.

In the illustrated example, four levels 160-1 through 160-4 are shown. More generally, the small interconnect structure described herein can be implemented in levels 0 to N, where N is at least 2.

Other types of memory cells and configurations can be used in alternative embodiments. For example, in an alternative the levels of the device may be implemented as planar memory cell arrays separated by insulating material, with the access devices and access lines formed within the levels using thin film transistors or related technologies. In addition, the interconnect structure described herein can be implemented in other types of three-dimensional stacked integrated circuit devices, where having conductors extending to various levels in the device within a small footprint is useful.

In FIGS. 3A-3B, a single interconnect structure 190 is shown. A plurality of interconnect structures can be arranged at various locations in the device, such as surrounding the memory array region 110, so as to provide more even power distribution. FIG. 4 illustrates a top view layout of an embodiment of the device 100 which includes a two series of interconnect structures, including series in the regions 190-1 and 190-2 in the periphery 120 on respective sides of an array. FIG. 5 illustrates a top view layout of an embodiment which includes four series of interconnect structures, including series 190-1, 190-2, 190-3, and 190-4, in the periphery 120 on all four sides of an array. For an example array size including 1000 columns and 1000 rows of cells, and having 10 levels, with a feature size F defining the word line width and the bit line width, and in which the size of the landing areas on the levels is about F, then one can see that the length of the area occupied by one interconnect structure is about 2F times the number of levels or 20F, while the pitch per word line is about 2F or more making the width of the array about 2000 F. Thus, following this example, about 100 interconnect structures could be formed in a series such as series 190-3 along the array width, and a similar number could be formed in a series such as series 190-1 along the array length.

In yet other alternative embodiments, one or more interconnect structures can be implemented within the memory array region 110 in addition to, or as a replacement of, having an interconnect structure in the periphery 120. In addition, the interconnect structures can extend diagonally or in any other direction, rather than being parallel to an edge of the memory array region 110.

FIG. 6 is a schematic illustration of a portion of the memory device including an interconnect structure as described herein. First electrode pillar 171a is coupled to the access transistor 131a which is selected using the bit line 150a and word line 140a. A plurality of memory elements 544-1 through 544-4 are connected to the pillar 171a. Each of the memory elements includes a programmable element 548 in series with a rectifier 549. This series arrangement represents the structure shown in FIGS. 3A-3B, even though the layer of anti-fuse material is placed at the p-n junction. The programmable element 548 is represented by a symbol often used to indicate anti-fuses. However, it will be understood that other types of programmable resistance materials and structures can be utilized.

Also, the rectifier 549 implemented by the p-n junction between the conductive plane and the polysilicon in the electrode pillar can be replaced by other rectifiers. For example, a rectifier based on a solid electrolyte like germanium silicide, or other suitable material, could be used to provide a rectifier. See U.S. Pat. No. 7,382,647 for other representative solid electrolyte materials.

Each of the memory elements 544-1 through 544-4 is coupled to corresponding conductive levels 160-1 through 160-4. The levels 160-1 to 160-4 are coupled via conductors 180 and interconnect lines 185 to a plane decoder 546. The plane decoder 546 is responsive to addresses to apply a voltage, such as ground 547, to a selected level so that the rectifier in the memory element is forward biased and conducting, and to apply a voltage to or float unselected levels so that the rectifier in the memory element is reversed biased or nonconducting.

FIG. 7 is a simplified block diagram of an integrated circuit device 300 including a 3D memory array 360 having an interconnect structure as described herein. A row decoder 361 is coupled to a plurality of word lines 140 arranged along rows in the memory array 360. A column decoder 363 is coupled to a plurality of bit lines 150 arranged along columns in the memory array 360 for reading and programming data from the memory cells in the array 360. The plane decoder 546 is coupled to a plurality of levels 160-1 to 160-4 in the memory array 360 via conductors 180 and interconnect lines 185. Addresses are supplied on bus 365 to column decoder 363, row decoder 361, and plane decoder 546. Sense amplifiers and data-in structures in block 366 are coupled to the column decoder 363, in this example, via data bus 367. Data is supplied via the data-in line 371 from input/output ports on the integrated circuit 300, to the data-in structures in block 366. In the illustrated embodiment, other circuitry 374 is included on the integrated circuit 300, such as a general purpose processor or special purpose application circuitry, or a combination of modules providing system-on-a-chip functionality. Data is supplied via data-out line 372 from the sense amplifiers in block 366 to input/output ports on the integrated circuit 300, or to other data destinations internal or external to the integrated circuit 300.

A controller implemented, in this example, using bias arrangement state machine 369 controls the application of bias arrangement supply voltages generated or provided through the voltage supply or supplies in block 368, such as read and program voltages. The controller can be implemented using special-purpose logic circuitry as known in the art. In alternative embodiments, the controller comprises a general-purpose processor, which may be implemented on the same integrated circuit, which executes a computer program to control the operations of the device. In yet other embodiments, a combination of special-purpose logic circuitry and a general-purpose processor may be utilized for implementation of the controller.

FIGS. 8A-8C to 15 illustrate steps in an embodiment of a fabrication sequence for manufacturing an interconnect structure having a very small footprint as described herein.

Figure 8A:
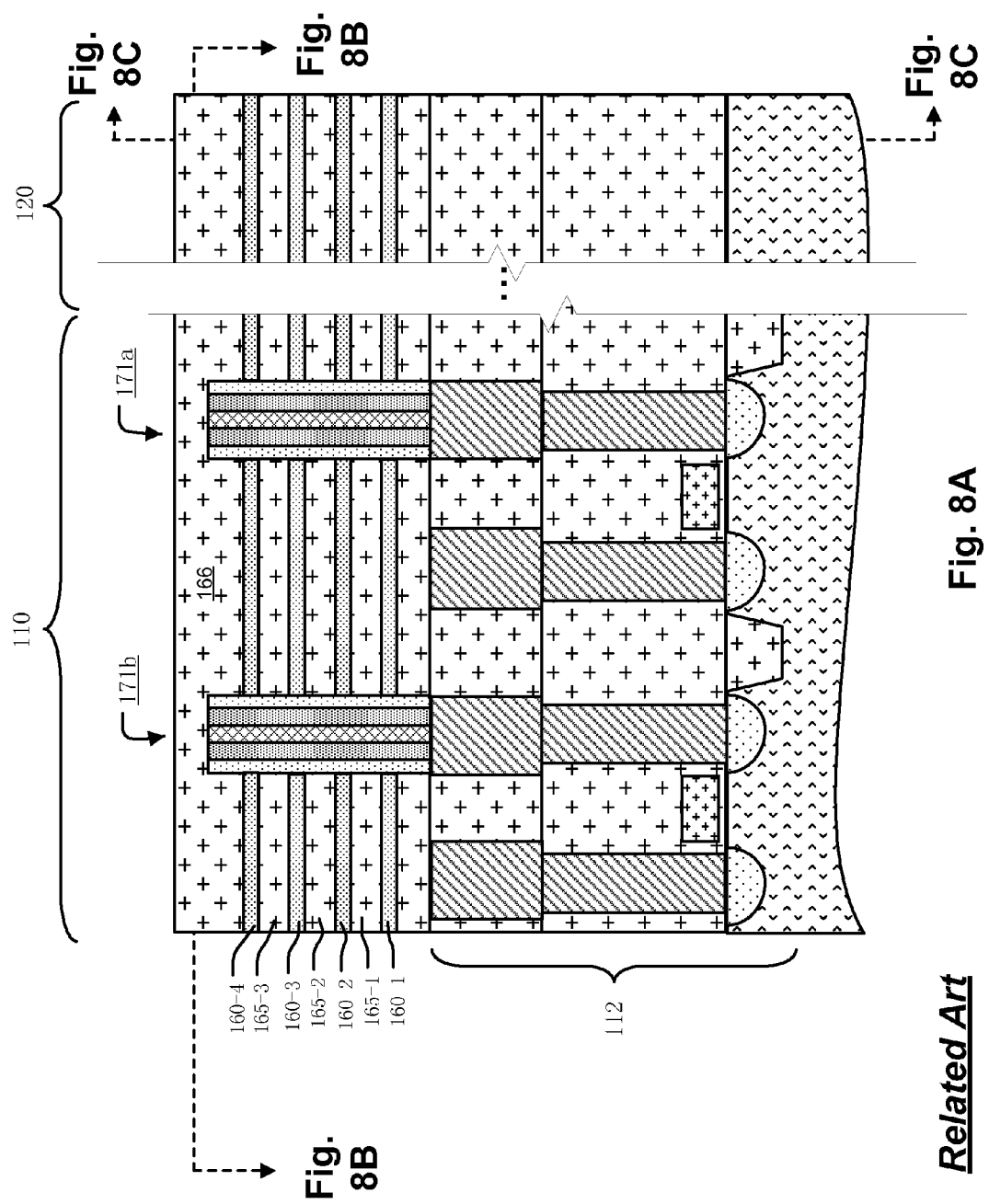
Figure 8C:
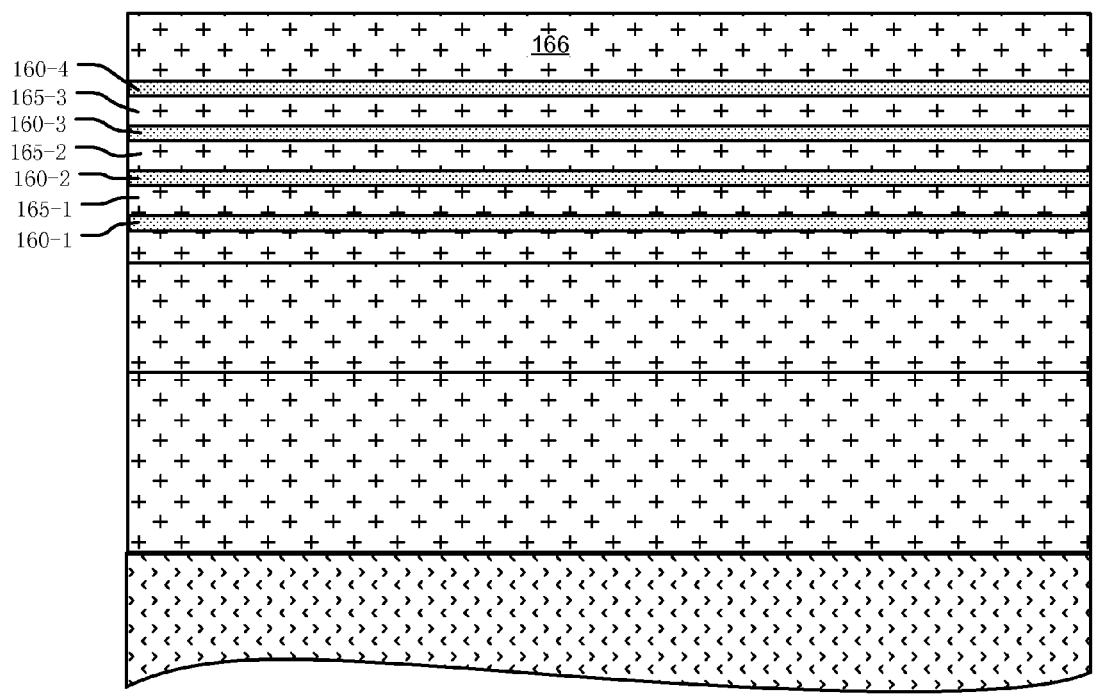

FIGS. 8A and 8C illustrate cross-sectional views, and FIG. 8B illustrates a top view, of a first step of the fabrication sequence. For the purposes of this application, the first step involves forming a plurality of levels 160-1 to 160-4 overlying the provided memory cell access layer 112. In the illustrated embodiment, the structure illustrated in FIGS. 8A-8C is formed using processes described in commonly owned U.S. patent application Ser. No. 12/430,290 by Lung, which was incorporated by reference above.

In alternative embodiments, the levels can be formed by standard processes as known in the art and may include access devices such as transistors and diodes, word lines, bit lines and source lines, conductive plugs, and doped regions within a substrate, depending upon the device in which the interconnect structure described herein is to be implemented.

As noted above, other types of memory cells and configurations for the memory array region 110 can also be used in alternative embodiments.

Next, a first mask 800 having an opening 810 is formed on the structure illustrated in FIGS. 8A-8C, resulting in the structure illustrated in the top and cross-sectional views of FIGS. 9A and 9B respectively. The first mask 800 can be formed by depositing the layer for the first mask 800, and patterning the layer using lithographic techniques to form the opening 810. The first mask 800 may comprise, for example, a hard mask material such as silicon nitride, silicon oxide, or silicon oxynitride.

The opening 810 in the first mask 800 surrounds the perimeter of the combination of landing areas on the levels 160-1 to 160-4. Thus, the width 192 of the opening 810 is at least as large as the widths of the landing areas on the levels 160-1 to 160-4, so that the subsequently formed conductors 180 can pass through the openings in the levels. The length 194 of the opening 810 is at least as large as the sum of the lengths of the landing areas on the levels 160-1 to 160-4, so that the subsequently formed conductors 180 can pass through the openings in the levels.

Figure 10A:
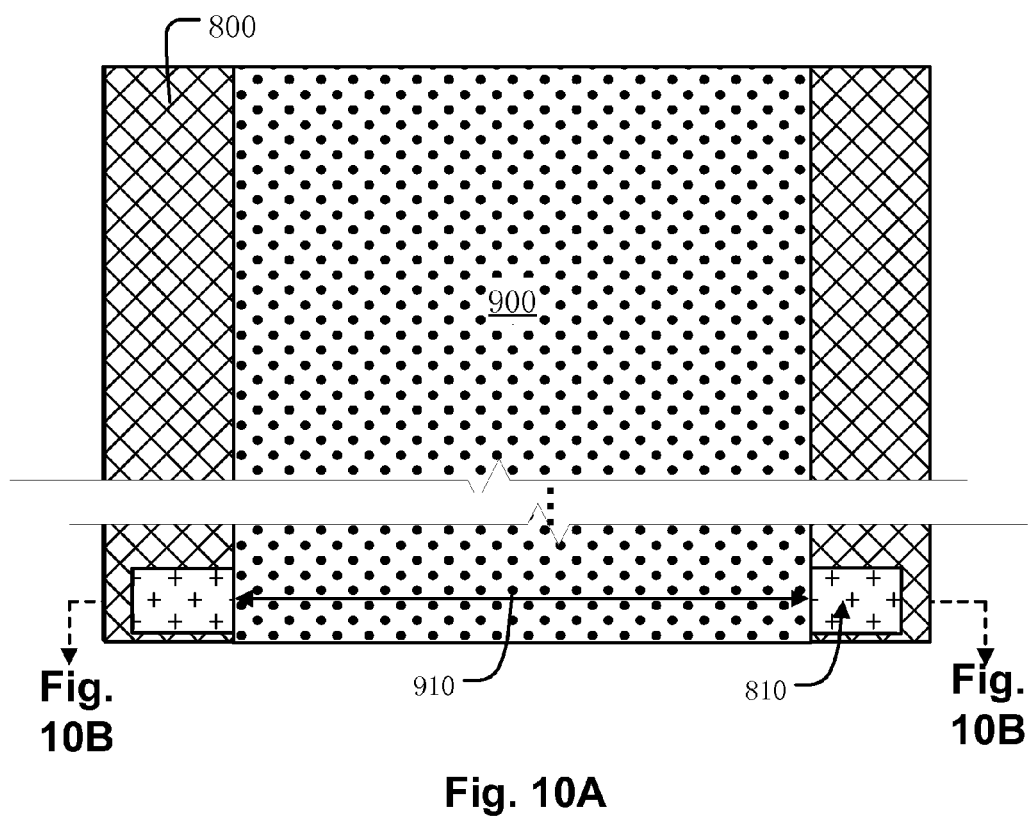

Next, a second etch mask 900 is formed on the structure illustrated in FIGS. 9A-9B, including within the opening 810, resulting in the structure illustrated in the top and cross-sectional views of FIGS. 10A and 10B respectively. As shown in the Figs., the second etch mask 900 has a length 910 less than the length 194 of the opening 810, and has a width at least as large as the width 192 of the opening 810.

In the illustrated embodiment, the second etch mask 900 comprises a material that can be selectively etched relative to the material of the first mask 800, so that the length of the second mask 900 within the opening 810 can be selectively reduced in subsequent process steps described below. In other words, the material of the second mask 900 has an etching rate greater than an etching rate of the material of the first mask 800 for the process used to reduce the length of the second mask 900. For example, in embodiments in which the first mask 800 comprises a hard mask material, the second mask can comprise photoresist.

Figure 11A:
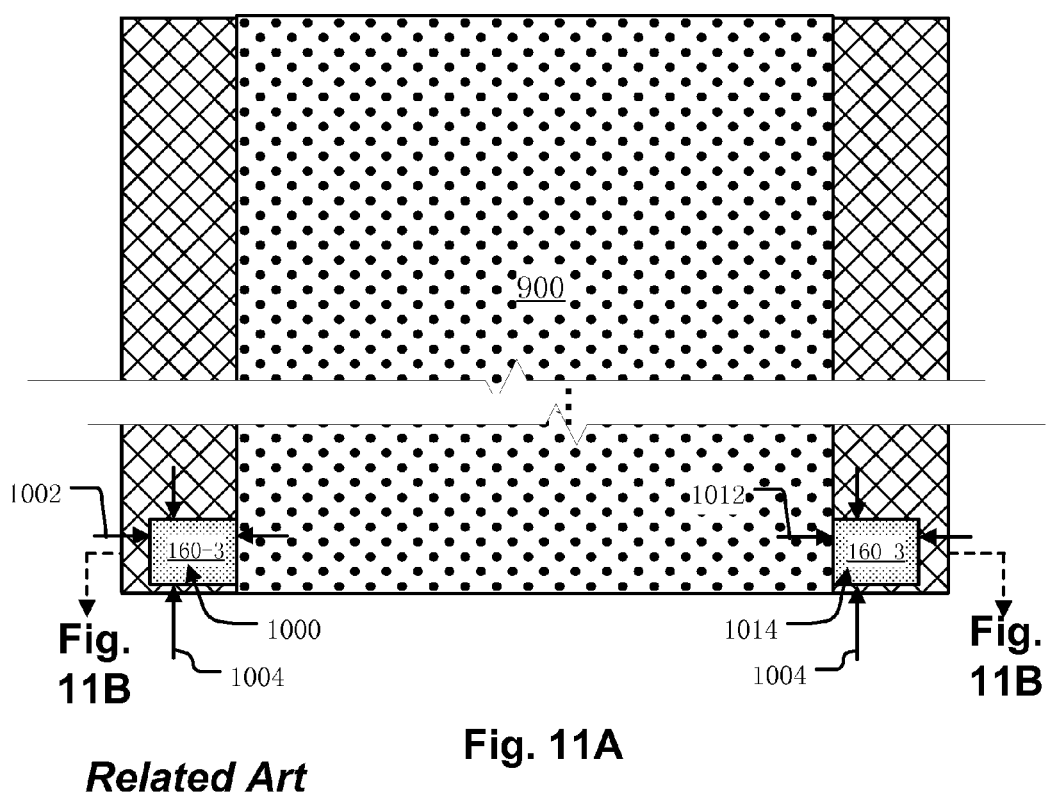

Next, an etching process is performed on the structure illustrated in FIGS. 10A-10B using the first and second masks 800, 900 as etch masks, resulting in the structure illustrated in the top and cross-sectional views of FIGS. 11A and 11B respectively. The etching process can be carried out using a single etch chemistry using, for example, timing mode etching. Alternatively, the etching process can be carried out using different etch chemistries to individually etch through insulating layer 166, level 160-4, insulating material 165-3, and level 160-3.

The etching forms an opening 1000 through the level 160-4 to expose a portion of level 160-3. The opening 1000 overlies the landing area 161-1a on level 160-1. The opening 1000 has a length 1002 at least as large as the length of the landing area 161-1a, and has a width 1004 at least as large as the width of the landing area 161-1a.

The etching also forms opening 1010 through the level 160-4 to expose a portion of level 160-3. The opening 1010 overlies the landing area 161-1b on level 160-1. The opening 1010 has a length 1012 at least as large as the length of the landing area 161-1b, and has a width 1004 at least as large as the width of the landing area 161-1b Next, the length 910 of the mask 900 is reduced to form reduced length mask 1100 with length 1110, resulting in the structure illustrated in the top and cross-sectional views of FIGS. 12A and 12B respectively. In the illustrated embodiment, the mask 900 comprises photoresist, and can be trimmed, for example, using reactive ion etching with CL2 or HBr based chemistries.

Next, an etching process is performed on the structure illustrated in FIGS. 12A-12B using the first mask 800 and the reduced length mask 1100 as etch masks, resulting in the structure illustrated in the top and cross-sectional views of FIGS. 13A and 13B.

The etching process extends the openings 1000, 1010 through level 160-3 to expose underlying portions of the level 160-2.

The etching also forms openings 1200, 1210 through the portions of the level 160-4 no longer covered by the mask 1100 due to the reduction in the length of mask 1100, thereby exposing portions of level 160-3. The opening 1200 is formed adjacent opening 1000, and overlies the landing area 161-2a on level 160-2. The opening 1200 has a length 1202 at least as large as the length of the landing area 161-2a, and has a width 1204 at least as large as the width of the landing area 161-2a.

The opening 1210 is formed adjacent opening 1010, and overlies the landing area 161-2b on level 160-2. The opening 1210 has a length 1212 at least as large as the length of the landing area 161-2b, and has a width 1204 at least as large as the width of the landing area 161-2b.

Next, the length 1110 of the mask 1100 is reduced to form reduced length mask 1300 with length 1305. An etching process performed using the first mask 800 and the mask 1300 as etch masks, resulting in the structure illustrated in the top and cross-sectional views of FIGS. 14A and 14B.

The etching process extends the openings 1000, 1010 through level 160-2 to expose the landing areas 161-1a, 161-1b on level 160-1. The etching process also extends the openings 1200, 1210 through level 160-3 to expose the landing areas 161-2a, 161-2b on level 160-2.

The etching also forms openings 1310, 1320 through the portions of the level 160-4 no longer covered due to the reduction in the length of mask 1300, thereby exposing the landing areas 161-3a, 161-3b on level 160-3.

The opening 1310 is formed adjacent opening 1200. The opening 1310 has a length 1312 at least as large as the length of the landing area 161-3a, and has a width 1314 at least as large as the width of the landing area 161-3a.

The opening 1320 is formed adjacent opening 1210. The opening 1320 has a length 1322 at least as large as the length of the landing area 161-3b, and has a width 1324 at least as large as the width of the landing area 161-3b.

Next, insulating fill material 1400 is deposited on the structure illustrated in FIGS. 14A-14B and a planarization process such as Chemical Mechanical Polishing (CMP) is performed to remove the masks 800, 1300, resulting in the structure illustrated in the cross-sectional view of FIG. 15.

Next, a lithographic pattern is formed to define vias to the landing areas for the conductors 180. Reactive ion etching can be applied to form deep, high aspect ratio vias through the insulating fill material 1400 to provide vias for the conductors 180. After opening the vias, the vias are filled with tungsten or other conductive material to form the conductors 180. Metallization processes are then applied to form interconnect lines 185 to provide interconnection between the conductors 180 and plane decoding circuitry on the device. Finally, back end of line BEOL processes are applied to complete the integrated circuit, resulting in the structure illustrated in FIGS. 3A-3B.

The openings in the various levels used for passing conductors to the landing areas on underlying levels are formed by patterning the levels using the opening 810 in the single etch mask 800, as well as processes for etching the additional mask without a critical alignment step. As a result the openings in the various levels having vertically aligned sidewalls are formed in a self-aligned manner.

In the illustrated examples described above, the opening 810 in the mask 800 has a rectangular cross-section in plan view. As a result, the openings in the various levels have substantially the same width along the transverse direction. Alternatively, the opening in the mask 800 can have a cross-section that is circular, elliptical, square, rectangular, or somewhat irregularly shaped, depending on the shape of the landings areas of the various levels.

For example, the width of the opening in the mask 800 can vary along the longitudinal direction, in order to accommodate landing areas having different widths. FIG. 16 illustrates a plan view of an opening 1510 in the mask 800 having a width varying in the longitudinal direction in a step-like manner, which results in the widths of the openings in the levels varying accordingly.

The present invention will now be described primarily with reference to FIGS. 17-34A.

The following description will typically be with reference to specific structural embodiments and methods. It is to be understood that there is no intention to limit the invention to the specifically disclosed embodiments and methods but that the invention may be practiced using other features, elements, methods and embodiments. Preferred embodiments are described to illustrate the present invention, not to limit its scope, which is defined by the claims. Those of ordinary skill in the art will recognize a variety of equivalent variations on the description that follows. Like elements in various embodiments are commonly referred to with like reference numerals.

FIGS. 17-34A illustrate the structure and method of making another example of a three-dimensional stacked IC device with like reference numerals referring to like structure. FIGS. 17 and 17A are simplified side cross-sectional and plan views of an interconnect region 17 of this example of a three-dimensional stacked IC device. In this example, interconnect region 17 includes four interconnect levels 18, labeled 18.1-18.4, four electrical conductors 54, labeled 54.1-54.4, and an electrical ground conductor 55. Electrical conductors 54 have first parts 57 passing through contact levels 18 and second parts 59 passing through interlayer dielectric 52 and charge trapping layer 27 to electrically connect to one of the interconnect contact regions 14, labeled 14.1-14.4, of conductive layers 34, labeled 34.1-34.4, of contact levels 18. First parts 57 are surrounded by a dielectric sidewall spacer 61 so to electrically isolate electrical conductors 54 from the conductive layers 34 with which the electrical conductors are not to make electrical contact. Also shown is an electrical ground conductor 55 electrically connected to each conductive layer 34 of each contact level 18.

FIGS. 18 and 18A show the initial step in the manufacture of interconnect region 17. Photoresist 88 is used in the etching of contact openings 33, labeled 33.1-33.4, and ground contact openings 35, ground contact openings 35 shown in FIG. 18A, through upper layer 24 to expose the upper conductive layer 34.1 of the first contact layer 18.1. Following the etching of contact openings 33, photoresist 88 is stripped and a first photoresist mask 89 is formed on interconnect region 17 as shown in FIGS. 19 and 19A. First mask 89 exposes every other contact opening 33, that is contact openings 33.2 and 33.4 in this example. As seen in FIG. 19A, mask 89 also covers ground contact opening 35. As can be seen by comparing FIGS. 17 and 18, the location of contact openings 33 determine the locations of electrical conductors 54 and ground contact openings 35 determine the locations of ground electric conductors 55. In this example, the electrical conductors 54, and thus the interconnect contact regions 14, have a constant pitch.

Figure 20A:
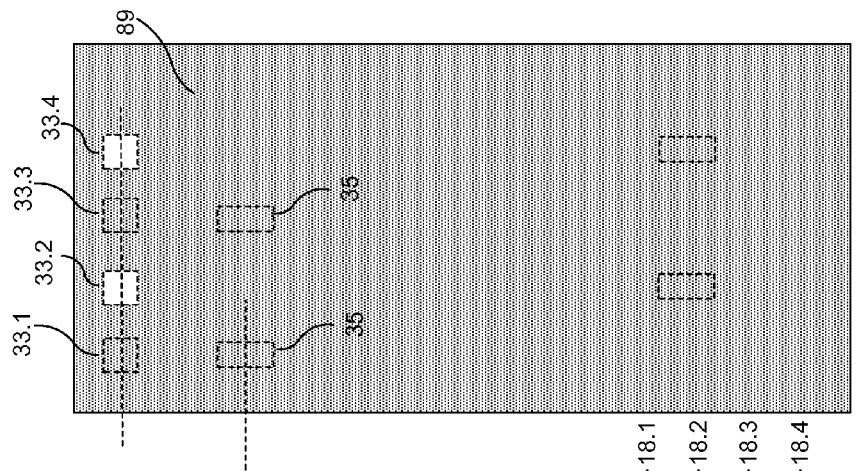
Figure 20:
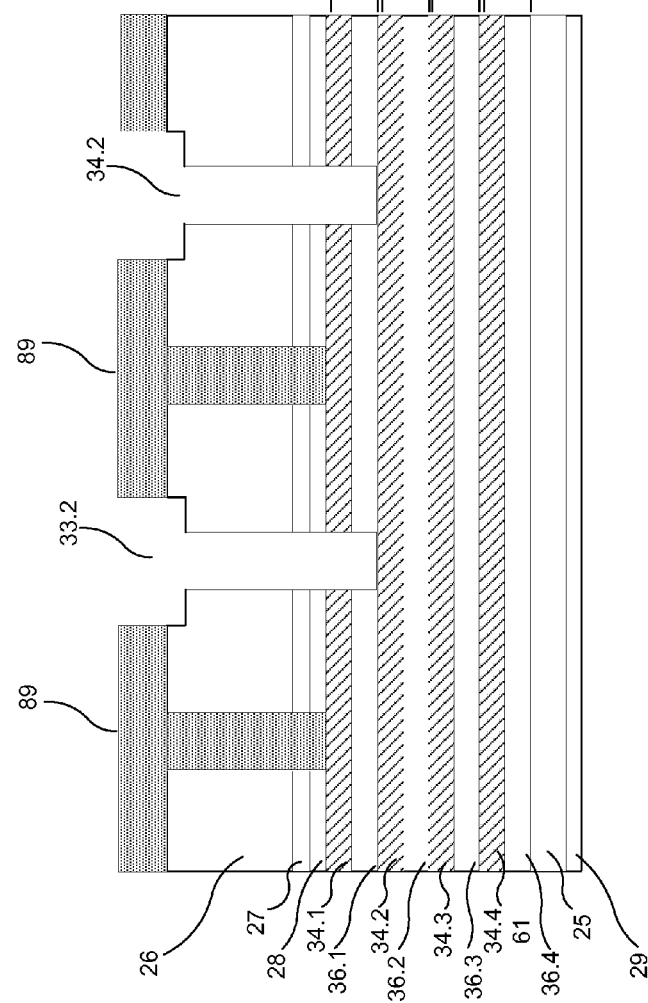

FIGS. 20 and 20A show the result of etching through a single contact level 18.1 beneath the exposed contact openings 33.2 and 33.4. First mask 89 is then stripped followed by the formation of second photoresist mask 90 shown in FIGS. 21 and 21A. Second mask 90 is used to expose contact openings 33.3 and 33.4 while covering contact openings 33.1 and 33.2 and ground contact openings 35. FIG. 21 shows the result of the removal of the first mask 89 and the formation of the second mask 90 on the structure of FIG. 20 so that the first and second contact openings 33.1 and 33.2, counting from the left, are covered by the second mask while the third and fourth contact openings 33.3 and 33.4 are open.

FIGS. 22 and 22A show the result of etching down through two contact levels 18 of the third and fourth contact openings 33.3 and 33.4. That is, contact levels 18.1 and 18.2 are etched through at contact opening 33.3 while contact levels 18.2 and 18.3 are etched through contact opening 33.4. FIGS. 23 and 23A show the structure of FIG. 22 after removal of the second mask 90 of FIG. 22. It is seen that contact openings 33.1-33.4 extend down to the conductive layers 34.1-34.4 of contact levels 18.1-18.4.

FIGS. 24 and 24A show the structure of FIG. 23 after the formation of sidewall spacers 61 on the sidewalls of the sidewall openings 33.1-33.4. Sidewall spacers 61 electrically insulate contact openings 33.2, 33.3 and 33.4 from the conductive layers 34 of the contact levels 18 through which the contact openings pass.

FIGS. 25 and 25A show the structure of FIG. 24 with the addition of a cross-sectional view through a ground contact opening 35 in FIG. 25. All of the contact openings 33 are covered by photoresist 92 while the ground contact openings 35 are left exposed. FIGS. 26 and 26A illustrate the structure of FIG. 25 after etching through three contact levels 18 at the ground contact openings 35 to expose conductive layers 34.1-34.4 to the interior of ground contact openings 35. FIGS. 27 and 27A illustrate the structure of FIG. 26 after removing photoresist 92.

Figure 28A:
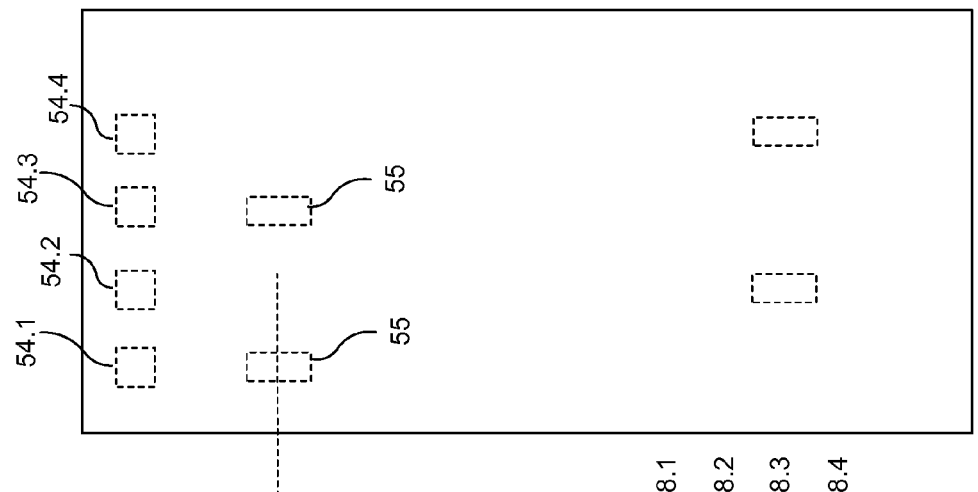
Figure 28:
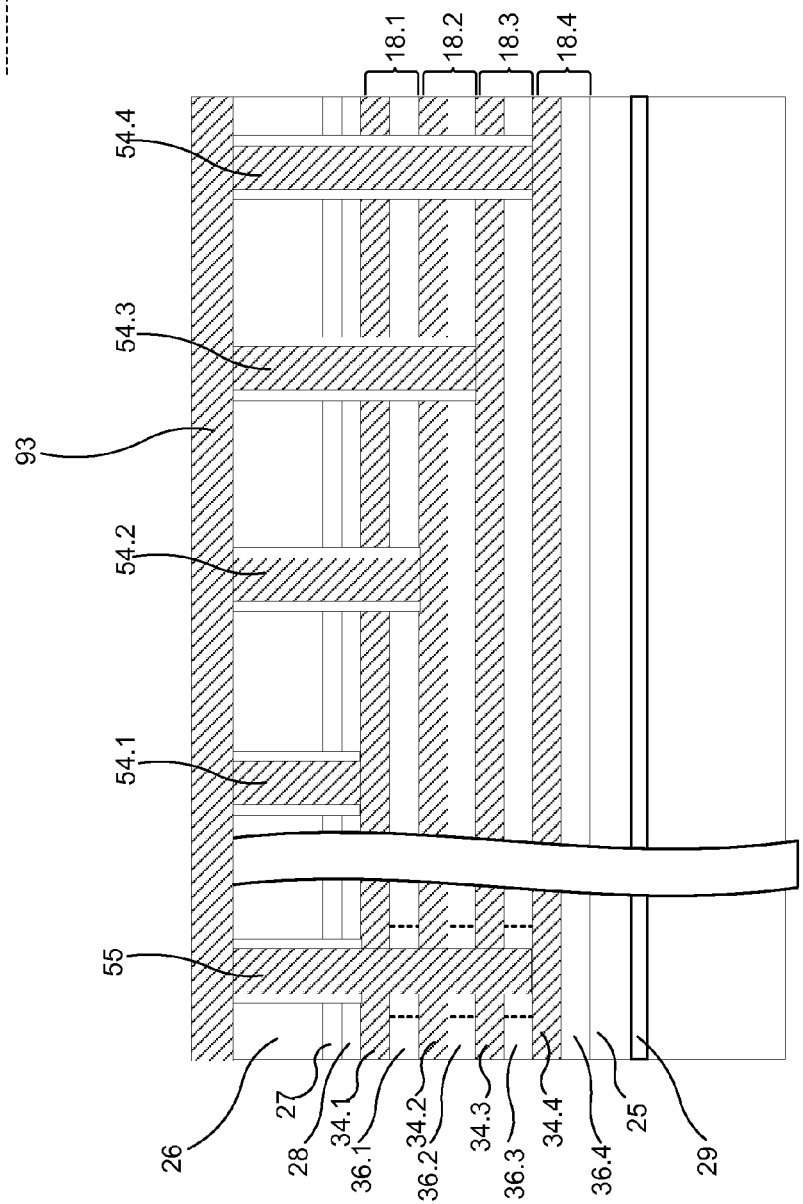

FIGS. 28 and 28A show the structure of FIG. 27 after the deposition of an electrically conductive material 93, typically polysilicon, thereby filling the contact openings 33 and the ground contact openings 35. The material 93 within contact openings 33 and ground contact openings 35 form electrical conductors 54 and electrical ground conductors 55, respectively. If desired, portions of the insulation layers 36 at the ground contact opening sidewall can be etched back or otherwise removed prior to forming an electrical ground conductor 55 within the ground contact opening 35 to enhance the electrical contact between electrical ground conductor 55 and the conductive layers 34 of the contact levels 18. This is indicated in FIG. 59 by dashed lines in insulation layers 36 surrounding electrical ground conductor 55.

Electrically conductive material 93 also covers dielectric layer 26 of upper layer 24. Thereafter the structure of FIG. 28 is etched removing the layer of material 93 covering dielectric layer 26. This is illustrated in FIGS. 29 and 29A. The structure of FIG. 29 is subjected to, for example, chemical mechanical polishing down to charge trapping layer 27 resulting in the structure of FIG. 30.

Figure 31:
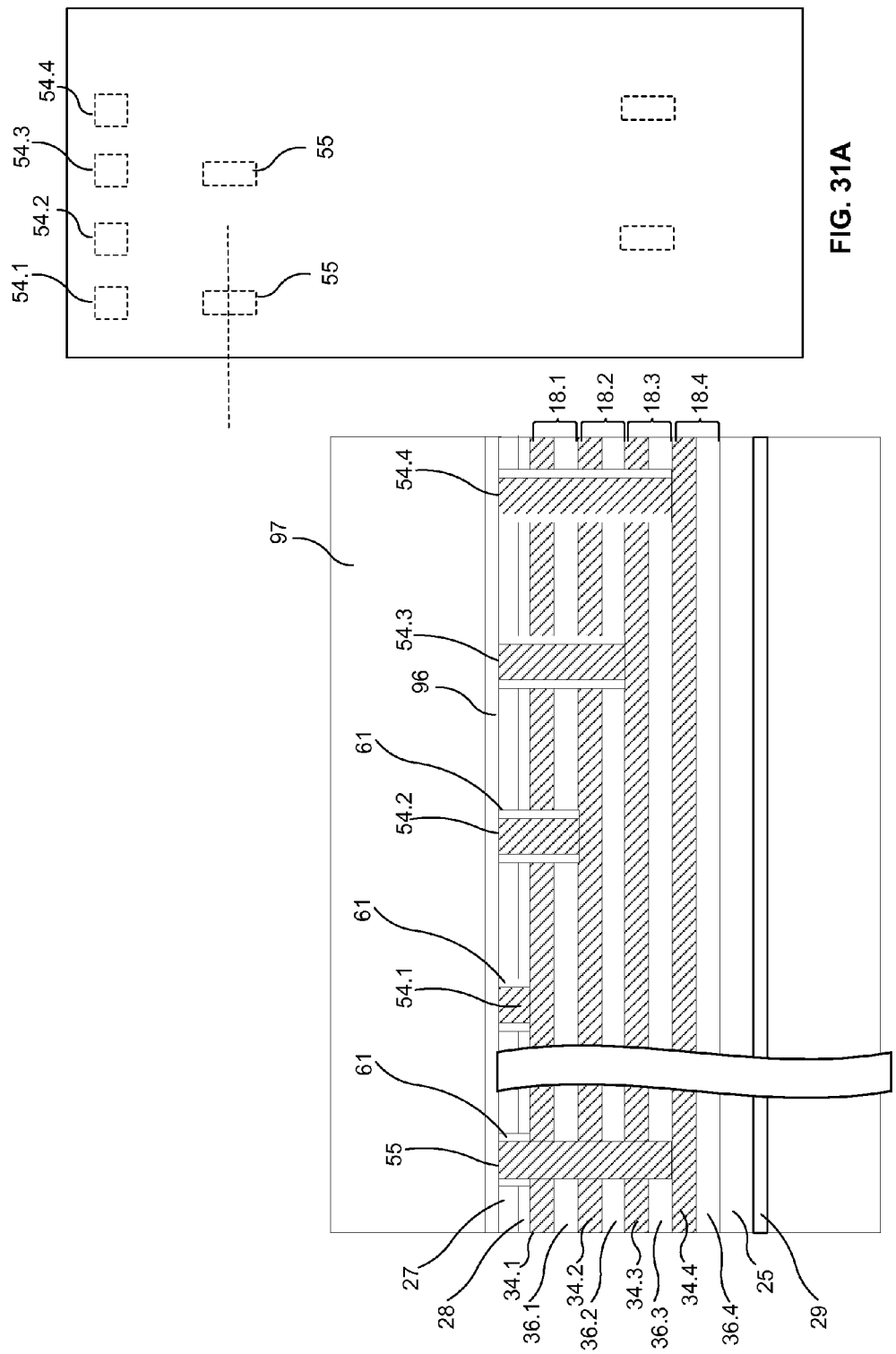
Figure 32:
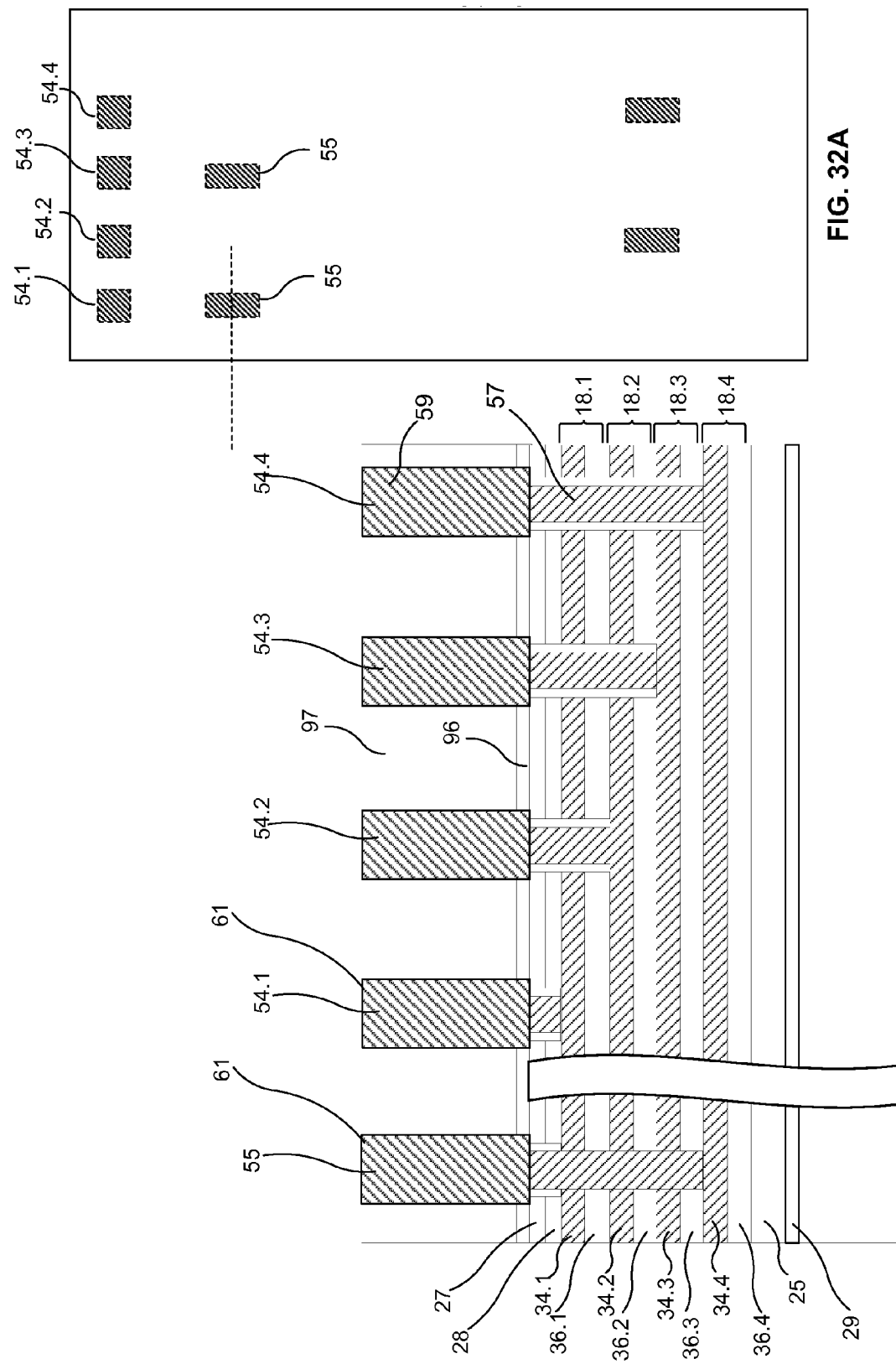

FIGS. 31 and 31A illustrate the structure of FIG. 30 after the deposition of a stop layer 96, typically silicon nitride, followed by the deposition of interlayer dielectric 97 on the stop layer. Next the structure of FIG. 31 has extensions of the contact openings 33 and the ground contact openings 35 formed through interlayer dielectric 97 and stop layer 96 to the electrical conductors 54, labeled 54.1-54.4, and electrical ground conductors 55. This is followed by filling the extensions, see FIGS. 32 and 32A, with electrically conductive material, such as tungsten, to create electrical conductors 54 and ground electrical conductors 55. Electrical conductors 54 have first parts 57 extending through the contact levels 18 and second parts 59 extending through the upper layer 24.

In some examples, layer 96 is silicon nitride while interlayer dielectric 97 is silicon dioxide. However, layer 96 could be of other dielectric material, such as silicon dioxide or alternating layers of silicon oxide and silicon nitride. Sidewall spacers 30 may be silicon nitride but could also be of other materials, such as silicon dioxide or a multilayer oxide/silicon nitride. Similarly, dielectric layer 25 is typically silicon nitride but also could be, for example, silicon dioxide. First part 57 of electrical conductor 54 is typically polysilicon but it could be of other conductive materials, such as N+ polysilicon, tungsten, TiN, etc. Also the entire length of electrical conductor 54 could be of the same material, such as tungsten.

Figure 33:
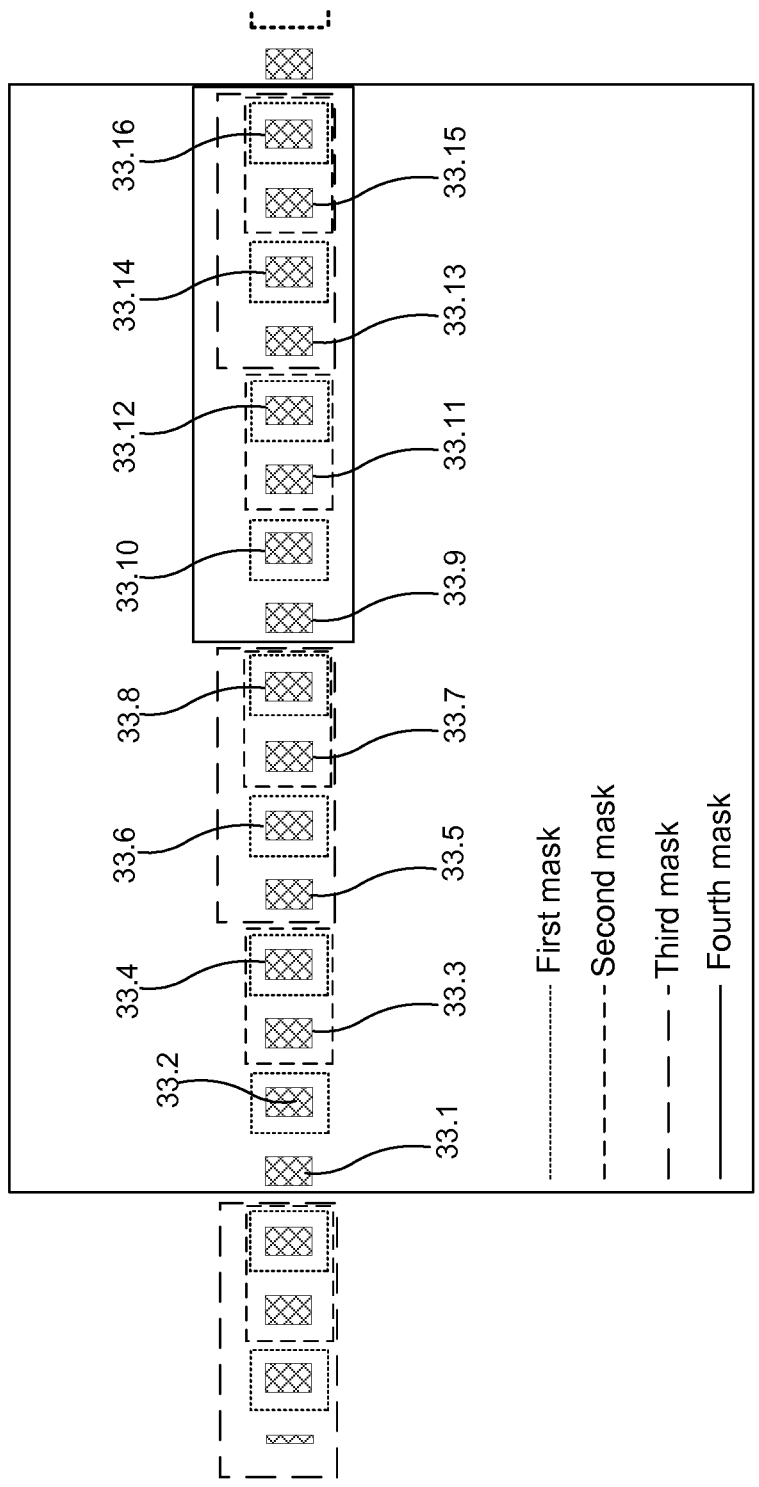

FIG. 33 is a graphical illustration of a set of 16 contact openings illustrating four different sets of contact openings 33 etched to 16 different depths to provide access to 16 contact levels 18 using only four masks.

Figure 34:
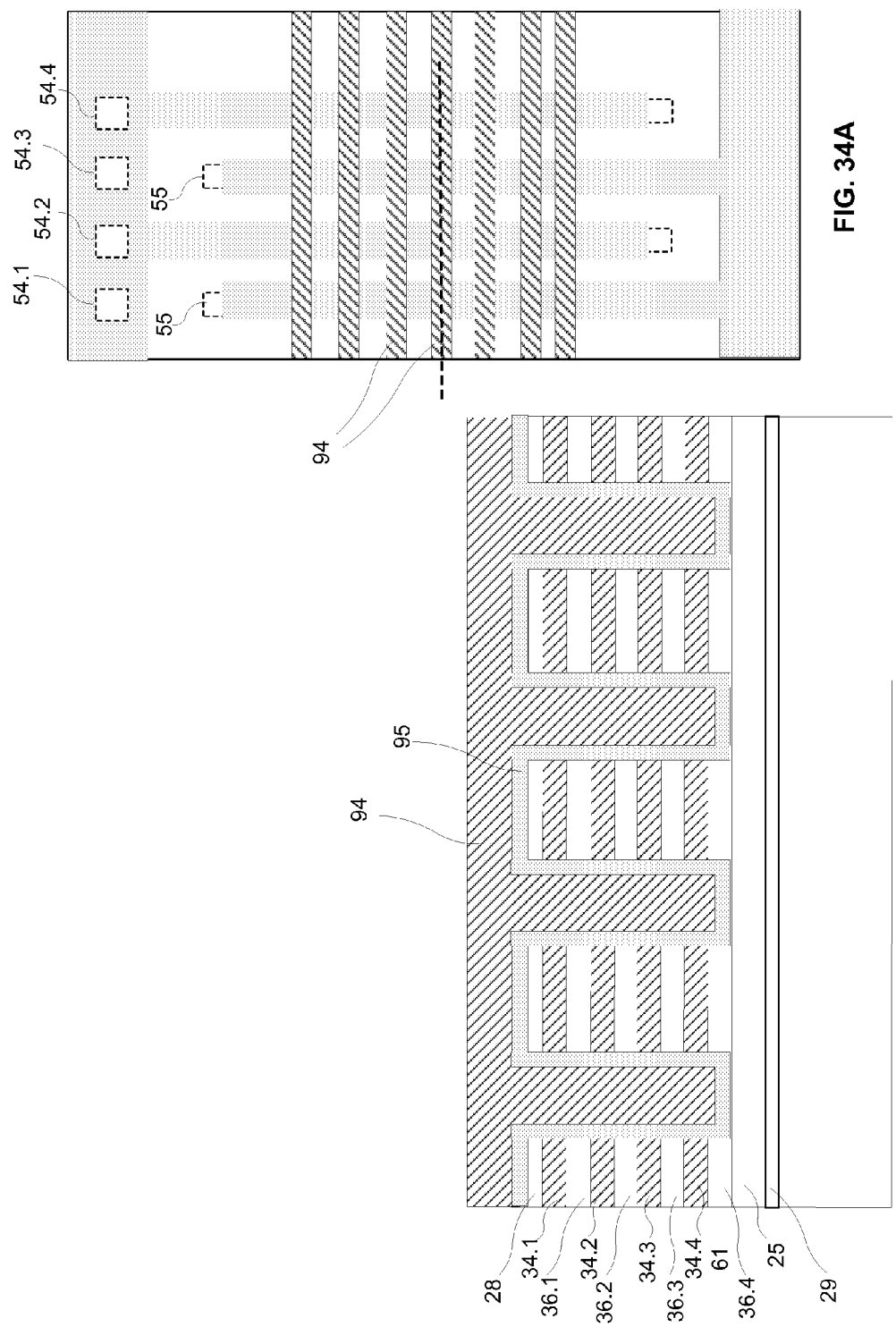

FIGS. 34 and 34A are cross-sectional and plan views of a three dimensional stacked IC device. FIG. 34 is taken through a word line 94, the word line being electrically isolated from stacks of, for example, alternating dielectric and semiconductor layers by a layer 95. Layer 95 may be, for example, alternating layers of silicon oxide and silicon nitride acting as a charge trapping layer.

The following example discusses a method for providing electrical connections to landing areas 56 at a stack of contact levels 18 of an interconnect region 17 for a three-dimensional stacked IC device. In this example, the interconnect region 17 includes an upper layer 24 with a stack of contact levels 18 beneath the upper layer, each contact level comprising a conductive layer 34 and an insulation layer 36. At least a portion of any upper layer 24 overlying the interconnect region 17 is removed to expose a first contact level 18.1 and create a contact opening 33 for each contact level 18. This is illustrated in FIG. 18.

A set of N etch masks are used to create up to and including $2^N$ levels of interconnect contact regions 14 at the stack of the contact levels 18. Although most of the Figs. show an example with 4 contact levels 18, in this example, the number of contact levels will be increased to 16 contact levels so that N=4. FIG. 33, which includes a graphical representation of 16 contact openings 33, will also be referred to in this discussion. The masks are used to etch the contact openings 33 up to and including $2^N$ contact levels, 16 contact levels in this example. The steps are carried out as follows.

A first mask 89, see FIG. 19, is used to etch one contact level 18 at every other contact opening. The contact openings not covered by first mask 89 are identified by the eight dotted line boxes surrounding contact openings 33.2, 33.4, etc., in FIG. 33. Next, a second mask 90, see FIG. 21, is used to etch two contact levels at third and fourth contact openings in a series of sets of first through fourth contact openings. Second mask 90 is identified in FIG. 33 by 4 sets of short dashed line boxes, each dashed line box surrounding two adjacent contact openings 33 out of a set of 4 contact openings. In this example, the third and fourth contact openings being etched are contact openings 33.3 and 33.4 for the set of first contact openings 33.1 through fourth contact openings 33.4., contact openings 33.7 and 33.8 for the set of contact openings 33.5-33.8, etc. As seen in FIG. 22, the use of first and second masks 89, 90 has provided a contact opening 33 down to each of the four contact levels 18.1-18.4.

Continuing with this example having 16 contact levels 18, a third mask (not shown) is used to etch four contact levels at fifth through eighth contact openings 33 in a series of sets of first through eighth contact openings. This is indicated by the two long dashed line boxes in FIG. 33. A fourth mask (not shown) is used to etch eight contact levels at ninth through 16th contact openings in a series of at least one set of first through 16th contact openings. This is indicated by one solid line box in FIG. 33. Note that half of the contact openings are etched using each of the first, second, third and fourth masks.

A dielectric layer 61, see FIG. 24, is formed on each of the sidewalls of the contact openings 33. Electrical conductors 54 are then formed to pass through the contact openings 33 to the interconnect contact regions 14 of the contact levels 18, the dielectric layers electrically insulating the electrical conductors 54 from the conductive layers 34 along the sidewalls.

As discussed above with reference to FIGS. 18 and 19, a ground contact opening 35 is typically formed the same manner as contact openings 33.1. However, prior to forming electrical conductors 54 within contact openings 33, the portions of ground contact openings 35 within upper layer 24 are lined with sidewall spacers, see FIG. 24, then etched through the contact levels 18, see FIG. 26, and then filled with electrically conductive material to create electrical ground conductor 55 as shown in FIG. 28. Electrical ground conductor 55 electrically contacts each conductive layer 34. In contrast, electrical conductors 54.1-54.4 contact only a single conductive layer 34 because of the use of dielectric sidewall spacers 61. In some examples, each electrical ground conductor 55 may not make electrical contact with each conductive layer 34.

In the above examples, the contact openings 33 are counted from left to right. If desired, the contact openings can be counted left to right or right to left or in some other order depending on the design requirement. The key is to always have effectively half of contacts opened by each mask. That is, when there is an even number of contact openings each mask will open half of the contacts, when there is an odd number of contact openings, such as 15, each mask will open slightly more than or slightly less than half, such as 7 or 8. The removal of 1 layer/2 layers/4 layers/8 layers can also be expressed as the removal of $2^0$ through $2^{(N-1)}$ layers for each step.

The FIG. 33 masking and etching procedures are illustrated in a different manner in FIG. 35. In that figure, and in subsequent FIGS. 36-39, 0 represents dark, that is having photoresist material, and 1 represents open, that is without photoresist material, so that of the 16 contact openings for each mask, 8 are open.

If the etch process example of FIGS. 33 and 35 removes 1/2/4/8 layers for masks 1-4, then the contact levels located (that is etched to) by the Etching Sequence can be identified by Located Layer designations 0-15. The resulting level located (etched to) at each position A-P are shown as located layers 0, 1, 2, 3, etc.

Other Etching Sequences can be used. For example, FIG. 36 illustrates an Etching Sequence Change in which the number of layers etched by mask 1 and by mask 4 is switched so that you 8 layers are etched by mask 1, 2 layers by mask 2, 4 layers by mask 3 and 1 layer by mask 4. The resulting level located (etched to) at each position A-P are shown as located layers 0, 8, 2, 10, etc.

Instead of (or addition to) changing the Etching Sequence, that is the number of layers etched by each mask, as demonstrated by comparing FIGS. 35 and 36, the Mask Sequence can be changed. This is illustrated in FIG. 37 in which mask 2 etches 2 layers and mask 3 etches 4 layers as with the FIG. 35 example. However, what had been the mask sequence for mask 2 in the example of FIG. 35 (0 0 1 1 0 0 1 1 etc.), becomes the mask sequence for mask 3 in the example of FIG. 37, and the mask sequence for mask 3 in the example of FIG. 35 (0 0 0 0 1 1 1 1 0 0 0 0 etc.) become the mask sequence for mask 2 of FIG. 37. The resulting level located (etched to) at each position A-P are shown as located layers 0, 1, 4, 5, etc.

FIG. 38 illustrates what is referred to as a Position Change. In this example, the number of layers etched for masks 1-4 are the same as for FIG. 35 and of the located layer for each position A-P also remains the same, including layer 0 for position A and layer 9 for position J even though position A and position J have been switched. However, the etching for each of positions A-P for both of the examples of FIGS. 35 and 38 are the same. The resulting level located (etched to) at each position J, B, C, etc., are shown as located layers 9, 1, 2, 3, etc.

FIG. 39 illustrates the result of taking the first example of FIG. 35 and also making the etching sequence change of FIG. 36, the mask sequence change of FIG. 37 and the position change of FIG. 38. However the resulting structure still has 16 different located layers for the 16 different positions. The resulting level located (etched to) at each position J, B, C, etc., are shown as located layers 9, 1, 2, 3, etc.

Any and all patents, patent applications and printed publications referred to above are incorporated by reference.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims. What is claimed is:

1. A three-dimensional stacked IC device comprising:
    a stack of at least first, second, third and fourth contact levels at an interconnect region;
    each contact level comprising a conductive layer and an insulation layer;
    at least first, second, third and fourth electrical conductors passing through corresponding portions of the stack of contact levels;
    the first, second, third and fourth electrical conductors in electrical contact with the first, second, third and fourth conductive layers, respectively; and
    a dielectric sidewall spacer circumferentially surrounding the second, third and fourth electrical conductors so that the second, third and fourth electrical conductors only electrically contact the respective second, third and fourth conductive layers,
    wherein the stack is formed at least in part through a set of masks for creating interconnect contact regions aligned with and exposing landing areas at the contact levels, the set of masks comprising:
    a set of N masks for creating a plurality of levels of interconnect contact regions at the stack of the contact levels, N being an integer equal to at least 2, and to etch contact openings to reach to up to $2^N$ contact levels including the at least first, second, third and fourth contact levels, the contact openings being sufficient for the electrical conductors to contact the respective landing areas at the corresponding contact levels, the set of N masks comprising:

a first mask to etch one contact level for effectively half of the contact openings; and a second mask to etch two contact levels for effectively half of the contact openings, and wherein the set of masks further comprises a common mask for removing at least a portion of any upper layer overlying the interconnect region to expose the first contact level, the locations of the first, second, third and fourth electrical conductors being determined by the common mask.

2. The stacked IC device according to claim 1, wherein:

the first mask defines a first set of mask openings for etching one contact level at every other contact opening; and the second mask defines a second set of mask openings for etching two contact levels at third and fourth contact openings in at least one set of first through fourth contact openings.

3. The stacked IC device according to claim 1, wherein the set of N masks further comprise:

a third mask defining a third set of mask openings to etch four contact levels for effectively half of the contact openings; and a fourth mask defining a fourth set of mask openings to etch eight contact levels for effectively half of the contact openings.

4. The stacked IC device according to claim 3, wherein:

the third mask defines the third set of mask openings to etch four contact levels at fifth through eighth contact openings in at least one set of first through eighth contact openings; and the fourth mask defines the third set of mask openings to etch eight contact levels at ninth through 16th contact openings in at least one set of first through 16th contact openings.

5. The stacked IC device according to claim 1, wherein:

the first mask defines a first set of mask openings to etch one contact level at contact openings 2, 4, 6, 8, 10, 12, 14, 16;

the second mask defines a second set of mask openings to etch two contact levels at contact openings 3, 4, 7, 8, 11, 12, 15, 16;

the third mask defines a third set of mask openings to etch four contact levels at contact openings 5-8, 13-16; and the fourth mask defines a fourth set of mask openings to etch eight contact levels at contact openings 9-16.

6. The stacked IC device according to claim 1, the set of masks defining mask openings to define a ground contact opening through the contact levels and an electrical ground conductor through the ground contact opening to make electrical contact with a plurality of the conductive layers of the contact levels.

7. The stacked IC device according to claim 6, wherein the ground contact opening has a ground opening sidewall.

8. The stacked IC device according to claim 1, wherein the first, second, third and fourth electrical conductors have a constant pitch.

9. The stacked IC device according to claim 1, further comprising a ground conductor passing through portions of the stack of contact levels and electrically contacting each of the first, second, third and fourth conductive layers.

10. The stacked IC device according to claim 1, wherein the locations of the first, second, third and fourth electrical conductors and the ground conductor are determined by the common mask.

* * * * *